United States Patent [19]
Lawrence

[11] Patent Number: 6,054,943
[45] Date of Patent: Apr. 25, 2000

[54] MULTILEVEL DIGITAL INFORMATION COMPRESSION BASED ON LAWRENCE ALGORITHM

[76] Inventor: John Clifton Lawrence, P.O. Box 230351, Encinitas, Calif. 92023

[21] Appl. No.: 09/047,883

[22] Filed: Mar. 25, 1998

[51] Int. Cl.[7] .................................................. H03M 7/40
[52] U.S. Cl. ............................................. 341/87; 341/67
[58] Field of Search ................................. 341/87, 67, 65, 341/107; 375/240

[56] References Cited

U.S. PATENT DOCUMENTS

| 5,883,589 | 3/1999 | Takishima et al. | 341/67 |
| 5,901,177 | 5/1999 | Sohn | 375/240 |

*Primary Examiner*—Brian Young

[57] ABSTRACT

A method and apparatus for data, image, video, acoustic, multimedia and general multilevel digital source compression in both lossless and lossy modes is described. The method is universal (no knowledge of source statistics required) and asymptotically optimal in terms of Shannon's noiseless coding theorem. The method utilizes a random walk in Pascal's hypervolume (a multi-dimensional generalization of Pascal's triangle) starting at the apex and proceeding downward, which is directed by the incoming source sequence according to an algorithm, until it terminates at a boundary which has been constructed in such a way that the encoding of each variable length source sequence can be accomplished in a fixed number of bits. Codewords and decoded source sequences can either be computed at the encoder and decoder, respectively, or precomputed and stored at those respective locations. A preprocessing module is used to set up the data for lossless data or image compression. Another preprocessing module is used for lossy compression, and video compression can vary seamlessly between lossless and lossy modes depending on the requirements of the transmission rate.

52 Claims, 39 Drawing Sheets

| Letter | Code |
|---|---|
| | 486 |
| a | 00000 |
| b | 00001 |
| c | 00010 |
| d | 00011 |
| e | 00100 |
| f | 00101 |
| g | 00110 |
| h | 00111 |
| i | 01000 |
| j | 01001 |
| k | 01010 |
| l | 01011 |
| m | 01100 |
| n | 01101 |
| o | 01110 |
| p | 01111 |
| q | 10000 |
| r | 10001 |
| ⋮ | ⋮ |
| z | 11011 |

| Letter/Letter Combination/Word | Code |
|---|---|
| | 488 |
| a | 000000 |
| an | 000001 |
| and | 000010 |
| are | 000011 |
| as | 000100 |
| at | 000101 |
| b | 000110 |
| be | 000111 |
| but | 001000 |
| by | 001001 |
| c | 001010 |
| d | 001011 |
| e | 001100 |
| ed | 001101 |
| f | 001110 |
| for | 001111 |
| from | 010000 |
| g | 010001 |
| h | 010010 |
| had | 010011 |
| have | 010100 |
| her | 010101 |
| i | 010110 |
| ⋮ | ⋮ |
| z | 111111 |

Fig. 15

Note: 3 Channels could be Red, Green, Blue (RGB),
Cyan ,Yellow, Magenta (CYM),
Luminance, Chrominance, Chrominance (YIQ) or
another color model

|  | Symbol Weights | | | | | |
|---|---|---|---|---|---|---|
| Source Symbol | 0 | 1 | 2 | ... | m-2 | Lexicographical Ordering |
| | 0 | 0 | 0 | ... | 0  0 | 0 |
| | 0 | 0 | 0 | ... | 0  1 | 1 |
| | 0 | 0 | 0 | ... | 0  2 | 2 |
| | ... | | | | | |
| | 0 | 0 | 0 | ... | 0  S | S |
| | 0 | 0 | 0 | ... | 1  0 | S+1 |
| | 0 | 0 | 0 | ... | 1  1 | S+2 |
| | 0 | 0 | 0 | ... | 1  2 | S+3 |
| | ... | | | | | |
| | 0 | 0 | 0 | ... | 1  S-1 | |
| | 0 | 0 | 0 | ... | 2  0 | • |
| | 0 | 0 | 0 | ... | 2  1 | |
| | 0 | 0 | 0 | ... | 2  2 | • |
| | ... | | | | | |
| | | | | | | • |
| | S-1 | 0 | 0 | ... | 0  1 | |
| | S-1 | 0 | 0 | ... | 1  0 | |
| | ... | | | | | |
| | S | 0 | 0 | ... | 0  0 | $\frac{(S+m-2)!}{S!(m-2)!}$ |

700 — Symbol Weights table
702 — Lexicographical Ordering

Fig.29

736
An Example of Predictive
Coding defined by the
relationship:
$S'_1 = S_1$
$S'_2 = S_2 - S_1$
$S'_j = S_j - 2S_{j-1} + S_{j-2}$, for $j > 2$ 738
740
$S_1, S_2, ...$: 2, 4, 6, 8, 8, 6, 10, 12, 10, 8, 6, 6,...
Differencing: 2, 2, 2, 2, 0, -2, 4, 2, -2, -2, -2, 0,...
Predictive: 2, 2, 0, 0, -2, -2, 6, -2, -4, 0, 0, 2,...
742

MULTILEVEL DIGITAL INFORMATION COMPRESSION BASED ON LAWRENCE ALGORITHM

REFERENCES CITED

U.S. Patent Documents

U.S. Pat. No. 4,075,622 February 1978 Lawrence et. al. . . . 340/347
U.S. Pat. No. 4,394,774 July 1983 Widergren et. al. . . . 382/56
U.S. Pat. No. 4,486,784 November 1984 Abraham et. al. . . . 358/261
U.S. Pat. No. 4,580,162 April 1986 Mori . . . 358/135
U.S. Pat. No. 4,654,484 March 1987 Reiffel et. al. . . . 379/53
U.S. Pat. No. 4,675,750 June 1987 Collins et. al. . . . 360/9.1
U.S. Pat. No. 4,698,672 October 1987 Chen et. al. . . . 358/136
U.S. Pat. No. 4,745,473 May 1988 Hall . . . 358/133
U.S. Pat. No. 4,774,574 September 1988 Daly et. al. . . . 358/133
U.S. Pat. No. 4,785,349 November 1988 Keith et. al. . . . 358/136
U.S. Pat. No. 4,791,598 December 1988 Liou et. al. . . . 364/725
U.S. Pat. No. 4,868,653 September 1989 Golin et. al. . . . 358/133
U.S. Pat. No. 4,941,193 July 1990 Barnsley et. al. . . . 382/56
U.S. Pat. No. 5,021,891 June 1991 Lee . . . 358/432
U.S. Pat. No. 5,129,015 July 1992 Allen et. al. . . . 382/56
U.S. Pat. No. 5,148,497 September 1992 Pentland et. al. . . . 382/54
U.S. Pat. No. 5,172,228 December 1992 Israelsen . . . 358/133
U.S. Pat. No. 5,231,485 July 1993 Israelsen et. al. . . . 358/133
U.S. Pat. No. 5,319,724 June 1994 Blonstein et. al. . . . 382/56
U.S. Pat. No. 5,497,435 March 1996 Berger . . . 382/249
U.S. Pat. No. 5,506,580 April 1996 Whiting et. al. . . . 341/51
U.S. Pat. No. 5,506,916 April 1996 Nishihara et. al. . . . 382/232
U.S. Pat. No. 5,546,477 August 1996 Knowles et. al. . . . 382/212
U.S. Pat. No. 5,572,206 November 1996 Miller et. al. . . . 341/51
U.S. Pat. No. 5,600,373 February 1997 Chui et. al. . . . 348/397
U.S. Pat. No. 5,602,589 February 1997 Vishwanath et. al. . . . 348/398
U.S. Pat. No. 5,615,287 March 1997 Fu et. al. . . . 382/232
U.S. Pat. No. 5,621,819 April 1997 Hozumi . . . 382/232
U.S. Pat. No. 5,638,068 June 1997 Nickerson . . . 341/67
U.S. Pat. No. 5,640,159 June 1997 Furlan et. al. . . . 341/51
U.S. Pat. No. 5,657,420 August 1997 Jacobs et. al. . . . 395/2.32

OTHER PUBLICATIONS

Ang, P. H., Ruetz, P. A., and Auld, D., *Video Compression Makes Big Gains*, IEEE Spectrum (October 1991), pp. 16–19.

Anson, Louisa, *Fractal Image Compression*, BYTE (October 1993), pp. 195–202.

Antonini, Marc et. al., *Image Coding Using Wavelet Transforms*, IEEE Transactions on Image Processing (1992), vol. 1, no. 2, pp. 205–220.

Bani-Eqbal, *Enhancing the Speed of Fractal Image Compression*, Optical Engineering (June 1995), vol. 34, no. 6.

Barnsley and Hurd, "Fractal Image Compression," 1993, A K Peters Ltd.

Barnsley and Sloan, *A Better Way to Compress Images*, BYTE Magazine (January 1988), pp. 215–223.

Chen, W., Smith, C. H., Fralick, S. C., *A Fast Computational Algorithm for the Discrete Cosine Transform*, IEEE Transactions on Communications (1977), vol. COM-25, no. 9, pp. 1004–1009.

Fisher, Y., et. al., *A Comparison of Fractal Methods with DCT and Wavelets*, Proc. of SPIE (1994), vol. 2304, pp. 132–43.

Goldberg and Boucher, *Image Compression Using Adaptive Vector Quantization*, IEEE Transactions on Communications (February 1986), vol. COM-34, pp. 180–187.

Gray, Robert M., *Vector Quantization*, IEEE ASSP Mag. (April 1984), vol. 1, pp. 4–29.

Hang, H. M., and Haskell, B., *Interpolative Vector Quantization of Color Images*, IEEE Transactions on Communications (April 1988), vol. 36, no. 4.

Hart, J. C., *Fractal Image Compression and Recurrent Iterated Function Systems*, IEEE Computer Graphics and Applications (July 1996), vol. 16, no. 4.

Held, Gilbert, "Data Compression," 1987, John Wiley & Sons.

Huffman, D. A., *A Method for the Construction of Minimum Redundancy Codes*, Proceedings IRE (1962), vol. 40, pp. 1098–1101.

Huffman, *Wavelets and Image Compression*, SMPTE Journal (November 1994), pp. 723–727.

Jackson, D. J. and Hannah, S. J., *Comparative Analysis of Image Compression Techniques*, IEEE Computer Society Press (March 1993), pp. 513–517.

Jacquin, *Image Coding Based on a Fractal Theory of Iterated Contractive Image Transformations*, IEEE Transactions on Image Processing (January 1992), vol. 1, no. 1.

Jain, A. K., *Image Data Compression: A Review*, Proc. IEEE (March 1981), vol. 69, no. 3.

Lawrence, J. C., *A New Universal Coding Scheme for the Binary Memoryless Source*, IEEE Transactions on Information Theory (1977), vol. IT-23, no. 4. pp. 466–472.

Lynch, Thomas, "Data Compression: Techniques and Applications," 1985, Van Nostrand Reinhold.

Netravali, A. N., and Limb, J. O., *Picture Coding: A Review*, Proc. IEEE (March 1980), vol. 68, no. 3.

Knuth, *Algorithms*, Scientific American (April 1977), p. 63.

Pentland and Horowitz, *A Practical Approach to Fractal-Based Image Compression*, DDC 1991 IEEE, pp. 176–185.

Peterson, *Packing It In—Fractals Play an Important Role in Image Compression*, Science News (May 1987), vol. 131, no. 18.

Pratt, Kane and Andrews, *Hadamard Transform Image Coding*, Proc. IEEE (1969), vol. 57, no. 1, pp. 59–68.

Prosise, *Understanding Data Compression*, PC Magazine (May 1993), pp. 305–308

Raittinen, H. et. al., *Critical Review of Fractal Image Compression*, International Journal of Modern Physics C, (1995), vol. 6, no. 1, pp. 47–66.

Reghbati, H. et. al. *An Overview of Data Compression Techniques*, Computer (1981), vol. 14, no. 4, pp. 71–75.

Riskin and Lookabaugh, *Variable Rate Vector Quantization for Medical Image Compression*, IEEE Transactions on Medical Imaging (September 1990), vol. 9, no. 3.

Rissanen, J., *A Universal Data Compression System*, IEEE Transactions on Information Theory (September 1983), vol. IT-29, no. 5, pp. 656–664.

Schalkwijk, Pieter, *An Algorithm for Source Coding*, IEEE Transactions on Information Theory (May 1972), vol. IT-18, no. 3, pp. 395–399.

Simon, Barry, *How Lossy Compression Shrinks Image Files*, PC Magazine (July 1993).

Simon, Barry, *Lossless Compression: How it Works*, PC Magazine (June 1993).

Shannon, C. E., *A Mathematical Theory of Communication*, The Bell System Technical Journal (July 1948), vol. 27, no. 3.

Shapiro, J., *Embedded Image Coding Using Zerotrees of Wavelet Coefficients*, IEEE Transactions on Signal Processing (December 1993), vol. 41, no. 12.

Storer, James, "Data Compression: Methods and Theory," 1988, Computer Science Press.

Tanaka, Hatsukazu et. al., *Efficient Run-Length Codings*, IEEE Transactions on Information Theory (November 1982), vol. IT-28, no. 6., pp. 880–889.

Tanaka, Hatsukazu et. al., *A Unique Ranking of Multilevel Sequences and its Application to Source Coding*, IEEE Transactions on Information Theory (July 1985), vol. IT-31, no. 4., pp. 530–537.

Tjalkens et. al., *A Universal Variable-to-Fixed Length Source Code Based on Lawrence's Algorithm*, IEEE Transactions on Information Theory (March 1992), vol. 38, no. 2.

Wallace, G. K., *The JPEG Still Compression Standard*, IEEE Transactions on Consumer Electronics (1992), vol. 38, no. 1.

Welch, Terry A., *A Technique for High-Performance Data Compression*, Computer (June 1984), pp. 8–19.

Wintz, R., *Transfer Picture Coding*, Proceedings of the IEEE (July 1972), vol. 60, no. 7.

Ziv and Lempel, *A Universal Algorithm for Sequential Data Compression*, IEEE Transactions on Information Theory (1977), v01 IT-23, no. 3., pp. 337–343.

Ziv and Lempel, *Compression of Individual Sequences via Variable-Rate Coding*, IEEE Transactions on Information Theory (September 1978), vol. IT-24, pp. 530–536.

BACKGROUND

1. Field of Invention

This invention relates to digital information compression (including data, image, video, audio and multimedia among others) and decompression with medical, seismographic, telemetric, astronomic, meteorological, surveillance and monitoring applications among others, and involves a method and apparatus which can perform all these types of compression in either a lossless or lossy mode or some combination of both and utilizes a universal, asymptotically optimal multilevel algorithm based on the Lawrence algorithm.

2. Description of Prior Art

Heretofore, the field of information compression has been divided into techniques which perform data or image or video or speech or other kinds of digital signal compression. It has been further divided into techniques which are either lossless [i.e.] the decompressed data is exactly the same as the original data or lossy [i.e.] the decompressed data is similar to but is not exactly the same as the original data. Data compression, which involves computer programs and files among other things, usually requires lossless compression although it is possible to foresee applications in which text files, for instance, might not be reproduced with total accuracy and still remain intelligible. Image and video compression, on the other hand, have usually been associated with lossy compression since visual information remains intelligible even after it has been degraded to some extent and lossless methods have not been able to produce the amount of compression required. However, there are some applications in the medical and military fields, for instance, where lossless image and video compression is highly desirable. For example, artifacts, associated with lossy compression, could show up and be interpreted incorrectly as having medical significance in X-rays, CAT-scans, MRI-scans, and PET-scans.

There are some techniques which are only appropriate for image or video compression and some techniques which can be modifier to do both. In general data compression techniques have not been found to be appropriate for image or video compression and vice versa. Audio compression has usually been of the lossy variety, and a wide range of other digital signals such as signals from seismographic, telemetric, astronomic, meteorological, surveillance and monitoring data collection devices have been compressed either lossily or losslessly.

Lossless Compression

The main kinds of lossless coding are run length, Huffman and variations, Fano-Shannon, arithmetic, adaptive or dynamic, Lempel-Ziv (LZ) and its variation, Lempel-Ziv-Welch (LZW).

Run length coding simply codes the length of the run of a particular source symbol. For instance, for a binary source, a code word of block length n might be used to encode the lengths of all zero runs emanating from the source. This works pretty well if the probability of a zero is fairly large, or, conversely, the probability of a 1 is fairly small. The maximum run length that can be encoded is $2^n-1$ source symbols or bits. This variable-to-block method can produce a maximum per block compression ratio of $$\frac{2^n - 1}{n}.$$

Its major drawbacks are that, for zero runs of less than n symbols, there is actually an expansion rather than a compression, and, for sources which produce runs of zeros typically greater than $2^n$ symbols, not all the compression that might be achieved, is actually attained. Finally, this method works best when the source statistics are known so that n can be matched to them. A variation for multilevel sources would incorporate an m bit prefix that would specify the source symbol (one of $2^m$) and a suffix that would determine the length of the run for that particular source symbol. Therefore, the entire coded block containing prefix and suffix would be m+n bits.

A second approach is known as Huffman coding. Huffman coding was the first method that was derived which achieved optimal compression according to Shannon's noiseless coding theorem which sets a limit on the compression which can be achieved as a function of the source statistics. This method assumes that in an English text file, for instance, certain letters such as "a" or "e" occur more frequently than others such as "x" or "q." A probability of occurrence is assigned to each letter or symbol. A variable length bit string is assigned to each letter in accordance with it's probability of occurrence such that the more probable a letter is, the shorter is the bit string. Therefore, this is a block-to-variable method. A discussion of how the Huffman algorithm works can be found in Huffman, D. A., "A Method for the Construction of Minimum Redundancy Codes", Proceedings IRE (1962), vol. 40, pp. 1098–1101.

The major drawback to Huffman coding is that the source statistics have to be known in order to achieve optimal compression. An initial pass through the data can result in the computation of a statistical table tailored to a particular source, but this is computationally intensive and results in diminished compression since the table must be transmitted or stored so that it is accessible to the decoder. In addition Huffman coding assumes that each symbol is statistically independent which is not true. For instance, in English the probability of a "u" following a "q" is very high compared to that of a "u" following any other letter. It also doesn't take advantage of common multi-symbol letter combinations such as "and," "ing," "it" etc. Also the block-to-variable nature of the method limits the maximum amount of compression that can be achieved per symbol to a fairly low value.

For instance, let's assume we have a source composed of English text each letter of which is specified by 8 bits. Let's assume that the highest probability letter has a coded representation of 1 bit. Therefore the highest achievable compression ratio is 8:1. By contrast a run length scheme could encode a sequence of 256 consecutive letters in 16 bits (an 8 bit prefix and an 8 bit suffix) for a compression ratio of 16:1. Consecutive symbols such as numerals or spaces are frequently found in certain types of files such as databases, for example. In addition Huffman coding is only optimal when the probabilities for each letter are negative powers of 2. For all other probability assignments, the results are less than optimal. Also for high probabilities, the optimal assignment might turn out to be less than one bit. Obviously, the minimal bit assignment is 1 bit. Therefore, this would represent a departure from optimality for Huffman coding.

Since Huffman coding is implemented as a table look-up of the output code which is associated with each input symbol, it suffers from all the drawbacks of table look-ups, namely time consuming processing and equipment complexity. Also the decompression process is complex because of the variable length code words. A logic decision must be made for each code bit as to whether it should be included in the current codeword or the subsequent one.

Fano-Shannon coding is very similar to Huffman in terms of its advantages and disadvantages. The major disadvantage as in Huffman coding is that a knowledge of the source statistics is required for optimal performance. For a fuller discussion of the Fano-Shannon algorithm, see Lynch, Thomas, "Data Compression: Techniques and Applications," 1985, Van Nostrand Reinhold, pp. 53–55.

Arithmetic coding overcomes the fractional bit assignment problem of Huffman coding, is a variable-to-block method and is relatively easy to implement. However, it still suffers the drawback that the source probabilities must be known in order for the method to work. The mechanics are discussed in Simon, Barry, "Lossless Compression: How It Works."

Lempel-Ziv coding, also known as the sliding dictionary method, LZ1 and LZ77 (as disclosed in U.S. Pat. No. 5,572,206 to Miller et. al.), looks at the incoming stream of source symbols and tries to identify similar patterns. When it does, it outputs a code giving how many places backward in the stream to start which is called the offset and the length of the sequence which is identical to the sequence under present consideration. For example, consider the sequence: THE CAT IN THE HAT. The first 11 symbols (including spaces) would be transmitted as literals since there are no repeat sequences contained therein. On encountering the second THE, the encoder would recognize that this sequence had been previously encountered and send a code word containing the offset 11 and the length 3. Let's say that the codewords are encoded in a word of 8 bits and the literals are encoded in 6 bits with a 1 bit prefix which distinguishes between code words and literals. Let's further assume that, of the code word bits, 5 bits are devoted to the offset and 3 to the length. Our code word then would be 101011100. The first 1 would signify that it is a code word and not a literal. The next five bits contain the binary number 11, the offset, and the last 3 bits contain binary 4 corresponding to THE plus a space. Thus a compression of 3.33:1 has been achieved for this particular codeword. Finally, the encoder would recognize that the AT in HAT was similar to the AT in CAT and send a code word containing the offset 11 and the length 2.

Drawbacks of this scheme are as follows. There is a trade-off between code word length and how far backward in the symbol stream the encoder can look. The further back it can look, the more possible it is to find a matching sequence, but less compression is possible for longer codewords. This means that the design of the system is a function of the source statistics and hence the system won't function well for sources of differing statistics. Also non-repeating patterns which contain a large number of the same symbol aren't coded efficiently. For example, the sequence A B C D E F contains a space between every letter so that statistically there are a lot of spaces involved. However, no compression would be gained from this sequence as there are not any strings in which two or more symbols in a row are identical to a previous string.

The Lempel-Ziv-Welch (LZW) algorithm (as disclosed in U.S. Pat. No. 5,506,580 to Whiting et. al.) overcomes the inherent disadvantage of the LZ scheme which is considering only part of the symbol stream history. As input symbols from the source file are processed, a dictionary of source strings is built up and the index of the string is used for the output code. Since this dictionary is developed as the source symbols are processed, it grows as the processing continues. As the source symbols come in, the processor looks in the dictionary for an identical string of symbols. If it finds one, it accepts the next source symbol and looks to see if that (longer) string is in the dictionary. It keeps doing this until it finds a string that is not already in the dictionary. Then it outputs the index for the previous string and adds the current string to the dictionary. There is no need to transmit the dictionary to the decoder as the decoder is able to generate its own identical dictionary as the decoding process occurs. At the start of the file, the dictionary is initialized to contain 1 symbol entry for each possible character so that there is no possibility that any source string can go uncoded.

The disadvantages of the LZW algorithm have to do with the dictionary which grows as the processing continues. It has to be initialized at a particular number of possible entries so that the output block length can be fixed. The larger the number of entries, the less will be the compression, and the smaller the number of entries, the sooner will the dictionary be filled and the process have to be started over. As the dictionary is being developed (especially at the beginning of the process), it is likely that only small numbers of source symbols will be coded into output blocks resulting in expansion rather than compression. This can be overcome by allocating an overhead bit to send the symbols uncoded if expansion were to occur. Of course, this overhead reduces compression. The most serious drawback to this method, however, occurs when a large number of consecutive, identical symbols is processed such as AAAAAAA. The processor would first encounter the second A, add AA to the dictionary and output the index for A. Then it would encounter the third A, note that AA was in the dictionary, encounter the fourth A, add AAA to the dictionary and output the index for AA. Next it would take in the next 3 As, add AAAA to the dictionary and output the index for AAA. Therefore it has taken 3 blocks to code 6 source symbols which could have been coded in one block with simple run length coding. A very long sequence of identical symbols such as might be encountered in an image would tend to fill up the dictionary. Since the dictionary must be cleared and the process reinitialized frequently in order to keep the block length at a reasonable value, this problem keeps reoccurring.

In addition dictionary look-ups are time consuming which is undesirable if there are real time constraints. Another drawback is the fact that, if the dictionary is only partially discarded when full, the latest entries must be discarded first in order for the algorithm to work correctly, but these are precisely the entries that have been adapting to the statistics of the most recent data, and hence will soon be added to the dictionary again. Because of this method's inefficiency at coding long strings of repetitive data, it is not useful for image compression which consists to a large extent of precisely just that sort of data. There is an increase in equipment complexity due to the fact that the dictionary entries for the input strings are of variable size. Thus the dictionary cannot be just stored word for word in memory, but each dictionary entry will correspond to a variable number of memory words making the look-ups even more time-consuming. Also the decoded strings must be reversed as the first symbol decoded is the last symbol encoded. Hashing functions, which may be used to calculate pointers into the dictionary, speed up the dictionary look-up, but add additional overhead and complexity.

Image Compression

The main kinds of image compression are transform methods including Discrete Cosine Transform (DCT) and Hadamard Transform, JPEG (based on DCT), MPEG (based on JPEG), Wavelets, Predictive, Vector Quantization and Fractals. Some of these methods, namely, DCT and MPEG, have been used for both image and video compression while others are only suitable for image compression. For video compression, there is a real-time constraint in that the processing (both encoding and decoding) must be done at 30 frames per second (in a typical application) where each frame corresponds to an image.

Typically, an image is sampled by taking the color value at adjacent, spatially separated points. These digital samples are called pixels for "picture elements". The closer these samples are, the higher the spatial resolution and vice versa. The picture is scanned horizontally and vertically. Each sample can be expressed in a certain number of bits. The higher the number of bits, the greater is the number of levels of gray or color that can be encoded. This is called intensity resolution. Typical television pictures have a spatial resolution of 512 pixels per line and 512 lines per frame, and an intensity resolution of 24 bits per pixel. With a frame rate of 30 frames per second, this translates into a data rate of over $150 \times 10^6$ bits per second.

In JPEG (as disclosed in U.S. Pat. Nos. 4,394,774 to Widergren et. al., 4,791,598 to Liou et. al., 5,129,015 to Allen et. al., 5,021,891 to Lee and 5,319,724 to Blonstein et. al.), the image is tiled into 8×8 or 16×16 blocks of pixels. Each block is transformed from the spatial domain into the frequency domain using the DCT. This gives a series of amplitudes vs. frequency starting with the zero frequency or DC component and proceeding up to higher frequencies. Now the amplitudes are quantized by assigning a number of bits to each amplitude. Higher frequencies are quantized more coarsely $^{i.e.}$ a fewer number of bits are assigned to them than are assigned to lower frequency amplitudes. This usually results in large numbers of high frequency components having a value of zero.

The DC component is then treated differently from the AC components in that only the difference of it and the DC component of the preceding block is coded. Since there is usually a high correlation from block to block of DC components, this results in a lot of zeros being added to the digital source data stream which eventually results in higher compression after lossless coding. The AC components are not differenced. The various components are then placed in zigzag order (starting with the DC component) in order to facilitate the high frequency components (many of which are zero) being placed together at the end of the data stream. The resultant amplitude components (a large number of which are zero) are then losslessly coded using run length, Huffman and/or arithmetic coding. The decoding process is the inverse of the encoding process. The pixels are scanned in zigzag order in order to avoid discontinuities which would occur when scanning from the end of one line to the beginning of the next.

JPEG specifies a lossless mode also which consists of simple predictive coding followed by Huffman or arithmetic coding. Predictive coding, in its simplest form, consists of "differencing" of adjacent pixels which will produce long zero or mostly zero runs if the data is highly redundant. In addition there are progressive encoding and hierarchical encoding modes. Progressive encoding allows scanning at lower spatial resolutions, and then adding the higher resolution information later. This allows for a screen "build-up" which approximates the final image to a better and better extent as time goes on. Hierarchical coding uses the same idea in terms of intensity resolution so that the pixel values are approximate at first and become more accurate with time.

The disadvantages of the JPEG method are as follows. 1) The zigzag scanning is not considered to be as effective as Hilbert scanning as the latter considers pixel closeness in more directions than the former. 2) Visually, the quantization produces a smoothing of the image since higher frequency data are usually "zeroed out." 3) Artifacts can be caused resulting, for instance, in inappropriate rings of color being observed where sharp edges occur. 4) There is a pronounced tiling or "blockiness" since the coding is done in independent blocks. At high compression ratios, there might be just the DC component present in which case each block would be just a solid color. Such images resemble a patchwork quilt. 5) Since JPEG is a block-to-variable technique, the maximum compression ratio is limited by the block size. 5) Huffman coding requires a table which must be either stored or transmitted with the image resulting in an effectively decreased compression ratio. 6) The table used with Huffman coding may not correspond to the source statistics if different images with different statistics are used or any particular image has statistics which vary with space.

7) The quantization tables must be stored or transmitted with the compressed image thus decreasing the compression ratio. 8) Loss of high frequency information can cause edges to be blurred. 9) Run length coding is an ad hoc rather than a theoretically optimal scheme. 10) For each n×n block of data, the matrix multiplication involved with the cosine transform requires, straightforwardly, $n^3$ multiplications and additions per block although there are algorithms for speeding up the math. 11) JPEG lossless uses Huffman coding which requires knowledge of the source statistics and a table to be included with the data which decreases compression. Maximum compression is limited by the block-to-variable nature of Huffman coding. 12) Quantization requires one division per pixel thereby adding more time and complexity to the process. 13) Table look-ups which are time consuming must be performed for both quantization and Huffman coding. 14) There is no seamless transition from JPEG lossy to JPEG lossless coding since the two are fundamentally different methods. 15) It is a nonintegrated and nonseamless solution since several disparate and fundamentally unrelated steps or stages are required, and this results in a time consuming process requiring a great degree of equipment complexity.

Hadamard transform coding (as disclosed in U.S. Pat. No. 4,580,162 to Mori) is similar to JPEG coding except that the matrix multiplications don't involve any actual multiplications—only additions and subtractions. This speeds up part of the process. All the other steps—quantization, normalization, entropy coding etc.—are similar to JPEG, and result in the same drawbacks.

Vector Quantization (VQ) (as disclosed in U.S. Pat. Nos. 5,231,485 to Israelsen et. al. and 5,172,228 to Israelsen) involves a codebook of tiles which can typically be matched to a spatially contiguous group of pixels. Then the index of the chosen code vector is sent resulting in compression as long as the tiles do not represent every possible combination of pixels. The distortion introduced is the difference between the actual data and the tile representing it. The less the distortion, the longer must be the codebook resulting in less compression. The problem with this method is the construction of the codebook which will vary with the statistics of the data. The codebook tiles can be chosen from actual representative parts of an image or they can be chosen independently of any given image. The closer the actually chosen tiles are to any given picture, the less will be the distortion. Adaptive methods have been introduced which involve computing multiple code books. These codebooks must be sent along with the data thus effectively reducing the compression ratio. Comparing data blocks with each codebook entry to find the best match is also computationally complex and time consuming.

The distortion measure has to be computed for each word in the codebook and each block of the input data. Therefore, methods have been developed which search the codebook in a tree-like fashion until a "good-enough" match has been found. Speech has also been compressed by this method. Another disadvantage of VQ is visible block structure in the decoded image. The maximum compression ratio is a function of the size of the block. For instance, in an image in which a solid color background extends over a large number, N, of blocks, N codewords representing the solid color vector would have to be sent, whereas, simple run length coding would require only one codeword for the entire area.

Wavelet compression (as disclosed in U.S. Pat. No. 5,412,741 to Shapiro) involves a set of orthonormal basis functions and is generally similar to DCT in the steps involved except that, instead of the cosine transform, another function is used. The same problems associated with Huffman and run length coding, which are used for the lossless coding segment, namely, the need for knowledge of the source statistics, hampers this method. The other drawbacks of DCT apply to this kind of compression also.

Fractal image compression (as disclosed in U.S. Pat. Nos. 5,148,497 to Pentland et. al., 5,497,435 to Berger, and 4,941,193 to Barnsley et. al.) involves identifying a number of different representative pieces of an image out of which, when properly transformed and superimposed, the whole image can be constructed. Affine transformations, which are made up of some combination of rotating, skewing and scaling, are used. The first step is to partition the image into non-overlapping domain regions each one of which will be represented by an affine transformation applied to one of a number of range regions. The next step is to choose the range regions. Finally, the set of affine transformations must be chosen. The selection of domain regions, range regions and affine transformations is based on a distortion criterion. The final selection must be such that the distortion criterion is met. The compressed data consists of a header which contains information about how the original data was divided up into regions and the list of affine transformations (one for each domain region) that, when applied to the range regions, results in the best match for each particular original image domain.

Decoding proceeds by dividing a reference image into domains similar to the domains of the original image and then applying the appropriate affine transformation to each domain. This process must be repeated several times, each time using the transformed reference image as the new reference image.

There are many disadvantages to fractal compression. 1) The entire image must be held in RAM while it is being processed. 2) Processing does not proceed sequentially on one piece of the symbol stream at a time, but globally over the whole image. 3) The process of choosing the domains is complicated and time consuming given that they may have irregular boundaries and for each iteration of this process each domain region must be matched up with each range region to determine which range region is best suited. 4) There is no straightforward way to determine the range regions. An exhaustive approach is very time-consuming. 5) The proper set of affine transformations must be determined. 6) Storage or transfer of this set to the decoder reduces compression. 7) The image data in each domain region must be compared to the transformed data from each possible range region using each possible affine transformation. If there are M domain regions, and N range regions, and R affine transformations, there will be M×N×R matrix multiplications each one resulting in $p^3$ multiplications and additions where p is the average size of the matrix in pixels. This is orders of magnitude greater than the processing required for DCT, for example. 8) This process must be repeated for each possible domain partition and each possible selection of range regions until the distortion criterion is met.

9) Claims that the decoded image is resolution independent are overblown. The image data was sampled originally at some specific spatial resolution. Using the mathematical description of the decoded image to "zoom in," will not result in accurate or useful information beyond the original spatial resolution regardless of the plausibility of the "zoomed in" image. For instance, let us assume that, if a picture of a forest is scanned at a certain resolution, nothing will be seen except tree leaves. If scanned at a finer resolution, a small bird may be seen. The decoded fractal image resulting from the first scanning will not show the bird with increased "zooming-in" but a more detailed image of tree leaves. 10) Fractal image compression works best when applied to "nature" scenes, but tends to "soften" hard boundaries. 11) Given any distortion measure, there is no guarantee that any reasonably sized set of affine transformations will satisfy that measure. Therefore, for any given image there is no guaranteed amount of compression. This makes sense as an image of white noise would not result in any compression from a theoretical point of view for any method. Large compression ratios can be achieved only if an image can be represented by a small number of affine transformations and this would be the case only if the image consisted of mostly repetitive data. Even though the data might be spatially complex, it would have to be spatially complex in the same way throughout the image. 12) The decoding requires an arbitrary number of iterations to achieve a given distortion. Each iteration requires a matrix multiplication for each domain. 13) Methods that divide the image into blocks for the domain and range regions reduce the computational complexity at the expense of limiting the compression to the maximum that can be achieved per block. Variable-to-block techniques such as run length coding can do much better for data which is inherently compressible such as an image containing pixels most of which are the same color. 14) Color is not an inherent part of the process but must be incorporated as an "add-on." 15) The time required for the final decoded image to stabilize is a variable. 16) There is no lossless mode.

For example, the complexity of U.S. Pat. No. 5,497,435 is enormous. Encompassed in the fractal processing method are the following techniques: Discrete Fourier Transform, Discrete Cosine Transform, table look-up through the color palette, the Lempel-Ziv algorithm, the Huffman algorithm, a Hilbert space projection technique, the computation of a Gram-Schmidt matrix and a Jacobi-like algorithm. And these are all in addition to the fractal processing itself!

U.S. Pat. No. 4,941,193 to Barnsley et. al. includes "a manual method [for encoding input images] which involves the intervention of a [human] operator." Obviously, no objective comparisons of computational complexity or encoding time can be made when a human operator is involved. Furthermore, "A second method involves automated encoding. This method has the advantage that no human operator is involved, but at present has the disadvantage that it is computationally expensive." Either way the computational complexity and time-consumption is orders of magnitude greater than for any other method.

In Raittinen, Harri et. al., "Critical Review of Fractal Image Compression," the authors state: "According to our tests it seems that none of the tested fractal compression methods yield significantly better results than JPEG, when a reasonably low compression ratio is used."

In summary it would seem that fractal image compression is much too time-consuming for real time applications such as the transfer of video information. Even decoding requires an arbitrary number of iterations. Also it requires a lot of hardware complexity amounting, for all practical purposes, to the requirement of a general purpose computer. The fact that the set of affine transformations must be transmitted or stored reduces potential gains in compression ratio. The accuracy with which the affine transformations are stored would also be a factor in determining what the final compression ratio and distortion would be. Vector quantization which matches blocks of the input image with a set of reference blocks stored in a codebook would seem to be a vastly simplified version of fractal coding. Both systems have the problem of determining the set of reference values (small image mosaics in the case of VQ and a set of affine transformations in the case of fractal), and then transmitting or storing that information. Both lack a straightforward way to trade off compression for distortion.

Video Compression

Video compression involves compression within a frame called intra-frame compression and frame-to-frame compression called inter-frame compression. A frame is similar to a still image, and the frames proceed, typically, at a rate of 30 frames per second (fps). Most current methods use a lossy form of compression. Current methods of video compression are the Hadamard transform (as disclosed in U.S. Pat. No. 4,675,750 to Collins et. al.), JPEG, MPEG, CCITT, Wavelets, Vector Quantization and Contour Tracing.

JPEG video compression codes every frame as a still picture according to the method discussed previously. CCITT is also DCT based. However, there is a provision for inter-frame coding. The current frame is subtracted from the previous frame after a block-by-block motion compensation is allowed for. The motion compensation works by matching up blocks in the current frame with blocks in the previous frame that are not necessarily in the same position. According to Chui et. al. in U.S. Pat. No. 5,600,373, JPEG is too slow to keep up with 30 frames per second decompression: "This is because the time generally required to perform the JPEG decompression of a motion picture frame exceeds the display time for the frame ($\frac{1}{30}$ second), and as a result the motion picture image cannot be decompressed for real-time display. Temporally accurate display of a motion picture compressed according to these techniques, thus requires the decompression and display to be done in two steps, with the decompressed motion picture stored on video tape or another medium from which the motion picture can be played with the proper time base."

MPEG is a more sophisticated version of CCITT which provides for interframe coding. However, it is very complex and costly. According to Knowles et. al. in U.S. Pat. No. 5,546,477, "Compression standards such as JPEG, MPEG1, MPEG2 and H.261 are optimized to minimize the signal to noise ratio of the error between the original and the reconstructed image. Due to this optimization, these methods are very complex. Chips implementing MPEG1, for example, may be costly and require as many as 1.5 million transistors. These methods only partially take advantage of the fact that the human visual system is quite insensitive to signal to noise ratio. Accordingly, some of the complexity inherent in these standards is wasted on the human eye. Moreover, because these standards encode areas of the image, they are not particularly sensitive to edge-type information which is of high importance to the human visual system."

Wavelet video compression suffers from boundary effects. At the edges of blocks or of the image itself, artifacts are introduced which degrade the quality of the decompressed image. The block-to-variable nature of the process also limits the potential compression that can be achieved when an image is capable of being compressed with a large compression ratio. For example, an image or sequence of images that consisted all of one color might be compressed in one code word by simple run length coding whereas the same sequence would require one code word per block by a block-to-variable technique.

Wavelet compression varies in effectiveness depending on the suitability of the actual wavelets chosen to the statistics of the data being compressed. If those statistics are unknown, the suitability of any particular set of wavelets is in question. According to Knowles et. al. in U.S. Pat. No. 5,546,477, "The particular wavelet which is best in analyzing a signal under analysis is heavily dependent on the characteristics of the signal under analysis. The closer the wavelet resembles the features of the signal, the more efficient the wavelet representation of the signal will be. In addition, reconstruction errors introduced by quantization resemble the wavelet. Typically, the amount of aliasing varies with spatial support (the number of coefficients of the wavelet filters). Long wavelets can be constructed such that aliasing between adjacent octave bands is minimized. However, the spatial equivalent of aliasing, overlap, increases with filter length. Conversely, short wavelets have little or no overlap spatially but exhibit large amounts of aliasing in the frequency domain."

A wavelet method such as that disclosed in U.S. Pat. No. 5,600,373 to Chui et al. provides for no interframe compression, requires knowledge of the source statistics since it uses Huffman coding, requires the storing of three matrices in memory, requires a lot of matrix algebra, requires overhead in the form of fields in the coded data which indicate which of a variety of parameters were actually used and skips entire frames in the display process if decompression can not keep up with real time demands.

The Contour Tracing techniques (as disclosed in U.S. Pat. Nos. 5,621,819 to Hozumi, 5,615,287 to Fu et. al. and 4,868,653 to Golin et. al.) are used primarily for video compression and identify boundaries or edges within the image, separate them out, and then compute or interpolate values for the fill areas between boundaries which represent some kind of average of the boundary elements close to the fill. These computed fill areas can then be subtracted from the actual data to create a difference file, and then this difference file losslessly coded and transmitted or stored. The decoder, likewise, once it knows the edges can compute the fill areas and these values can be updated with the actual decoded difference data.

The disadvantages of this method are that the contour tracing process is quite complicated and time intensive and must be carried on to such a sufficient degree of accuracy that the image doesn't appear to be distorted. It requires solving Laplace's equation over the filled edge array taking the edge pixels as boundary conditions. It requires additional coding such as Huffman or Liv-Zempel as an "add-on." Also, color is not an integral part of the process as the contour tracing technique just works with luminance data. Accordingly, the chrominance data are only filled in as the process continues so that video would tend to shift from gray-scale to color very rapidly as statistics vary. It also requires storing the entire image in RAM rather than processing the symbols a buffer at a time.

Variable-to-Block Techniques

In "An Algorithm for Source Coding," Schalkwijk developed a variable-to-block method for coding a sequence of binary digits based on a random walk in Pascal's triangle. He proved that the coding rate is asymptotically optimal as the block length approaches infinity according to Shannon's noiseless coding theorem. He introduced the technique of adding dummy bits to the source run to make the run terminate at the apex of Pascal's triangle. With the addition of the dummy bits, Schalkwijk's method was basically a block-to-block method which started coding at a specific point in Pascal's triangle and worked its way to the apex. As such, it required knowledge of the source statistics and hence was not universal. Performance decreased for long runs of zeroes or ones if the source probability of a one was near one half, and the maximum compression was limited by the block length.

In "A New Universal Coding Scheme for the Binary Memoryless Source," Lawrence describes a variable-to-block scheme involving a random walk in Pascal's triangle starting at the apex and working its way down until a specially defined boundary is reached which terminates the coding process. The advantages of this scheme are that it is universal, asymptotically optimal in terms of Shannon's noiseless coding theorem and results in huge compression ratios for low entropy source runs similar to run length coding. The disadvantage is that it does not work with multilevel sources. Only black and white images such as fax would be considered binary sources. Hence Lawrence coding has had limited usefulness.

In "Efficient Run-Length Encodings," Tanaka et. al. refer to "Lawrence coding" and compare it to other methods. They state: "If a comparison is made when the fixed-portion of both schemes are equal, then the Lawrence scheme will always be superior for very small 1−p." p is the probability of a zero. They also state: "Asymptotically the . . . Lawrence code . . . will outperform ATRL coding because [it] is universal and ATRL coding is not." ATRL is a form of run length coding. In "A Unique Ranking of Multilevel Sequences and Its Application to Source Coding," Tanaka et. al. derive a method for ranking multilevel sequences based on an alteration of the one dimensional Pascal's triangle. They note that Schalkwijk's algorithm and Lawrence coding work only for binary sequences, and that no satisfactory method for coding multilevel sequences using these techniques has yet been found.

In "Data Compression Techniques and Applications," Lynch defines universal coding: "An encoder is called universal if its performance, after being designed without knowledge of the source statistics, converges to the performance of an encoder designed with knowledge of the source statistics, as the block length approaches infinity." He presents a historical sequence of events in which in 1977 "Lawrence developed a universal variable-to-block code based on Schalkwijk's 1972 paper." While in 1978, "Ziv and Lempel developed a universal binary coding scheme in which a binary string is parsed into variable-length substrings and coded appropriately." Thus Lawrence coding was historically the first universal source coding method developed.

In "A Universal Variable-to-Fixed Length Source Code Based on Lawrence's Algorithm," Tjalkens et. al. state: "Lawrence . . . devised a variable-to-fixed length code that is easier to implement. Only a part of Pascal's triangle must be stored by the encoder and decoder now. An additional feature of this code is that it is universal." They then go on to describe a method in which the prefix and suffix of Lawrence coding are integrated into one lexicographical ranking. The problems with the Tjalkens scheme are that it works only for binary sources, and that it ranks random walks terminating on every possible boundary point thus limiting compression.

In general, the prior art has provided solutions which require a lot of computational and implementational complexity. They consist of multiple modules, stages and "add-on" units. They are mainly "ad hoc," require knowledge of the source statistics (hence are non-universal) and are not theoretically optimal with respect to Shannon's noiseless coding theorem. They divide the source image data into blocks which results in the decoded image having a "tiled" or "patchwork quilt" or "blockiness" effect at high compression ratios and also results in lower than maximum compression ratios for solid or nearly solid background images. Also, most systems are specialized in the sense that they will do only lossy or only lossless coding, and are tailored to do only data compression, image compression, video compression, audio compression or digital signal compression but not all of them. Finally, there is no known system in use today which can alternate as varying source statistics demand and in a seamless manner between lossless and lossy coding.

OBJECTS AND ADVANTAGES

Accordingly, the objects and advantages of my invention are the following:

1) To generalize Lawrence coding for multilevel sources.
2) To provide a method and apparatus that accomplishes both lossless and lossy compression.
3) To provide a method and apparatus that does data, image, video, audio, multimedia and other types of digital signal compression.
4) To provide theoretically optimal coding in terms of Shannon's noiseless coding theorem.
5) To provide universal coding which doesn't require knowledge of the source statistics.
6) To provide a method and apparatus that is simple and elegant in terms of design and implementation.
7) To provide a method and apparatus that achieves maximum compression based on the statistics of the data.
8) To provide a method and apparatus which minimizes the coding and decoding times.
9) To provide a method and apparatus which eliminates "blockiness."
10) To provide a method and apparatus which will compress and decompress various kinds of data which differ as to the number of levels contained in each. For instance, binary data has 2 levels. Eight bit gray scale data has 256 levels.
11) To provide a method and apparatus which avoids time-consuming table look-ups.
12) To provide a method and apparatus which processes the data sequentially so that the entire data stream does not have to be held in memory at one time.
13) To provide a method and apparatus which works seamlessly from lossless to lossy mode. For example, in video compression, if source statistics were favorable, it would operate in lossless mode, automatically and seamlessly changing to lossy mode as the statistics became less favorable with no more lossiness or distortion introduced than necessary.
14) To provide a method and apparatus which allows for progressive and hierarchical scanning. For instance, decoded video data might be upgraded in terms of fidelity and resolution as time progressed if conditions were favorable.
15) To provide a method and apparatus that does not introduce "artifacts" into the decoded data.
16) To provide a method and apparatus that operates on the data in the time domain instead of the transform domain which will eliminate the computational time and implementation complexity required for the transformation and reverse transformation.
17) To provide a method and apparatus which minimizes the number of computations involved by precomputing and storing codewords and decoded source data which can be directly accessed by pointers without requiring time-consuming table look-ups.
18) To provide a method and apparatus which uses what has been called in the literature the "Lawrence algorithm" which is based on a multi-dimensional generalization of Pascal's triangle that is called Pascal's hypervolume.
19) To provide a technique which can be implemented in both software and hardware.
20) To provide a method and apparatus based on Lawrence coding in which Pascal's triangle or hypervolume need not be stored by the encoder and decoder.

BRIEF DESCRIPTION OF DRAWING FIGURES

FIG. 2a shows a diagram of a typical codeword used with the LMAC and LMAD including a suffix and various prefixes.

FIG. 15 shows the use of preprocessing with the LMAC in a data compression application.

FIG. 29 shows an illustration of the lexicographical ordering of maximum entropy points used in conjunction with the LMAC and LMAD.

REFERENCE NUMERALS IN DRAWINGS

Figure 1:
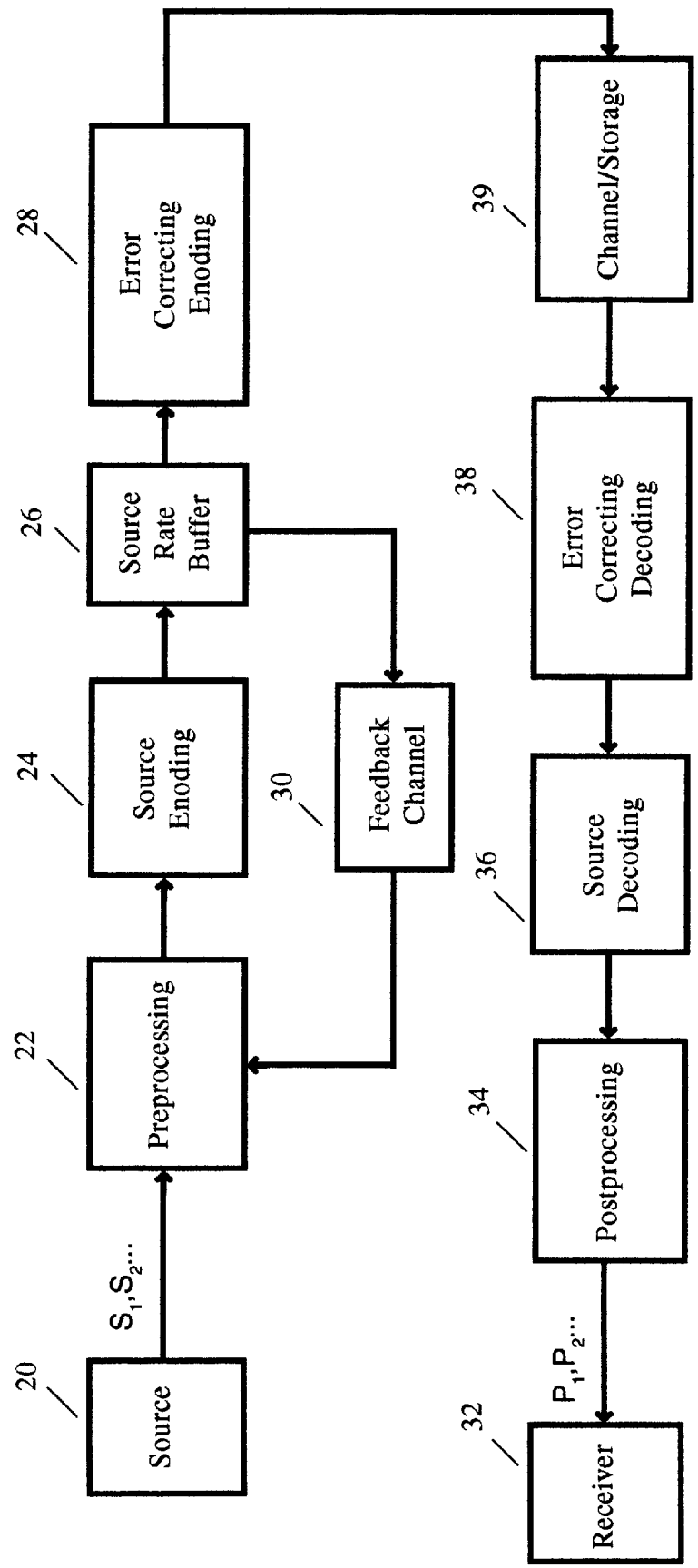
FIG. 1 shows a generalized diagram of an exemplary communications system including source, preprocessing, source encoding, source rate buffer, feedback channel, error correcting encoding, channel/storage, error correcting decoding, source decoding, postprocessing and receiver.

20 Source
22 Preprocessing
24 Source Encoding
26 Source Rate Buffer
28 Error Correcting Encoding
30 Feedback Channel
32 Receiver
34 Postprocessing
36 Source Decoding
38 Error Correcting Decoding
39 Channel/Storage
40 Lawrence M-ary Algorithm Compressor (LMAC)
44 Lawrence M-ary Algorithm Decompressor (LMAD)
45 on-off boundary prefix
46 coded or uncoded prefix
47 starting point prefix
48 suffix
49 Initialization block
50 Get source symbol block
52 Increment n and w block
54 Initialize j block
56 j=k? block
58 Update rs block
60 Increment j block
62 Maximum entropy point reached? block
64 Coded/uncoded? block
66 Boundary hit? block
68 Add dummy block
70 Pack codeword block 1
72 Uncoded run block
74 More symbols? block
76 Get codeword block
80 Unpack codeword block
84 rs comparison block
86 Subtract from rs block
92 Decrement w block
94 Decrement n block
96 Still on boundary? block
98 Discard dummy block
100 Record j block
102 n=0? block
104 Store source run block
106 Last codeword? block
110 AND gate 1
112 AND gate 2
114 Source symbol register
116 m−1 register
118 Dummy symbol register
119 Or gate 1
120 Comparator 1

122 Run length counter
124 w counters
126 OR gate 2
128 Running sum register
130 Current position register
132 Prefix logic
134 Prefix register
136 Adder 1
138 Accumulator 1
140 Multiplier 1
142 Divider 1
144 Adder 2
146 MUX 1
147 Multiplier 2
148 Maximal element register
149 Divider 2
150 Comparator 2
151 Next Dummy? FF
154 Boundary Hit? FF
156 Minimum run register
158 Comparator 3
160 AND gate 3
162 Output register
164 AND gate 4
166 OR gate 3
168 AND gate 5
170 Source symbols buffer
180 Codeword register
182 AND gate 6
184 MUX 2
188 Comparator 4
192 AND gate 7
198 Suffix register
202 Prefix inverse logic
204 Initial values ROM
208 AND gate 8
209 AND gate 9
210 Coded? FF
212 AND gate 10
214 AND gate 11
216 j counter
224 Comparator 5
226 Multiplier 3
228 Divider 3
230 PosUpJ register
232 AND gate 12
234 Comparator 6
236 Subtractor 1
238 On Boundary? FF
256 Get rs block
262 Add lpi to rs block
263 Set Coded/uncoded bit block
264 Pack codeword block 2
266 Output codeword block
276 Get source symbols block
278 Output source symbols block
282 AND gate 13
288 AND gate 14
292 AND gate 15
293 Adder 3
294 AND gate 16
295 Multiplier/Divider
296 Pointer address register
297 Adder 4
298 lpi ROM
299 lpi register
301 Boundary/coded logic
302 Coded/uncoded? FF
310 AND gate 17
312 Coded/uncoded prefix
316 AND gate 18
318 AND gate 19
321 AND gate 20
322 Source sequence pointer ROM
326 Pointer address register
328 Source sequence starting address register
330 Next source sequence starting address register
332 Subtractor 2
333 Symbols left counter
334 ROM address register 1
336 Clock
338 Source sequences ROM
340 "=0?" FF
342 Comparator 7
344 ROM output register 1
360 Get rs+ds block
364 Get prefix block
366 Pack codeword block 3
376 Get lpi block
378 Get lpi+rs+ds block
380 Get source sequence block
390 AND gate 21
392 Source sequence register
394 AND gate 22
398 AND gate 23
400 AND gate 24
402 AND gate 25
409 Prefix address register
410 rs+ds register
412 rs+ds ROM
414 Prefix ROM
416 rs+ds logic
418 rs+ds address register
430 AND gate 26
436 AND gate 27
438 AND gate 28
448 Adder 5
449 ROM address register 2
452 ROM address register 3
460 ROM output register 2
466 Subtractor 3
468 ROM address register 4
478 Comparator 8
486 Simple code
488 More complex code
496 Scanning module
498 Differencing/predicting module
500 Degrading module
516 Scan row order
518 Zig zag order
520 Hilbert curve order
522 Horizontal/vertical order
530 Image
532 Difference image
534 Intraframe coding difference equations
536 Frame
538 Next frame
540 Difference frame
542 Interframe coding difference equation
551 Source sequence
552 Original sequence
554 Original sequence (binary)
556 Degraded sequence (1 bit)
558 Decoded sequence (1 bit)

560 Degraded sequence (2 bits)
562 Decoded sequence (2 bits)
564 Degraded sequence (3 bits)
566 Decoded sequence (3 bits)
568 Degraded sequence (4 bits)
570 Decoded sequence (4 bits)
572 Degraded sequence (5 bits)
574 Decoded sequence (5 bits)
582 Frame Differencing
600 Frame undifferencing
602 Regrading
610 Get first frame block
612 Intraframe differencing block
614 Output to degrader block
616 Get next frame block
618 Interframe differencing block
620 Compute compressibility block
622 High compressibility? block
632 Intraframe coding first frame block
636 Intraframe coding subsequent frames block
638 Interframe coding block
640 Compare compression block
642 More compression? block
646 Reset block
652 A/D converter block
653 D/A converter block
680 Stage 0
682 Stage 1
684 Stage 2
686 Stage 3
687 Stage 4
688 Stage 5
689 Stage 6
693 YIQ channels
694 Source symbol sequences
695 Codeword 1
696 Boundary points
697 Maximum entropy points
698 Overall index
700 Symbol weights
702 Lexicographical ordering (meps)
712 Lawrence algorithm ordering
714 Lexicographical ordering (source sequences)
716 Lexicographical placement index 1
720 Codeword ROM 2
722 Codeword 2
726 Lexicographical placement index 2
732 Predictive coding
736 Predictive relationship
738 Source sequence
740 Differencing sequence
742 Predictive sequence
750 Pascal's hypervolume apex
752 Random walk
754 End of random walk
756 Dummy sequence
758 Boundary
780 Binary inputs
781 Combinatorial logic circuit
782 Binary outputs
783 Truth table
784 Minterms
785 Equations
786 AND gate example
787 NOT gate example
788 OR gate example
790 Symbol register
792 Logic example
794 Logic circuit
796 Address Register
798 AND logic
800 OR logic
802 NOT logic
816 Longer source sequence? block
820 Get precomputed codeword block
822 Set uncoded prefix block
824 Pack codeword block 4
836 Get precomputed source sequence address
850 AND gate 29
854 AND gate 30
858 AND gate 31
862 AND gate 32
866 Valid sequence? FF
868 AND gate 33
869 Longer Sequence logic
870 Coded/uncoded logic
874 Source sequence logic
878 Longer Sequence? FF
880 AND gate 34
886 AND gate 35
888 AND gate 36
894 AND gate 37
906 Subtractor 4
908 ROM address register 5
918 Comparator 9
920 ROM output register 3
932 $w_0$ prefix
934 $w_1$ prefix
936 $w_{m-1}$ prefix
938 suffix

SUMMARY

A method and apparatus are described for use in source coding for compressing digital information such as data, image, video, audio, speech, multimedia, medical, surveillance, military and scientific. The method is called the Lawrence m-ary algorithm which is a generalization of the Lawrence binary algorithm of U.S. Pat. No. 4,075,622 and which is expounded in "A New Universal Coding Scheme for the Binary Memoryless Source," by John C. Lawrence in the IEEE Transactions on Information Theory, Vol. IT-23, No. 4, July 1977. The Lawrence m-ary algorithm described herein can work with multilevel sources such as text, in which each alphanumeric symbol represents a different source level; color and gray-scale images, in which each different color or level of gray represents a different source level; or color video in which each picture element of each scan line of each frame can represent one of many different colors or source levels. The binary algorithm can only represent two levels making it suitable only for black and white images or video and not suitable at all for data compression involving multilevel alphabets.

The Lawrence m-ary algorithm is a variable-to-block technique which means that the encoder accepts a variable length sequence of source symbols at the input and outputs a fixed length codeword block. The length of the codeword is equal to the block length. The per block compression ratio is the length of the input sequence in bits divided by the length of the output sequence in bits. The advantages of a variable-to-block technique are that, for particularly favorable source statistics, compression is not limited by the size of the block as it is in a block-to-variable or block-to-block technique and that the decoded data do not exhibit a "blockiness" or "patchwork quilt" appearance (for image and video)

as do such techniques as those based on the Discrete Cosine Transform, JPEG and others.

The method and apparatus described herein is a lossless coding method meaning that the information retrieved after the decoding process takes place is identical with the information as it existed before the encoding process took place. However, with suitable additional modules as described herein, coding using the Lawrence m-ary algorithm can become lossy as well which results in even greater compression. Therefore, the method has great flexibility as it can be used for both lossless and lossy coding. Most lossless techniques currently available are not suitable for image and video compression and most image and video compression techniques currently available are not suitable for data compression or lossless image and video compression because they are inherently lossy. Thus there is not one currently available technique that can perform data, image and video compression in both lossless and lossy modes with acceptable results. The Lawrence m-ary algorithm is capable of performing all three types of compression and more in both lossless and lossy modes.

Greater control is achieved over the fidelity reducing or degrading process since it is not an inherent part of the compression process itself. Also the fidelity can be adjusted seamlessly between lossless and lossy modes for situations such as video where both may be possible depending on the time-varying statistics of the source data.

Additional flexibility is attained since, in the method and apparatus described herein, the value of m, the number of source levels, can be easily altered to reconfigure the system for use with different sources characterized by different values of m and for different codeword block lengths corresponding to different degrees of closeness to Shannon's optimal curve. The Lawrence m-ary algorithm is universal which means that knowledge of the source statistics is not required for optimal results and it is also asymptotically optimal in terms of Shannon's noiseless coding theorem.

Essentially, the algorithm works by taking a random walk in Pascal's hypervolume (a generalization of Pascal's triangle) taking a step in the $j^{th}$ direction if the current source symbol is a j and computing a running sum until a boundary is reached. The process is terminated at some point on the boundary, the running sum becomes the suffix of a codeword and one of the prefixes becomes an indicator of the point at which coding terminated. The decoder starts at the point in Pascal's hypervolume indicated by the appropriate prefix, performs the inverse of the encoding process and works its way to the apex by retracing the steps of the coding process generating the original source symbol sequence as it goes.

The computation involved in the construction of the codeword suffix can be done as the encoding process proceeds or the codeword suffixes can be precomputed and stored in memory thus speeding up the encoding process. Similarly, the original source symbol sequences can either be generated as part of the decoding process or precomputed and stored at the decoder thus speeding up the decoding process. The codewords generated by the Lawrence m-ary algorithm correspond to a lexicographical ordering of source sequences. Thus, since it is a variable-to-block method and the codewords have fixed length, this lexicographical ordering can be used as the address of a pointer to the original source symbol sequence at the decoder. The set of codeword suffixes corresponding to a certain boundary point can be stored in consecutive locations and offset from those corresponding to other boundary points by an index which we call the lexicographical placement index (lpi). The appropriate prefix can represent the address of the lpi at the decoder and the lpi can be added to the codeword suffix to get the address of the pointer to the original source symbol sequence. Alternatively, the prefix can be merged with the suffix forming a codeword that represents a lexicographically ordered pointer address.

It may be desirable in certain applications to reduce the number of boundary points that are acceptable termination points for the encoding process. This can be done by restricting the encoding and decoding processes to certain portions of Pascal's hypervolume within which the Lawrence m-ary algorithm may work and by not allowing the coding process to terminate on every boundary point. In particular we consider letting the coding process terminate on certain points which are called maximum entropy points. In so doing we minimize the length of the prefix and hence maximize compression.

This limitation of scope may simplify construction of the apparatus, enhance compression or both. Various configurations of the Lawrence M-ary Algorithm Coder (LMAC) and Lawrence M-ary Algorithm Decoder (LMAD) are possible involving combinations of computed and precomputed stages, changes in the values of m and block length, changes in the amount of degradation of the source data, configuration of Pascal's hypervolume and restriction of boundary points. Various scanning modes such as progressive scanning and hierarchical scanning are easily implemented.

Another related system would involve any assignment of variable length, multilevel source symbol sequences to a set of fixed-length codewords that represented the addresses of pointers to the original sequences stored at the decoder.

Finally, the use of the LMAC and LMAD in different types of applications including data, image and video compression will be illustrated.

THEORY OF OPERATION

The binary algorithm is covered in U.S. Pat. No. 4,075, 622, Lawrence et. al., "Variable-to-block-with-prefix Source Coding Technique," Feb. 21, 1978 and in Lawrence, J. C., *A New Universal Coding Scheme for the Binary Memoryless Source*, IEEE Transactions on Information Theory (1977), vol. IT-23, no. 4. pp. 466–472.

Figure 24:
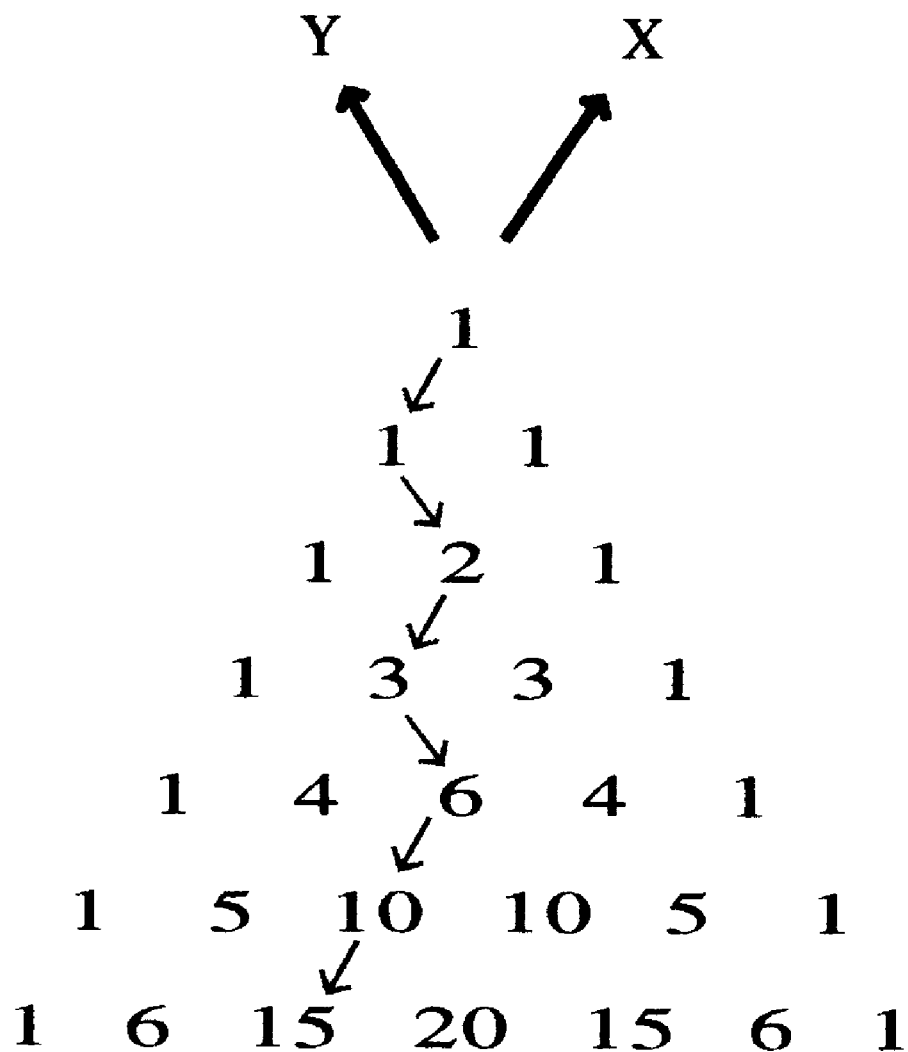
FIG. 24 shows an example of a binary coding scheme using Pascal's triangle.

Briefly, binary coding proceeds by taking a random walk in Pascal's triangle determined by the incoming source bits as in FIG. 24. Each element in Pascal's triangle is generated by taking the sum of the two elements immediately above it—the two nearest neighbors on the preceding row. If a 0 comes in, take one step in the −X direction. If a 1 comes in, take one step in the −Y direction and add the Pascal's triangle element one step in the X direction from this point to a running sum which is initially set to 0. At some point the process terminates and the running sum becomes the codeword suffix. The codeword prefix tells the decoder at which point in Pascal's triangle to begin the decoding process.

For example, let us encode the source string {0,1,0,1,0,0}. Since the first bit is a 0, take one step in the −X direction to the element 1 in Pascal's triangle. The second bit is a 1; take one step in the −Y direction to 2 and add to the running sum the number one step in the X direction from this point, which is 1. The third bit is a 0; take one step in the −X direction to 3. The fourth bit is a 1; take one step in the −Y direction to 6 and add the number one step in the X direction from this point, which is 3, to the running sum giving 3+1=4. The last two bits are zeroes. Take two steps in the −X direction, first to 10 and then to 15. A codeword suffix of 5 bits would be necessary to contain the running sum, and a prefix of 3 bits would be necessary to indicate where on row 6 of Pascal's triangle the run terminated.

The decoding procedure is the inverse of the encoding procedure. Begin at the same point in Pascal's triangle at which coding terminated. If the running sum is less than the number one step in the X direction, take one step in the X direction and record a zero. If the running sum is greater or equal to the number one step in the X direction, subtract that number from the running sum, record a 1, and move one step in the Y direction. The process will terminate at the apex of Pascal's triangle. Since the last bit encoded is the first bit decoded, the decoded sequence will have to be reversed to obtain the original sequence.

For example, with reference to FIG. 24 again, start at the element 15 on row 6 of Pascal's triangle. The running sum, 4, is less than the number one step in the X direction which is 10. Take one step in the X direction to 10 and record a zero. The running sum, 4, is less than the number, 6, which is one step in the X direction from 10. Therefore, move one step in the X direction to 6 and record a 0. The running sum, 4, is greater then the number one step in the X direction from 6 which is 3. Therefore, subtract 3 from 4 leaving 1, move one step in the Y direction to 3 and record a 1. The running sum, 1, is less than the number one step in the X direction from 3. Therefore, move one step in the X direction to 2 and record a 0. The running sum, 1, is not less than the number one step in the X direction from 2, which is 1. Therefore, subtract 1 from the running sum leaving 0, move one step in the Y direction to 1 and record a 1. The running sum, 0, is less than the number one step in the X direction from the current position, 1. Therefore, move one step in the X direction reaching the apex and record a 0. This completes the process. The decoded bits are {0,0,1,0,1,0} which must be reversed to obtain the original bit sequence.

Figure 25:
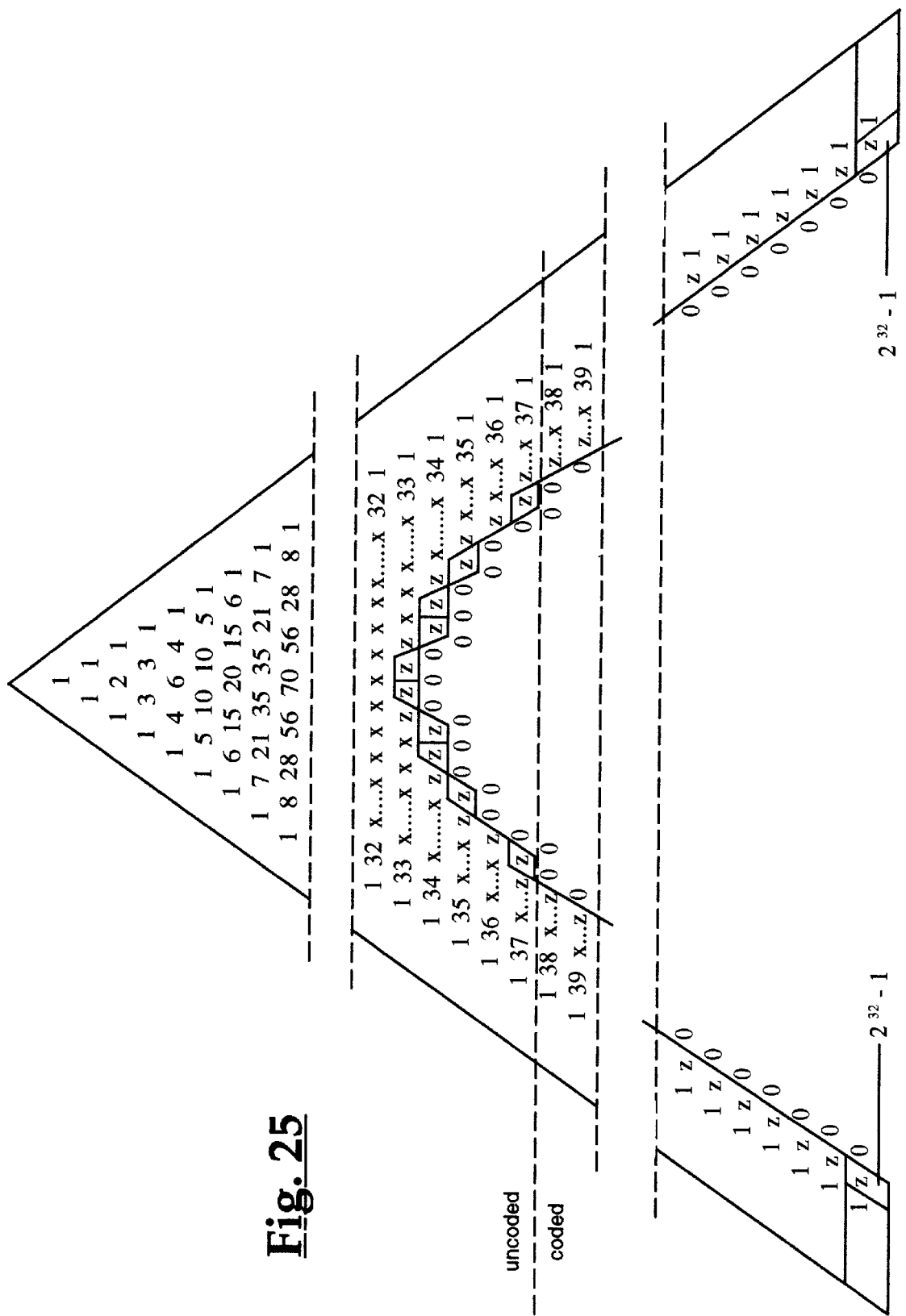
FIG. 25 shows an example of Pascal's triangle as used for coding with the Lawrence binary algorithm.

FIG. 25 illustrates how the boundary is drawn in Pascal's triangle for Lawrence binary coding. The boundary is defined as the set of elements such that, when any of them are reached during the random walk, the encoding of source bits terminates. Boundary points are indicated by the letter z in FIG. 25. We assume a suffix length, s, of 31 bits. Let (n,w) denote the $w^{th}$ element of the $n^{th}$ row. Boundary points consists of the set of elements {(n,w*)} and are defined such that the following conditions hold for each boundary point:

$$\log_2\binom{n}{w^*} \leq s$$

$$\log_2\binom{n+1}{w^*+1} > s, \text{ for } w \leq \frac{n}{2}$$

$$\log_2\binom{n+1}{w^*} > s, \text{ for } w > \frac{n}{2}$$

The codeword suffix is the value of the running sum when the boundary is reached. The point at which encoding is stopped is called the termination point. For purposes of the present discussion, any boundary point can be a termination point. The point at which decoding starts is called the starting point which is always the same point as the termination point for encoding. The starting point prefix can refer to the boundary point at which the run terminates, but this does not result in a starting point prefix that can be expressed in the smallest number of bits. In order to maximize the value of the compression ratio, it is necessary, for any given suffix length, to make the starting point prefix as small as possible. We can do this by restricting the set of starting points to less than the full set of boundary points. To simplify the present discussion, let us just consider the left half of Pascal's triangle. Once the boundary is reached, we add "dummy" zeroes until a point is reached at which no more can be added without crossing the boundary. We call these points "maximum entropy" points (meps), and these are circumscribed in FIG. 25. At the decoder these "dummies" will be stripped off before the source sequence is allowed to begin. For purposes of the subsequent discussion, we let the set of starting points be equal to the set of meps.

Maximum entropy points, then, can be defined as follows:

$$\log_2\binom{n}{w^*} \leq s$$

$$\log_2\binom{n+1}{w^*+1} > s$$

and $$\log_2\binom{n+1}{w^*} > s$$

The set of maximum entropy points, {(n*,w*)}, is defined as those boundary points such that, for a given w*,n* is the largest integer such that $$\log_2\binom{n^*}{w^*}$$

can still fit in s bits. Now there is a maximum of one starting point for every possible value of w (0≦w≦r) such that $$\log_2\binom{r}{w}$$

can fit in s bits. In FIG. 25, this would be equal to the number of elements on row 32 which is 33. Therefore, we would need a prefix of $\log_2$ 33 bits. If we coded runs of length 34 through 37, we would actually get an expansion instead of a compression due to the length of the prefix. For this reason, for runs of less than 38 symbols, we just send the source symbols as they are and indicate this with a 1 bit "coded or uncoded" prefix. In FIG. 25 these two regions are indicated. The starting point prefix then will fit in 5 bits instead of 6. The codeword consisting of "coded or uncoded" prefix, starting point prefix and suffix then has a length of 37 bits. Note that, if we referenced every boundary point as a possible starting point, we would need a prefix capable of expressing the maximum run length which in FIG. 25 would be $n=2^{32}-1$ or 32 bits.

At the decoder the dummy zeroes (or ones) are stripped off to get the original sequence up to the value n*(w*)−n*(w*−1) where n*(w*) is the source sequence length corresponding to the starting point (n*,w*). This is the maximum number of dummies that can be stripped off before the point is reached at which the source sequence could have terminated on a zero.

The codeword then consists of s+$\log_2$ s+1 bits, and it is proven in Lawrence, J. C., *A New Universal Coding Scheme for the Binary Memoryless Source*, that this value is optimal in terms of Shannon's noiseless coding theorem.

The mathematical expression for the running sum, rs, is the following:

$$rs = \sum_{k=1}^{n} t_k \binom{k-1}{w_k}$$

where $$w_k = \sum_{i=1}^{k} t_i$$

$w_n$ = weight of sequence
$t = (t_1, t_2, \ldots, t_n)$ = a binary sequence
n = length of sequence $$0 \leq rs \leq \binom{n}{w_n} - 1$$

3-Dimensional Algorithm

The m-ary algorithm can be visualized in 3 dimensions as a random walk in a tetrahedron whose faces other than the base represent Pascal's triangles. The middle of the tetrahedron is hollowed out in accordance with a 3-dimensional boundary which will be defined later.

There are three possible source symbols: 0, 1 and 2. The random walk starts at the apex and proceeds as follows: if a 0 comes in, take a step in the −X direction; if a 1 comes in, take a step in the −Y direction and add to the running sum the value of the element one step in the X direction from the new position; if a 2 comes in, take a step in the −Z direction and add to the running sum the elements one step in the X direction and one step in the Y direction from the new position.

Decoding proceeds similarly. From the starting point, examine the element one step in the X direction. If it is greater than the running sum, record a 0 and move one step in the X direction. If it is less than or equal to the running sum, add the element one step in the Y direction to the element one step in the X direction. If the sum of these two elements is greater than the running sum, record a 1, subtract from the running sum the value of the element one step in the X direction and move one step in the Y direction. If the sum of the two elements is less than or equal to the running sum, record a 2, subtract from the running sum the combined value of the sum of the two elements and take one step in the Z direction. Continue on until the apex is reached.

Each slice through the tetrahedron parallel to the base represents the elements that the random walk can land on for a sequence of corresponding length $^{i.e.}$ the $n^{th}$ plane from the apex corresponds to a sequence of length n. The elements of the tetrahedron are equal to $$\frac{n!}{w_0! w_1! w_2!}$$

where $w_0 + w_1 + w_2 = n$

The structure of the tetrahedron is similar to Pascal's triangle in which each element is equal to the sum of the two closest elements in the row above it. Each element in the tetrahedron is equal to its three nearest neighbors in the plane above it. The corresponding mathematical expression is the following:

$$\frac{n!}{w_0! w_1! w_2!} = \frac{(n-1)!}{(w_0-1)! w_1! w_2!} + \frac{(n-1)!}{w_0!(w_1-1)! w_2!} + \frac{(n-1)!}{w_0! w_1!(w_2-1)!}$$

Figure 26:
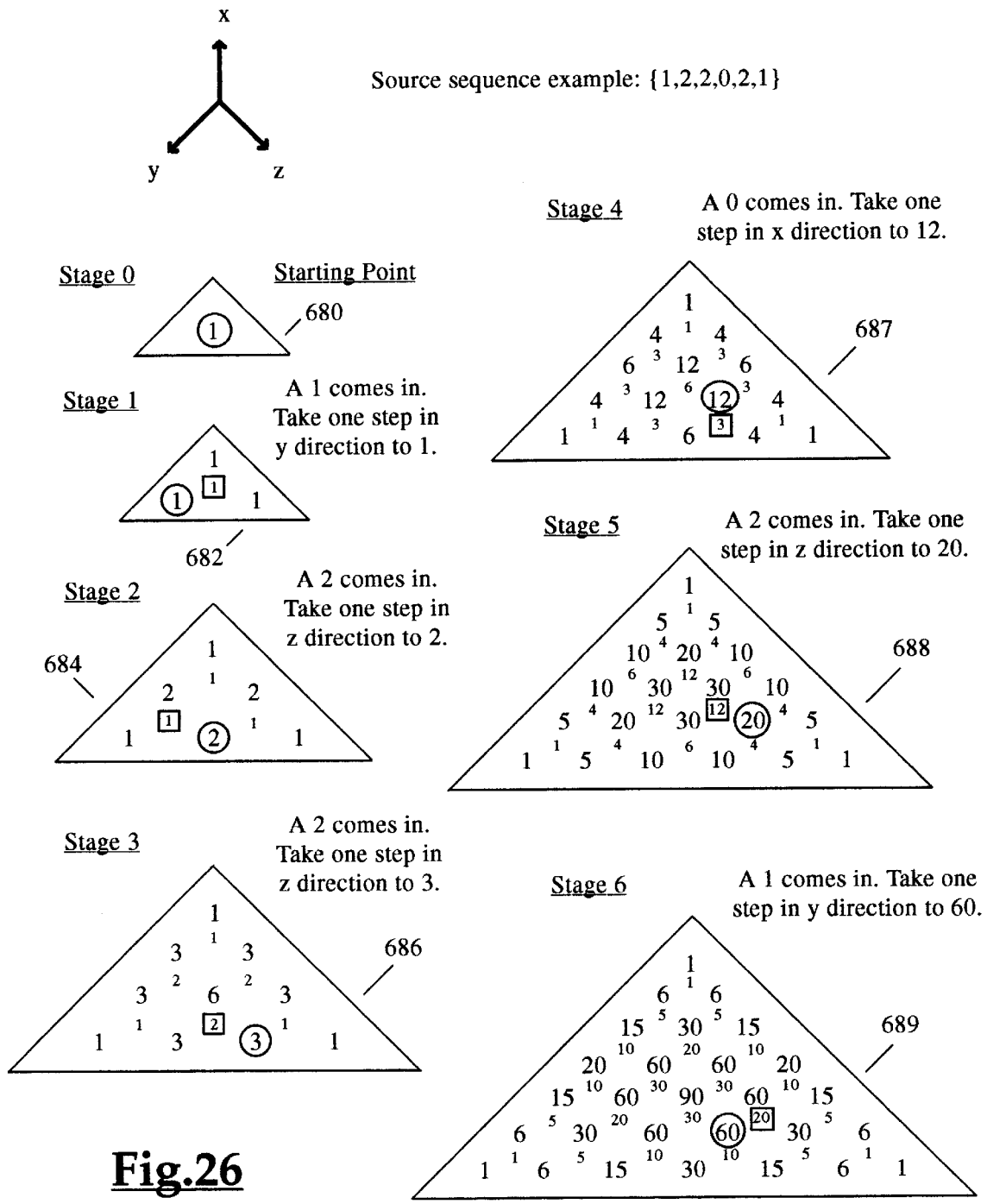
FIG. 26 shows an example of coding with the Lawrence m-ary algorithm (for m=3) in Pascal's tetrahedron.

The three nearest neighbors in the $(n-1)^{th}$ row represent the elements from which the element in the $n^{th}$ row can be approached during the random walk. FIG. 26 shows some of the planes in the tetrahedron and illustrates how the elements are computed. Stage 0 680 represents the apex of Pascal's tetrahedron.

Let's consider an example in which the source string has a length of 6 symbols: {1,2,2,0,2,1}.
Stage 1: 682
A 1 comes in. (n=1, $w_0$=0, $w_1$=1, $w_2$=0)
Move one step in the −Y direction.
The element one step in the X direction is $$\frac{(n-1)!}{(w_0-1)! w_1! w_2!} = \frac{(0)!}{(-1)!(1)!(0)!} = 0$$

∴ Running sum=0
Note: $(-1)! = \infty$, $(0)! = 1$
Stage 2: 684
A 2 comes in. (n=2, $w_0$=0, $w_1$=1, $w_2$=1)
Move one step in the −Z direction.
The element one step in the X direction is $$\frac{(n-1)!}{(w_0-1)! w_1! w_2!} = \frac{(1)!}{(-1)!(1)!(1)!} = 0$$

The element one step in the Y direction is $$\frac{(n-1)!}{w_0!(w_1-1)! w_2!} = \frac{(1)!}{(0)!(0)!(1)!} = 1$$

The sum of the two elements=0+1=1.
∴ Running sum=1+0=1.
Stage 3: 686
A 2 comes in. (n=3, $w_0$=0, $w_1$=1, $w_2$=2)
Move one step in the −Z direction.
The element one step in the X direction is $$\frac{(n-1)!}{(w_0-1)! w_1! w_2!} = \frac{(2)!}{(-1)!(1)!(2)!} = 0$$

The element one step in the Y direction is $$\frac{(n-1)!}{w_0!(w_1-1)! w_2!} = \frac{(2)!}{(1)!(0)!(2)!} = 1$$

The sum of the two elements=0+1=1.
∴ Running sum=1+1=2.
Stage 4: 687
A 0 comes in. (n=4, $w_0$=1, $w_1$=1, $w_2$=2)
Move one step in the −X direction.
Running sum remains unchanged at 2.

Stage 5: 688

A 2 comes in. (n=5, $w_0=1$, $w_1=1$, $w_2=3$)

Move one step in the –Z direction.

The element one step in the X direction is $$\frac{(n-1)!}{(w_0-1)!w_1!w_2!} = \frac{(4)!}{(0)!(1)!(3)!} = 4$$

The element one step in the Y direction is $$\frac{(n-1)!}{w_0!(w_1-1)!w_2!} = \frac{(4)!}{(1)!(0)!(3)!} = 4$$

The sum of the two elements=4+4=8.

∴ Running sum=8+2=10.

Stage 6: 689

A one comes in. (n=6, $w_0=1$, $w_1=2$, $w_2=3$)

Move one step in the –Y direction.

The element one step in the X direction is $$\frac{(n-1)!}{(w_0-1)!w_1!w_2!} = \frac{(5)!}{(0)!(2)!(3)!} = 10$$

∴ Running sum=10+10=20.

The decoding algorithm works as follows. We have the running sum=20, and the starting point is (n=6, $w_0=1$, $w_1=2$, $w_2=3$).

Stage 1:

Examine the element at $$(5, 0, 2, 3) = \frac{(5)!}{(0)!(2)!(3)!} = 10.$$

10≦Running sum=20.

Next examine the element at $$(5, 1, 1, 3) = \frac{(5)!}{(1)!(1)!(3)!} = 20.$$

20+10=30>Running sum=20.

∴ Record a 1, subtract 10 from the running sum and move one step in Y direction to (5,1,1,3).

Running sum=20−10=10.

Stage 2:

Examine the element at $$(4, 0, 1, 3) = \frac{(4)!}{(0)!(1)!(3)!} = 4.$$

4≦Running sum=10.

Examine the element at $$(4, 1, 0, 3) = \frac{(4)!}{(1)!(0)!(3)!} = 4.$$

4+4=8≦Running sum=10.

∴ Record a 2, subtract 8 from the running sum and move one step in Z direction to (4,1,1,2).

Running sum=10−8=2.

Stage 3:

Examine the element at $$(3, 0, 1, 2) = \frac{(3)!}{(0)!(1)!(2)!} = 3.$$

3>Running sum=2.

∴ Record a 0 and move 1 step in X direction to (3,0,1,2).

Running sum=2.

Stage 4:

Examine the element at $$(2, -1, 1, 2) = \frac{(2)!}{(-1)!(1)!(2)!} = 0.$$

0≦Running sum=2.

Examine the element at $$(2, 0, 0, 2) = \frac{(2)!}{(0)!(0)!(2)!} = 1.$$

0+1=1≦Running sum=2.

∴ Record a 2, subtract 1 from the running sum and move one step in Z direction to (2,0,1,1).

Running sum=2−1=1.

Stage 5:

Examine the element at (1,−1,1,1)=0.

0≦Running sum=1.

Examine the element at $$(1, 0, 0, 1) = \frac{(1)!}{(0)!(0)!(1)!} = 1.$$

0+1=1≦Running sum=1.

∴ Record a 2, subtract 1 from the running sum and move one step in Z direction to (1,0,1,0).

Running sum=1−1=0.

Stage 6:

Examine the element at (0,−1,1,0)=0.

0≦Running sum=1.

Examine the element at $$(0, 0, 0, 0) = \frac{(0)!}{(0)!(0)!(0)!} = 1.$$

0+1>Running sum=0.

∴ Record a 1, move one step in Y direction to (0,0,0,0) and the decoding is complete.

The general mathematical expression for the running sum, rs, for m source levels is $$rs = \sum_{k=1}^{n} \sum_{i=0}^{j-1} \frac{(k-1)!}{(w_i^k - 1)! \prod_{\substack{p=0 \\ p \neq i}}^{m-1} (w_p^k)!}$$

where $w_j^k$=number of "j"s that have come in after k stages.

At each stage, k, if a j comes in, we add to the running sum j−1 elements as in the example we worked out for m=3.

The structure of the m dimensional Pascal's hypervolume is as follows. Each element is equal to the sum of its m nearest neighbors at the level above it $^{i.e.}$ the elements one step up in the $j^{th}$ direction for $0 \leq j < m$.

$$\frac{n!}{w_0! w_1! \cdots w_j! \cdots w_{m-1}!} =$$
$$\frac{(n-1)!}{(w_0-1)! w_1! \cdots w_{m-1}!} + \frac{(n-1)!}{w_0!(w_1-1)! \cdots w_{m-1}!} + \cdots +$$
$$\frac{(n-1)!}{w_0! w_1! \cdots (w_j-1)! \cdots w_{m-1}!} + \cdots + \frac{(n-1)!}{w_0! w_1! \cdots (w_{m-1}-1)!}$$

The general m-ary algorithm can be specified as follows. At each stage, if a j ($0 \leq j < m$) comes into the encoder, for every value of i, $0 \leq i \leq j-1$ add the element in the $i^{th}$ direction of Pascal's hypervolume to the running sum and move one step in the $j^{th}$ direction. At the decoder, check the element one step upward in the $0^{th}$ direction. If it is greater than the running sum, record a 0 and move one step upward in the $0^{th}$ direction. If it is less than or equal to the running sum, check the sum of the elements one step upward and in the $0^{th}$ and $1^{th}$ directions. If the sum of the elements is greater than the running sum, record a 1, subtract the element one step up in the $0^{th}$ direction and move one step upward in the $1^{th}$ direction. If the sum of the elements is less than or equal to the running sum, check the sum of the elements one step up in the $0^{th}$, $1^{th}$, and $2^{th}$ directions. Continue in this way until the symbol is decoded. In general, if the sum of the elements in the $0^{th}$, $1^{th}$, . . . , $(j-1)^{th}$ directions is less than or equal to the running sum and the sum of the elements in the $0^{th}$, $1^{th}$, . . . , $j^{th}$ directions is greater than the running sum, decode a j, subtract the sum of the elements in the $0^{th}$, $1^{th}$, . . . , $(j-1)^{th}$ directions from the running sum and move one step upward in the $j^{th}$ direction. The elements one step up (down) in the $j^{th}$ direction ($0 \leq j \leq m-1$) are the nearest neighbors of the current element.

Boundary

In the m-ary case we can define the boundary points similarly to the binary case as those elements that fit within a s symbol or $s*\log_2 m$ bit block length. Starting points can be defined similarly. Given any element determined by $(n, w_0, w_1, \ldots, w_{m-1})$, we define a boundary point $(n, w_0, w_1, \ldots, w_i, \ldots, w_{m-1})$ as follows:

$$\log_2 \binom{n}{w_0, w_1, \ldots, w_i^*, \ldots, w_{m-1}} \leq s$$

$$\log_2 \binom{n}{w_0, w_1, \ldots, w_i^* + 1, \ldots, w_{m-1}} > s$$

for some value of i.

To reach a maximum entropy point, we add dummy symbols as we did in the binary case until the following condition holds:

$$\log_2 \binom{n}{w_0, w_1, \ldots, w_i^* + 1, \ldots, w_{m-1}} > s$$

for all values of i, $0 \leq i \leq m-1$.

To be consistent we specify that the dummy symbols will be added in lexicographical order from m−1 to 0 although any ordering could be specified as long as there is consistency between the encoder and decoder. First dummy (m−1)s are added until we can't add any more without crossing the boundary, then dummy (m−2)s are added until we can't add any more without crossing the boundary etc. until it is not possible to add another symbol without crossing the boundary.

At the decoder, the dummy symbols are first stripped off before recovering the source symbols.

Prefix Considerations

The coded block consists of a suffix which is computed by the random walk in Pascal's triangle or hypervolume, a starting point prefix which communicates the starting point to the decoder, and a "coded or uncoded" prefix to prevent expansion. In one embodiment of the binary scheme a prefix of $\log_2 s$ bits, where s is the suffix length, was used resulting in a total block length for the coded word of $(s+\log_2 s+1)$ bits. There was just one starting point for each possible run weight, and dummy bits were added to the source run to make the run terminate at one of these maximum entropy points.

Alternatively, we could have specified the run length, n, in the prefix resulting in a prefix of $\log_2 n$ bits. In this case no dummy bits would be necessary. As another modification, we can incorporate the starting point prefix into the suffix by simply adding a value to the suffix which represents the number of sequences terminating on previous boundary points. This amounts to listing all possible sequences that terminate on the boundary in lexicographical order and assigning an index to each.

For instance, let $(n^*, w^*)$ be a maximum entropy starting point, $(0 < w^* < s)$. There are less than $$\binom{n^*}{w^*}$$

source sequences ending on $(n^*, w^*)$ since certain sequences are excluded by the boundary. Each allowable sequence can end with a number of dummy zeroes or ones (on the right side of Pascal's triangle) which must be stripped off by the decoder. There is one run of weight 0 and, in general, less than $$\binom{n^*(w^*)}{w^*}$$

runs of weight $w^*$, $0 \leq w^* < s$. We add the total number of runs of weight k ($0 \leq k < w^*$) to the computed index for a run of weight $w^*$ to get the lexicographical index for the run.

Therefore, the total number of possible source sequences is less than $$\sum_{w=0}^{s} \binom{n^*(w)}{w} = 1 + n^*(1) + n^*(2)[n^*(2) - 1]/2 + \ldots$$

As an approximation we know that for every starting point the lexicographical index is increased by a value less than $2^s$. There are s−1 starting points not counting the all zero and all one runs which will only increase the overall lexicographical index by 2. Therefore, the total number of possible source sequences is less than $2^s(s-1)+2$. This will require approximately $\log_2 s + s$ bits for the block length which is the result obtained previously that was shown to be asymptotically optimal in terms of Shannon's noiseless coding theorem.

At the decoder the magnitude of the codeword determines the starting point. The appropriate quantity called a lexicographical placement index (lpi) is subtracted from the codeword, and decoding proceeds in Pascal's triangle as before. Or the codewords can be used as the addresses of pointers to precomputed source symbol sequences.

A variation of the above scheme would allow every possible boundary point to be a starting point. Then the codeword prefixes would indicate the starting point to the decoder and the suffixes would be the running sums which would be used to decode the original source symbol sequence. Or the codewords could be made to represent a lexicographically ordered index by adding a lpi to the running sum and eliminating the prefix. Then the codeword would be equal to the address of a pointer to the precomputed source symbol sequence. Thus the decoded sequence need only be read out of ROM, into video memory and displayed with no decoding computation whatsoever! Such a scheme would require a codeword of less than $\log_2 n+s$ bits where n is the maximum run length.

For the m-ary system, we know that the first maximum entropy point occurs approximately when the run length equals the suffix length and there are equal numbers of each symbol, $^{i.e.}$ when n=s and $w_j$=s/m for all j. Therefore, it follows that there is one maximum entropy point for every possible combination of s symbols. There are $$\binom{s+m-1}{s}$$

possible combinations of m objects taken s at a time. Therefore, we have approximately $$\frac{(s+m-1)!}{s!(m-1)!} = \frac{(s+m-1)(s+m-2)\ldots(s+1)}{(m-1)(m-2)\ldots 1} < s^{m-1}$$

maximum entropy points (for m>2 and s>3). Therefore, we can refer to or index every maximum entropy point in less than $m \log_2 s$ bits so that the codeword length is less than $(s \log_2 m + m \log_2 s)$ bits.

Computation of Pascal's Hypervolume Elements

The Pascal's hypervolume elements needed in the computation do not have to be stored in memory. They can be computed on the fly as the random walk proceeds in Pascal's hypervolume using just the last previously computed element thereby avoiding the need for any storage whatsoever. In the binary case, an element of Pascal's triangle can be expressed in terms of the element next to it in a row. Let curPos be the value of the element at the current position. Then the value of an element one position to the right (left), we call PosRight (PosLeft).

Then

PosRight=(curPos*$w_0$)/($w_1$+1)

PosLeft=(curPos*$w_1$)/($w_0$+1)

$w_0$ and $w_1$ are the values at curPos.
Eg. Let n=6 and $w_0$=4, $w_1$=2.
Then curPos=n!/($w_0$!*$w_1$!)=15.
Therefore, PosRight=(value at n=6, $w_0$=3, $w_1$=3)=6!/3!3!=(curPos*$w_0$)/($w_1$+1)=15*4/3=20

We can also develop formulas for the values of elements at positions down and to the right (left) from the current position and up and to the right (left) from the current position. These are PosDownLeft=curPos*(n+1)/($w_0$+1)

PosDownRight=curPos*(n+1)/($w_1$+1)

PosUpLeft=curPos*$w_1$/n

PosUpRight=curPos*$w_0$/n $w_0$, $w_1$, and n refer to curPos.

The algorithm for the binary case states that when a 0 comes in, we move down and to the left $^{i.e.}$ from curPos to PosDownLeft, and, when a 1 comes in, we move down and to the right $^{i.e.}$ from curPos to PosDownRight and add the value of the element at a position up and to the right from the new curPos to the running sum $^{i.e.}$ we add PosUpRight to the running sum after curPos is updated which is the same as PosRight from the old curPos.

Now we want to develop a formula for m levels including PosDownJ which would be an expression for the value of the element at the position down and in the J direction which is the position moved to when a j comes in (0≦j<m). Also we need an expression for the value added to the running sum.

PosDownJ=curPos*(n+1)/($w_j$+1)

where n and $w_j$ refer to curPos
To check, let m, n=3, w[0]=1, w[1]=2 and w[2]=0, curPos=3=3!/1!2!0!
In general, curPos=n!/$w_0$!$w_1$! ... $w_j$! ... $w_{m-1}$!
Let a 2 come in. Then newcurPos=4!/1!2!1!=12
According to the formula, PosDown2=3*(3+1)/(0+1)=12
Remember that n and $w_j$ refer to the old position.
The value we add to the running sum (rs) is as follows:

$$rs = rs + \sum_{i=0}^{j-1} oldcurPos * w_i / (w_j + 1)$$

where j is the value of the incoming source level.
For example, for m=3:
If a 1 comes in, we add to rs:

curPos*[$w_0$/($w_1$+1)]

If a 2 comes in, we add to rs:

curPos*[($w_0$+$w_1$)/($w_2$+1)]

We need to compute rs in terms of the old position because otherwise we would have problems at the boundary resulting in computing incorrect values going one back from the boundary. All values used in the computation must be less than or equal to the maximum allowed value which is $2^s-1$. We know that if PosDownJ=curPos*(n+1)/($w_j$+1) is not over the boundary, then the computation of the increment to $$rs = \sum_{i=0}^{j-1} curPos * w_i / (w_j + 1)$$

will not be over the boundary either. In particular, if curPos*(n+1) is not over the boundary, then curPos*$w_i$ will not be over the boundary.

We have a check on the above formula from the following straightforward method of calculation:

$$rs = rs + \sum_{i=0}^{j-1} \frac{(n-1)!}{(w_0)!, \ldots, (w_i-1)!, \ldots, (w_{m-1})!}$$

For example:

Let m=4, n=10, $w_0$=2, $w_1$=3, $w_2$=4, $w_3$=1

$$curPos = \frac{10!}{2!3!4!1!} = 12{,}600$$

Let a 1 come in.

straightforward calculation:

$$\text{add to } rs - \frac{10!}{1!4!4!1!} = 6300$$

formula:

add to rs—12,600*[2/4]=6300

Let a 2 come in.

straightforward calculation:

$$\text{add to } rs - \frac{10!}{1!3!5!1!} + \frac{10!}{2!2!5!1!} = 5040 + 7560 = 12{,}600$$

formula:

add to rs—12,600*[(2+3)/5]=12,600

Let a 3 come in.

straightforward calculation:

$$\text{add to } rs - \frac{10!}{1!3!4!2!} + \frac{10!}{2!2!4!2!} + \frac{10!}{2!3!3!2!}$$
$$= 12{,}600 + 18{,}900 + 25{,}200$$
$$= 56{,}700$$

formula:

add to rs—12,600*[(2+3+4)/2]=56,700

Also recall that the three terms of straightforward calculation plus $$\frac{10!}{2!3!4!1!}$$

represent the sum of the four terms closest to and one step back from the current position and is equal to the current position.

The corresponding formulae that are useful at the decoder are:

PosUpJ=curPos*$w_j$/n $$rs = rs - \sum_{i=0}^{j-1} curPos * \left(\frac{w_i}{n}\right)$$

Reduction in Number of Starting Points

Sometimes it is desirable to restrict the space in Pascal's hypervolume within which the coding method is allowed to work. This simplifies the implementation and can increase the compression. One way to do this is to increase the value of the minimum allowable run length or decrease the value of the maximum allowable run length for which coding is possible. Below the minimum value of run length, an uncoded run would be sent, and above the maximum value of run length, the run would be forced to terminate.

Another type of restriction would be to restrict the ordering of the level weights. For instance, in certain applications it could be assumed that the largest number of source symbols would be 0s, the next largest, 1s etc. so that $w_0 \geq w_1 \geq \ldots \geq w_{m-1}$. For the binary algorithm, this would be equivalent to restricting the runs to the left half of Pascal's triangle.

Another simplification would be to restrict the coder to a value of m less than the number of levels of the source. For example, in some applications for a typical run the weight levels for large m might be very small or zero. We might choose a value of m for the coder that excluded the larger source levels which would be seldom encountered. However, the system could still operate in a lossless manner by terminating the coding of a source run when a symbol greater than the allowable value of m was encountered and then sending the next run uncoded.

DETAILED DESCRIPTION OF THE INVENTION

With reference to FIG. 1 which shows a general communication system, it can be seen that there is a source 20 which emits a sequence of symbols, $S_1, S_2, \ldots$. Each of these symbols may be one of m levels such as, without loss of generality, $0, 1, 2, \ldots, m-1$. These symbols then undergo a preprocessing procedure 22 which may, among other things, rearrange the order of the symbol stream, perform a reversible transformation on the symbol stream or perform an irreversible transformation on the symbol stream. The symbols then undergo a source coding procedure 24 which performs a transformation on the symbol stream which may or may not be reversible. The usual purpose of source coding is to compress the incoming symbol stream so that at the output of the source coding procedure the number of symbols on average is less than the number of symbols at the input. The compression ratio is the average number of symbols going into the source coding procedure divided by the average number coming out. If the transformation is reversible, it is referred to as lossless coding; otherwise, as lossy coding.

The symbols coming out of the source coding procedure then enter a source rate buffer 26 whose purpose is to maintain a steady rate of symbols emitted into the next stage. It endeavors to do this by making adjustments by means of a feedback channel 30 so that the buffer never becomes either completely empty (underflow) or completely full (overflow). The symbol stream is emitted from the source rate buffer into an error correcting coding stage 28 whose purpose is to enable correction for the effects of noise in the channel. The symbols are then sent across a channel or placed in storage 39. They then enter an error correcting decoding stage 38. After the error correcting decoding stage, the symbols undergo source decoding 36. They then undergo postprocessing 34 which attempts to reverse the effects of preprocessing. This may involve, among other things, rearranging the symbol sequence, reversing a reversible transformation or compensating for the effects of an irreversible transformation by means of smoothing, among other things. Finally, a symbol stream, $P_1, P_2, \ldots$, is emitted to the receiver 32. The symbol stream, $P_1, P_2, \ldots$, may or may not be identical to the symbol stream, $S_1, S_2, \ldots$. If it is identical (assuming no errors due to noise in the channel), lossless source coding has taken place. Otherwise, lossy coding has taken place.

Figure 2:
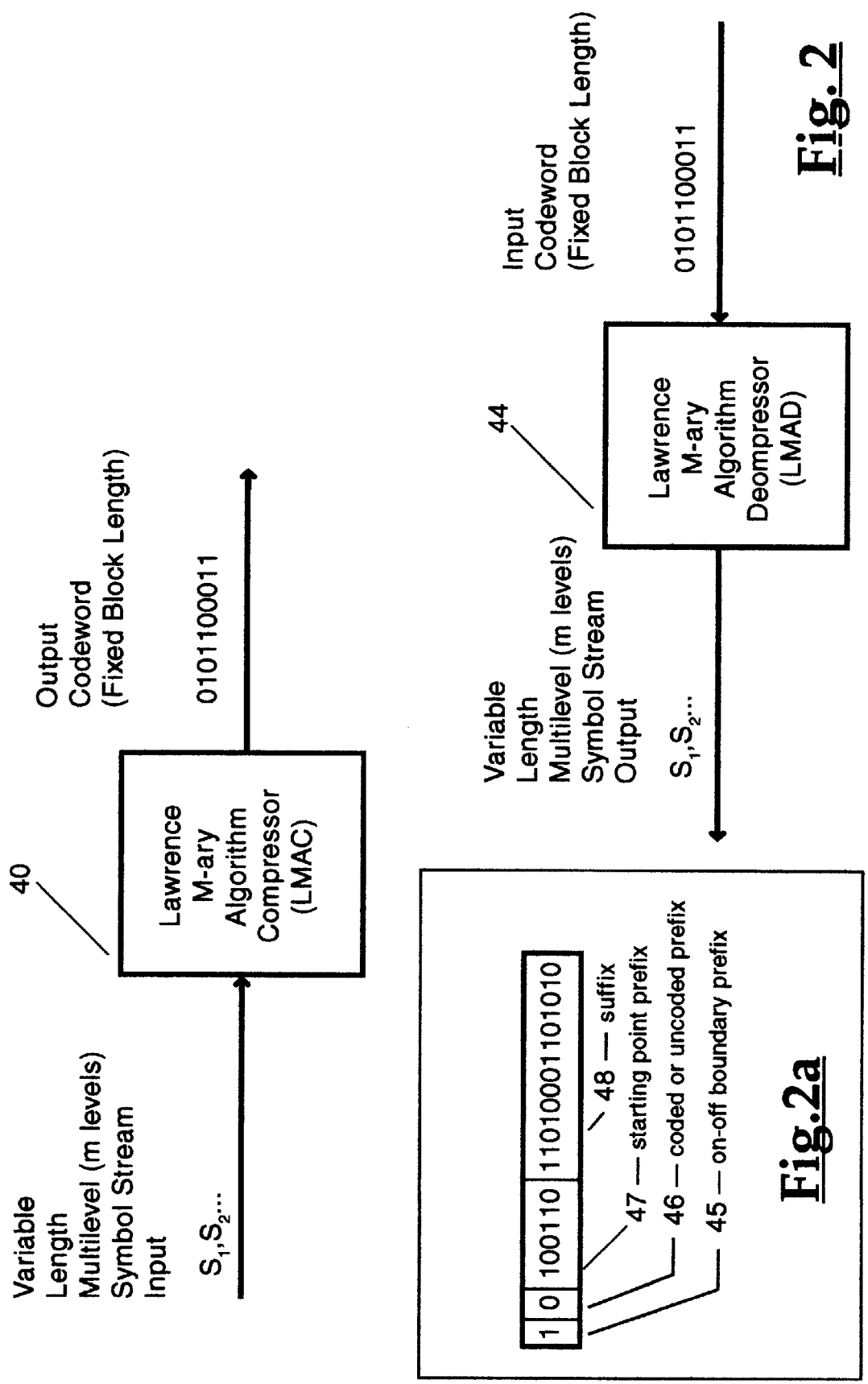
FIG. 2 shows a diagram of the Lawrence M-ary Algorithm Coder (LMAC) and the Lawrence M-ary Algorithm Decoder (LMAD).

The technique described herein focuses on, but is not limited to, a source coding and decoding method and apparatus as shown in FIG. 2. The Lawrence M-ary Algorithm Compressor (LMAC) 40 accepts an incoming source symbol sequence in which each symbol may be one of m levels. The LMAC is based on the binary Lawrence algorithm of U.S. Pat. No. 4,075,622 and as presented in Lawrence, J. C., *A New Universal Coding Scheme for the Binary Memoryless Source*, IEEE Transactions on Information Theory (1977), vol. IT-23, no. 4. pp. 466–472. The binary Lawrence algorithm accepts only two levels. The name "Lawrence algorithm" has been used in Tjalkens et. al., *A Universal Variable-to-Fixed Length Source Code Based on Lawrence's Algorithm*, IEEE Transactions on Information Theory (March 1992), vol. 38, no. 2. among other references.

The LMAC 40 is a variable-to-block method which means that it accepts a variable length input source sequence and outputs a fixed length coded sequence or block. The output sequence can be in either binary or m-ary form. Those who are skilled in the art will recognize that these are easily convertible from one to the other. The Lawrence M-ary Algorithm Decompressor (LMAD) 44 performs the reverse process accepting a symbol stream which represents the output of the LMAC and converting it into the original source symbol sequence. The Lawrence m-ary algorithm is a lossless method which means that the original sequence that is the input to the coder 40 is recovered exactly as the output from the decoder 44.

The typical codeword shown in FIG. 2a has a fixed block length and consists of a suffix 48 of length s and various prefixes which may include, among others, a starting point prefix 47, a coded or uncoded prefix 46 and an on/off boundary prefix 45. Other embodiments may contain either more or less prefixes than shown in FIG. 2a or no prefixes at all. The length of the codeword is equal to the length of the suffix, s, plus the lengths of the various prefixes in any given embodiment.

Figure 3:
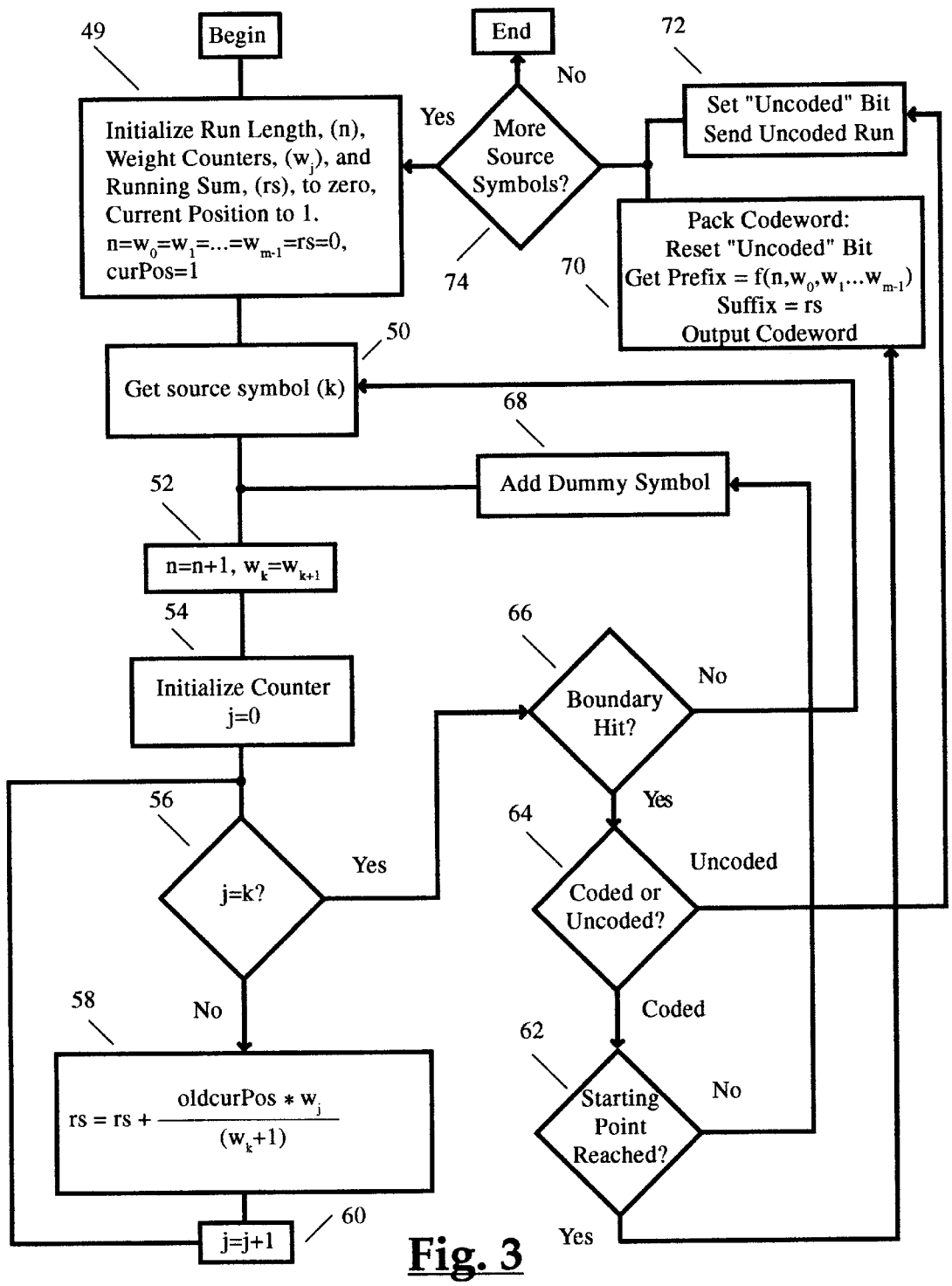
FIG. 3 shows a block diagram of an embodiment of the LMAC in which the codeword is constructed as the encoding process proceeds.

FIG. 3 shows the block diagram for an embodiment of the LMAC. Coding begins in block 49 where the run length, n, the level weight counters, $w_j$, and the running sum, rs, are initialized to 0. The Current position, curPos, is initialized to 1. The run length measures the length of the run of source symbols that will be encoded in one codeword. The level weight counter, $w_j$, measures the number or weight of the source symbol j ($0 \leq j \leq m-1$) contained in the input run. The running sum is computed as the processing proceeds, and, when the input run is terminated, becomes the suffix of the output codeword. The current position is the location in Pascal's hypervolume to which the random walk has reached. This initialization corresponds to starting at the apex of Pascal's hypervolume. As the source symbols come in, the current position moves downwards one level at a time and in the $k^{th}$ direction if the incoming source symbol is a k until the boundary is hit at which time the run terminates.

Block 50 shows that the next source symbol is taken into the LMAC. For purposes of demonstration, it is assumed to be a k. Block 52 shows that the run length and the $w_k$ counters are incremented. In block 54 the j counter is set to zero. The j counter will count over all the symbol values ($0 \leq j \leq m-1$). In block 56 a decision is made as to whether or not j equals k. If not, we update the running sum in block 58 by adding to it the value of the element in Pascal's hypervolume one level upward and in the $j^{th}$ direction which is $$\frac{oldcurPos \times w_j}{w_k + 1}.$$

oldcurPos represents the position in Pascal's hypervolume that we have just moved from rather than the current position, curPos. The computation is made with oldcurPos instead of curPos in case curPos is over the boundary (which will be checked later) in which case it would not fit in an s bit register. All the elements of Pascal's hypervolume that we deal with can be expressed in s bits. We then increment j in block 60 and go back to block 56.

If j=k in block 56, we exit the loop since we are finished updating the running sum for the current source symbol and go to block 66 in which we ask the question of whether or not the boundary has been hit. The boundary has been hit if the value of the next position in Pascal's hypervolume for any incoming source symbol would require more than s bits to express. If the boundary has not been hit, we go back to block 50 and accept the next incoming source symbol. If the boundary has been hit, we go to block 64 and ask if the run should be coded or uncoded. The run will be coded if the run length is sufficiently long that, when the corresponding symbol sequence is expressed in bits, the number of bits exceeds the length of the codeword also expressed in bits. Otherwise, the source symbol run will be sent uncoded in order to prevent an expansion rather than a compression. In this case, we go to block 72, set the Uncoded bit prefix and send an uncoded run.

If the run is coded, we go to block 62 where we ask the question whether or not a maximum entropy point (mep) has been reached. If not, we go to block 68 and add a dummy symbol to the source sequence. The purpose of the dummy symbols is to steer or migrate the incoming source symbol sequence to a maximum entropy point in Pascal's hypervolume. At a mep, any incoming symbol would cause a boundary crossing whereas at a boundary point that is not a mep, at least one incoming symbol will cause the boundary to be crossed. In the preferred embodiment, the starting points are the maximum entropy points. However, in other embodiments they could be every boundary point or some subset of boundary points.

If a maximum entropy point has been reached, we go to block 70 where we pack the codeword. We reset the Uncoded bit to indicate a coded run, pack the suffix, pack the starting point prefix which indicates on which mep the run terminated and output the codeword. The starting point prefix is simply the rank of that particular mep in the lexicographical ordering list of all meps. FIG. 29 shows a lexicographical ordering of all meps. From the binary case, we know that there is approximately one mep for each element on the s row of Pascal's triangle. With reference to FIG. 25 it can be seen that, for a suffix length of 32 bits, there are 34 meps. This is because for the left hand side of Pascal's triangle, there must be one for every value of w (0<w<17)

and similar reasoning holds for the right hand side because of symmetry. Generalization of the binary case leads to the lexicographical ordering of FIG. 29. The set of possible symbol weight profiles are listed in order 700. The lexicographical ordering for each symbol weight profile is shown 702. The total number of symbol weight profiles is $$\frac{(s+m-2)!}{s!(m-2)!}.$$

After the codeword has been packed and output or an uncoded block has been output, we go to block 74 in FIG. 3 where we ask if there are any more source symbols. If not, the procedure terminates. If so, we go to block 49 and start a new source symbol run.

Figure 4:
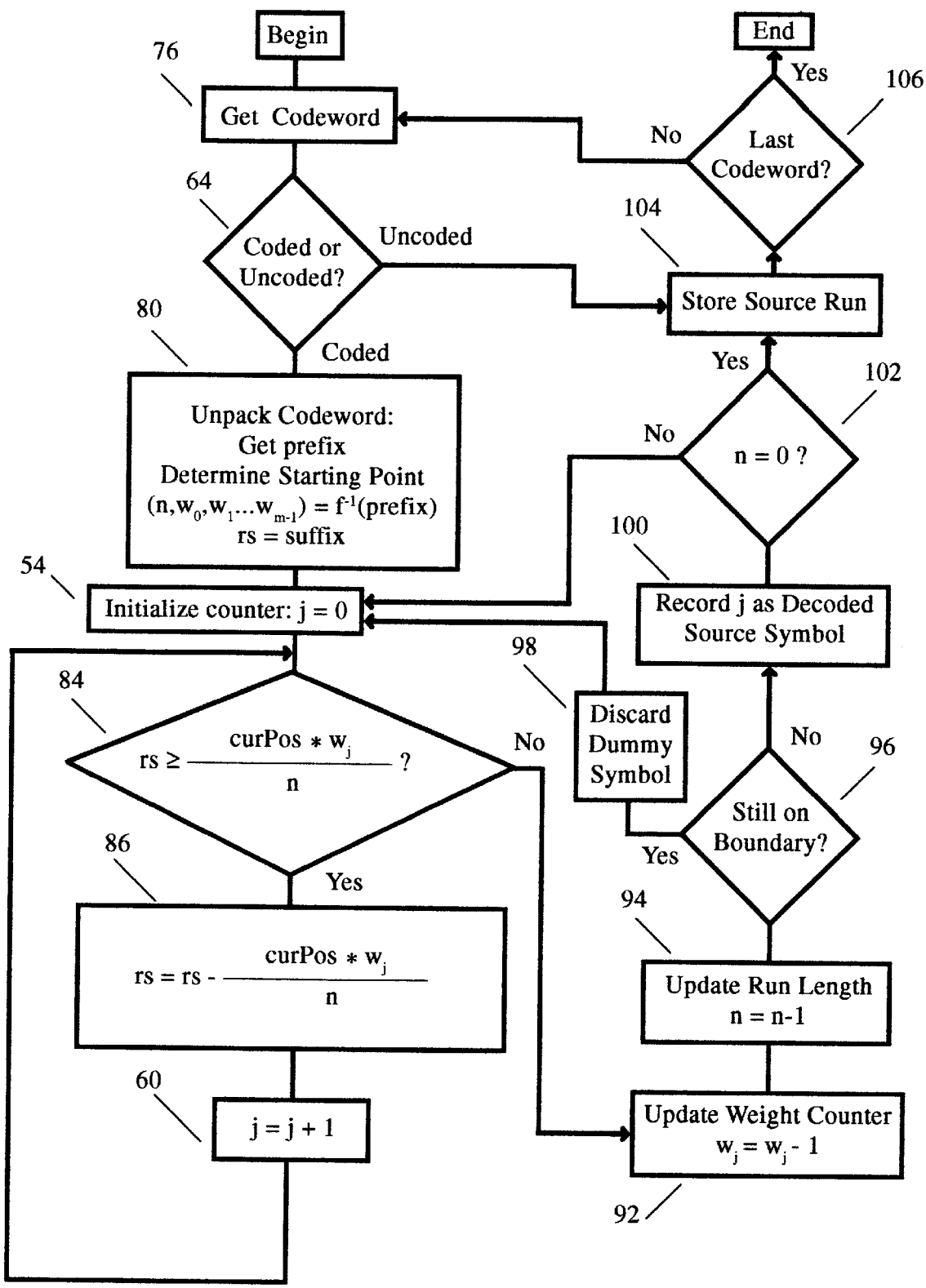
FIG. 4 shows a block diagram of an embodiment of the LMAD in which the original source sequence is constructed as the decoding proceeds.

FIG. 4 shows a block diagram for the LMAD. Decoding begins in block 76 where the incoming codeword is examined. A decision is made as to whether it is coded or uncoded in block 64. If it is uncoded, the source symbol run is stored in block 104 and, if there are more codewords which we find out in block 106, we return to block 76. If the codeword represents a coded source symbol sequence, we go to block 80 and unpack the codeword. From the starting point prefix, we determine the starting point, and from the suffix we determine the running sum. First in block 54 the level counter, j, is set equal to 0. We then enter the loop which starts the random walk in Pascal's hypervolume beginning at the appropriate mep and working our way back toward the apex. In block 84 we look upward in the $j^{th}$ direction and ask if the value of the Pascal's hypervolume element at that location is less than or equal to the value of the running sum. If it is, we subtract it from the running sum in block 86. Then we increment j in block 60 and return to block 84.

If it is not, we decrement the $j^{th}$ weight counter in block 92, decrement the run length in block 94 and ask the question, "Are we still on the boundary?", in block 96. If so, this means that the symbol just decoded is a dummy which we discard in block 98 and return to block 54. If not, we record the source symbol j in block 100 and ask the question whether or not the run length is equal to zero in block 102. If it is, the source symbol sequence is stored in block 104. Then we ask if the codeword just decoded represents the last codeword in block 106. If yes we end the decoding; if no, we return to block 76.

Figure 5:
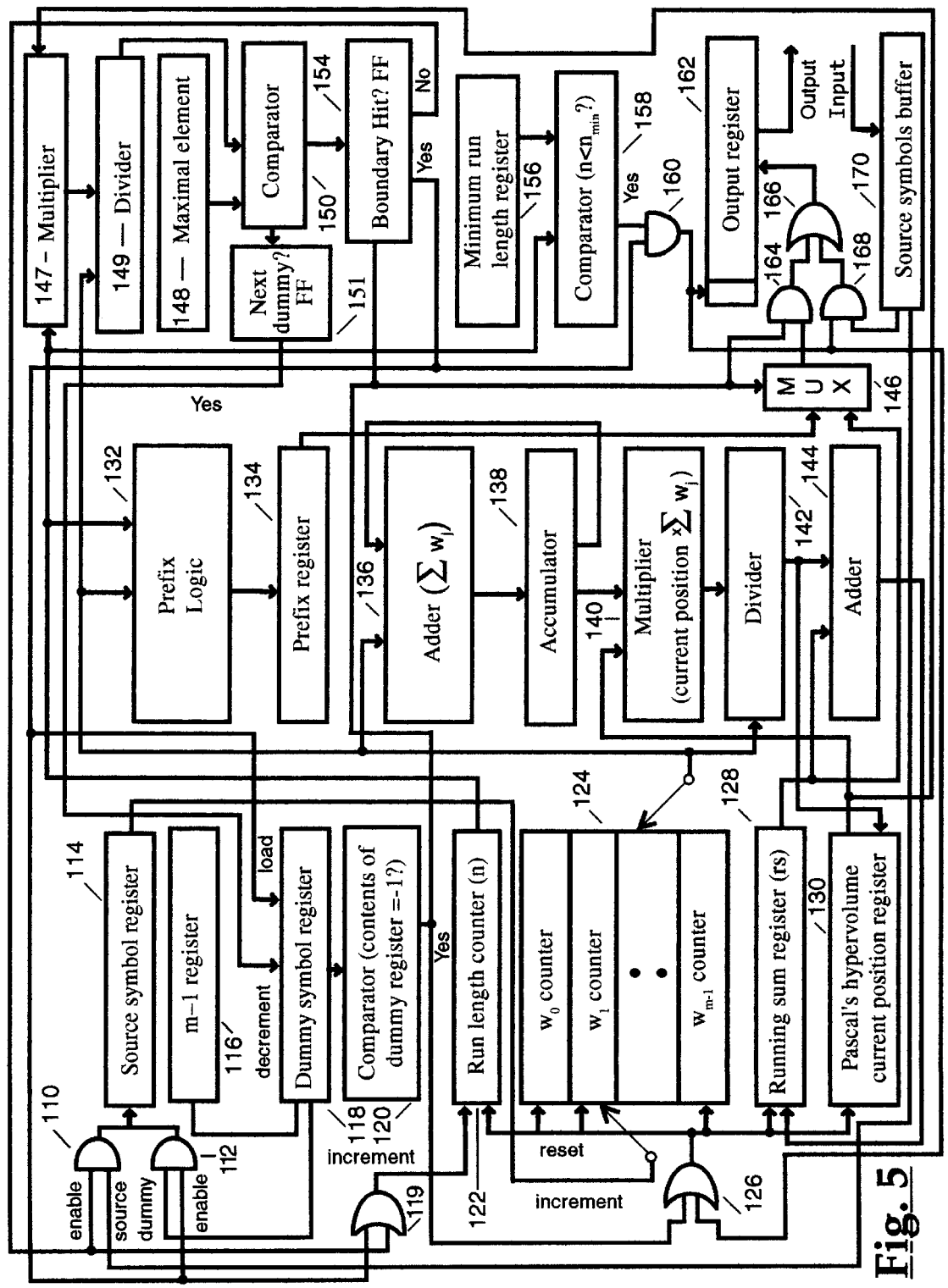
FIG. 5 shows a hardware diagram of an embodiment of the LMAC in which the codeword is constructed as the encoding proceeds.

FIG. 5 shows a hardware version of the Lawrence M-ary Algorithm Coder (LMAC). Initially, a Run length counter 122, Weight counters 124, and a Running sum register 128 are reset to zero and a Pascal's hypervolume current position register 130 is set to one. Either a source symbol or a dummy symbol enters the Source symbols register 114. The source symbol is enabled by an AND gate 110, and the dummy symbol is enabled by an AND gate 112. If the incoming source symbol is a j, ($0 \leq j \leq m-1$), the corresponding weight counter, $w_j$, in the bank of weight counters 124 is incremented. Both the source and dummy symbol enables pass through the OR gate 119 and increment the Run length counter 122. The weights of the appropriate source symbols are added together in an Adder 136 and accumulated in an Accumulator 138. The accumulated sum is then multiplied in a Multiplier 140 by the Pascal's hypervolume current position from Register 130 and the result divided in a Divider 142 by $w_j+1$ from Weight counter bank 124. This result is then added in an Adder 144 to the contents of the Running sum register 128 and deposited back in register 128.

Now we must determine if the boundary has been hit. We do this by measuring the value of the Pascal's hypervolume element one level down and in every possible direction (PosDownJ) to see if any one of them is greater than $2^s-1$ which is the maximal element. If one or more elements exceeds this value we have hit the boundary. We compute PosDownJ by multiplying the current position from register 130 by the contents of register 122 plus 1 in a Multiplier 147 and then divide this result by $w_j+1$ from the appropriate weight counter 124 in Divider 149. This represents the largest value of any neighbor down one level. This result is compared with the maximal element stored in register 148 in Comparator 150. The Boundary Hit? flip-flop 154 is then set if the boundary has been reached. When flip-flop 154 is set, the value of m−1 is loaded into the Dummy symbol register 118 from the m−1 Register 116. Flip-flop 154 also enables Dummy symbols to be loaded into the Source symbols register 114 via AND gate 112. The Next dummy? flip-flop 151 determines when the current dummy symbol has reached its maximum, and, when it has, decrements the Dummy symbol register 118.

A comparator 158 compares the run length at the point that the boundary is hit with the minimum run length necessary for a coded run found in register 156, and, if the run length is too short for a coded run and the boundary has been reached, sets the Coded/uncoded prefix in the Output register 162 to 1 via AND gate 160 to indicate an uncoded output block. It also enables source symbols from the Source symbols buffer 170 to flow directly into the Output register 162 via AND gate 168 and OR gate 166, and resets the Run length counter 122, the Weight counters 124, the Running sum register 128 and sets the Pascal's hypervolume current position register 130 to 1 via OR gate 126.

A coded run is indicated when the contents of the Dummy symbol register 118 reaches −1 as determined by Comparator 120. Then the multiplexer 146 is enabled which allows the contents of the Prefix register 134 to flow into the appropriate positions in the Output register 162 as well as allowing the contents of the Running sum register 128 which represents the codeword suffix to flow into Output register 162 via AND gate 164 and OR gate 166. Prefix logic 132 using Run length 122 and Weight 124 counters determines the contents of Prefix register 134. Comparator 120 also enables the resetting and initializing of the Run length 122 and Weight counters 124 and Running sum 128 and Pascal's hypervolume current position registers 130 via OR gate 126. Comparator 120 also resets the Boundary Hit? flip-flop 154 enabling source symbols to flow into the Source symbols register 170 while disabling the flow of Dummy symbols.

It can be seen by those skilled in the art that both hardware and software versions of this embodiment of the invention allow the values of m, the number of source levels and s, the suffix length, and hence the codeword block length to be varied by means of the (m−1) register 116 and the maximal element register 148. When the number of levels is reduced, the prefix logic 132 still gives valid results for the prefix since only the upper portion of the lexicographical ordering of maximum entropy points as shown in FIG. 29 will be used.

Figure 6:
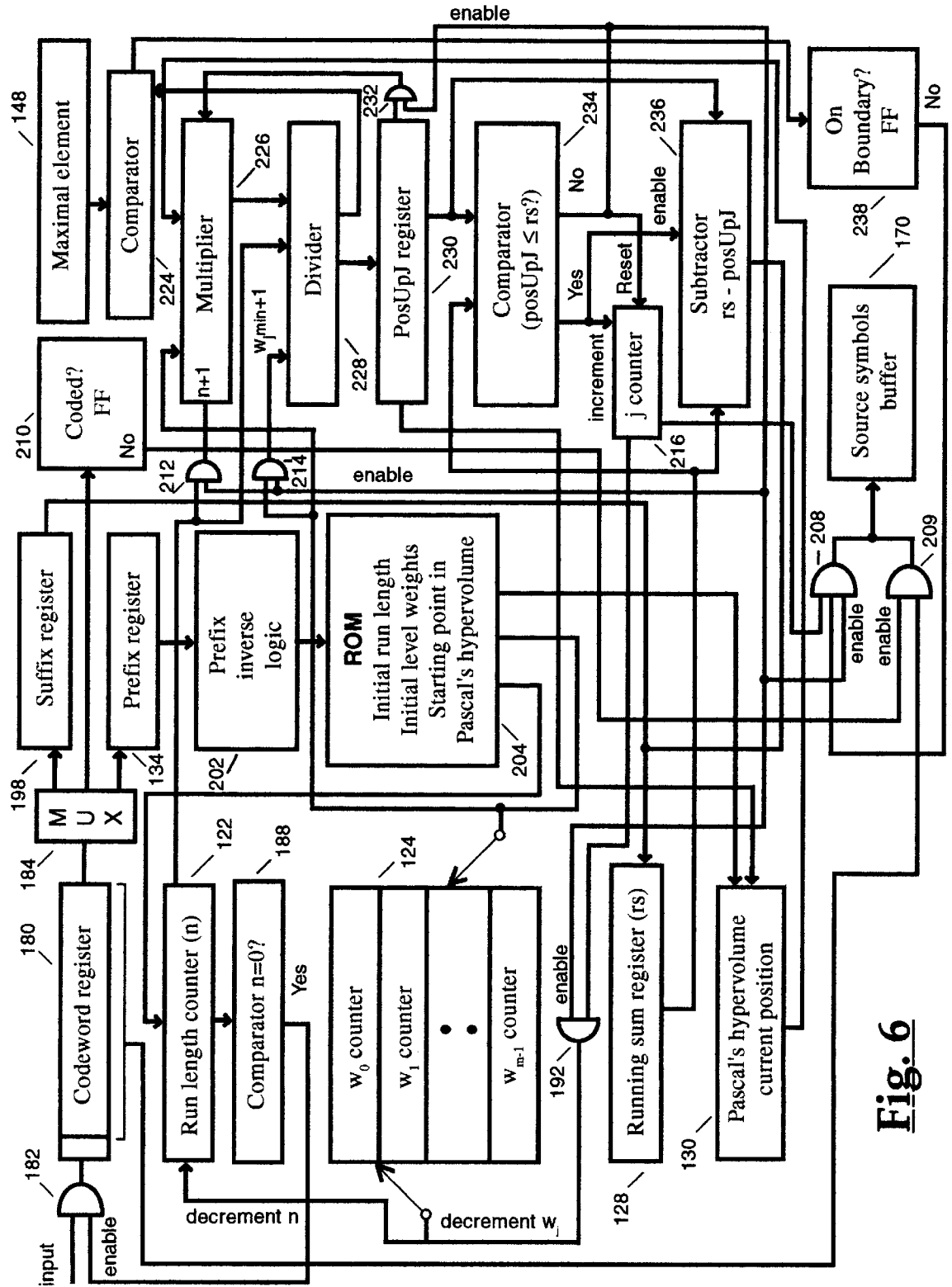
FIG. 6 shows a hardware diagram of an embodiment of the LMAD in which the original source sequence is constructed as the decoding proceeds.

FIG. 6 shows a hardware version of the Lawrence M-ary Algorithm Decoder (LMAD). The codeword enters a Codeword register 180 via AND gate 182 and then passes through Multiplexer 184 by means of which the suffix is routed to the Suffix register 198, the starting point prefix is routed to the Prefix register 134 and the coded/uncoded prefix is routed to the Coded? flip-flop 210. If the codeword is uncoded, it is routed directly from Codeword register 180 by means of an enabling signal from Coded? flip-flop 210 through AND gate 209 to the Source symbols buffer 170.

The prefix from Prefix register 134 flows through a Prefix inverse logic circuit 202 which determines a ROM address for ROM 204. ROM 204 contains the initial run length (n), the initial level weights, ($w_j$) and the initial value of the starting point which is a maximum entropy point in Pascal's hypervolume. From ROM 204 the Run length counter 122, the weight level counters 124, and the Pascal's hypervolume current position register 130 are initially filled. The suffix flows from suffix register 198 into the Running sum register 128.

By means of Multiplier 226 the contents of Current position register 130 are multiplied by the contents of weight counters 124, $w_j$, ($0 \leq j \leq m-1$). By means of Divider 228 this result is then divided by the contents of Run length counter 122 to obtain PosUpJ, the value of the element one level up in the $j^{th}$ direction in Pascal's hypervolume. This result is stored in the PosUpJ register 230. PosUpJ is then compared with the running sum from Running sum register 128 in a comparator 234. If PosUpJ is less than or equal to rs, Subtractor 236 is enabled, PosUpJ is subtracted from rs and rs is stored back in Running sum register 128. Also a j counter 216 which counts the level value is incremented.

If PosUpJ is not less than or equal to rs and we are not on the boundary as determined by the On Boundary? flip-flop 238, AND gate 208 is enabled which allows the contents of j counter 216 to flow into the Source symbols buffer 170, and a j has been decoded as the source symbol. If we are still on the boundary, we have just decoded a dummy symbol and this will not be allowed to flow into Source symbols buffer 170. Also via AND gate 192 the $w_j$ and run length counters are decremented. Then j counter 216 is reset to zero. The contents of PosUpJ register 230 are stored in the Pascal's hypervolume current position register 130.

The next step is to check and see if we are still on the boundary. If so, the symbol just decoded is a dummy and can be thrown away. If not, we have just decoded a valid source symbol. We are still on the boundary if going one step down from the current position in Pascal's hypervolume in any direction puts us over the boundary. Since $$PosDownJ = \frac{curPos * (n+1)}{(w_j + 1)}$$

we need only check PosDownJ for the minimum value of $w_j$. If this value is less than or equal to the maximal element which is $2^s-1$, then we are not on the boundary and the symbol just decoded was a valid symbol and not a dummy. Accordingly, the contents of the PosUpJ register 230 are enabled via AND gate 232 to flow into Multiplier 226 and are multiplied by the contents of the Run length counter 122 enabled via AND gate 212. This result is then divided in Divider 228 by the minimum value of $w_j+1$ which comes in via AND gate 214. This result is then compared with the maximal element stored in register 148 in Comparator 224 and the On Boundary? flip-flop 238 is either set or reset accordingly. If On Boundary? flip-flop 238 is reset, then source symbol j is enabled to flow into the Source symbols buffer 170 via AND gate 208. If it is set, the symbol just decoded is a dummy and is not allowed to flow into Source symbols buffer 170.

Finally, we check the run length, n, via Comparator 188. If the run length is 0, decoding has been completed for the current codeword, and a new codeword is enabled via AND gate 182. If n is not equal to 0, decoding continues with the current codeword by repeating the above process.

In another embodiment, instead of the prefix indicating maximum entropy points, we let it indicate any boundary point. This results in a larger prefix and hence a larger codeword and hence smaller compression, but results in a quicker implementation since there is no computation with respect to dummy symbols involved.

Figure 30:
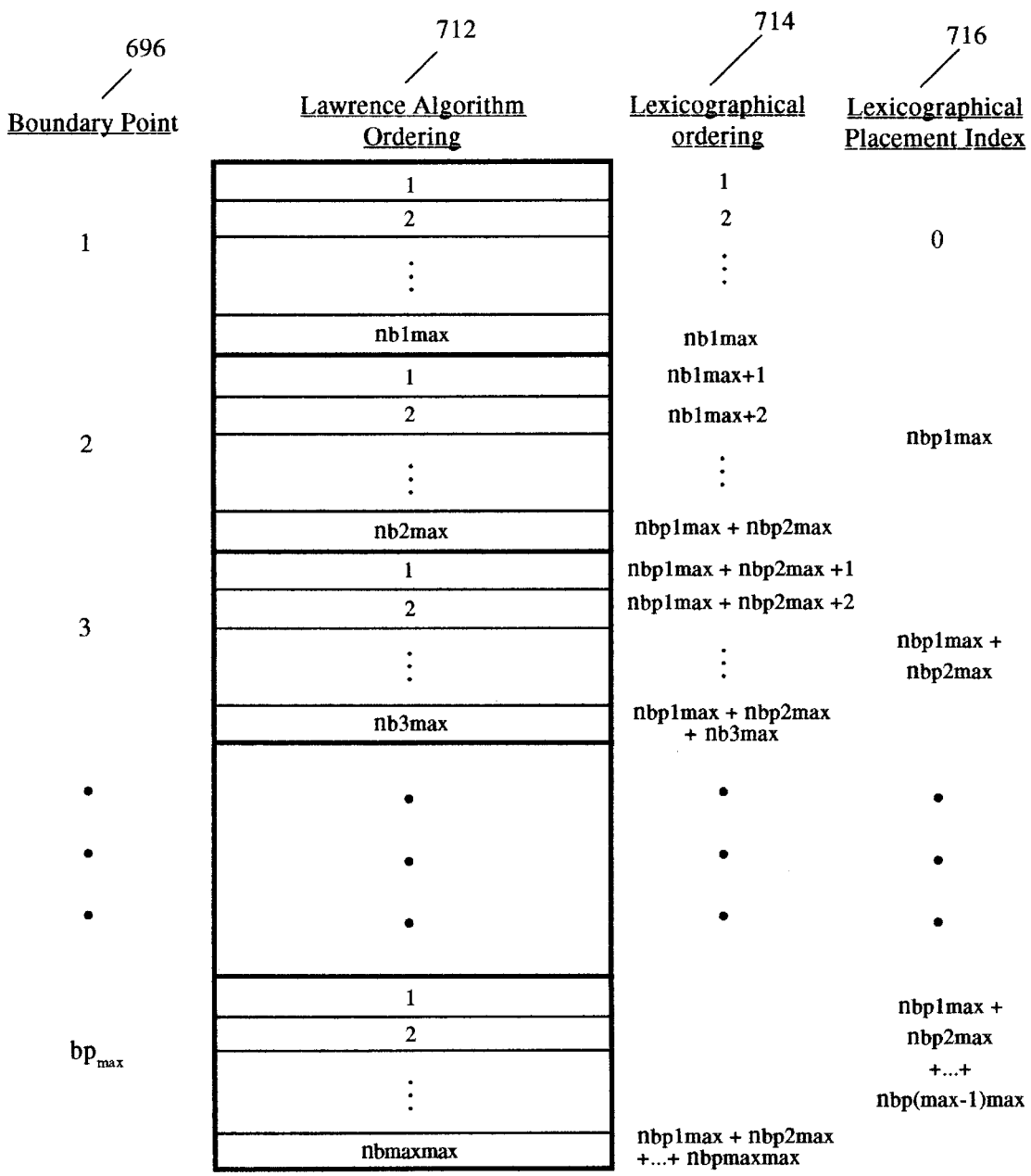
FIG. 30 shows an illustration of the lexicographical placement index as used when every boundary point can be a starting point in conjunction with the LMAC and LMAD.

An even quicker embodiment involves doing away with the starting point prefix altogether and letting the suffix be a lexicographical ordering of all possible input sequences. Since the Lawrence m-ary algorithm results in a lexicographical ordering for any given boundary point, it is only necessary to add to this value a value which represents the total number of sequences which have been coded by lexicographically smaller boundary points. In other words, if we order the boundary points in some way, those sequences which terminate on the first boundary point are ordered by the Lawrence m-ary algorithm. Take the total number of such sequences and add this to the lexicographical ordering produced by the Lawrence m-ary algorithm for the second boundary point. Then take the total number of sequences corresponding to the first two boundary points and add this to the lexicographical ordering produced by the Lawrence m-ary algorithm for the third boundary point etc. FIG. 30 illustrates this procedure. Corresponding to each boundary point 696 is a set of Lawrence algorithm orderings 712. For the first boundary point, the Lawrence algorithm lexicographically orders the source symbol sequences from 1 to $n_{bp1max}$. Then $n_{bp1max}$ is added to the Lawrence algorithm ordering for the second boundary point to get the lexicographical ordering for source symbol sequences terminating on the second boundary point etc. Corresponding to the set of Lawrence algorithm orderings 712 are the lexicographical orderings 714. The lexicographical ordering orders each possible source sequence in order from first to last. The lexicographic placement index (lpi) is that value which must be added to the Lawrence algorithm ordering to get the lexicographic ordering. Each lexicographical placement index 716 corresponds to a boundary point 696.

Figure 7:
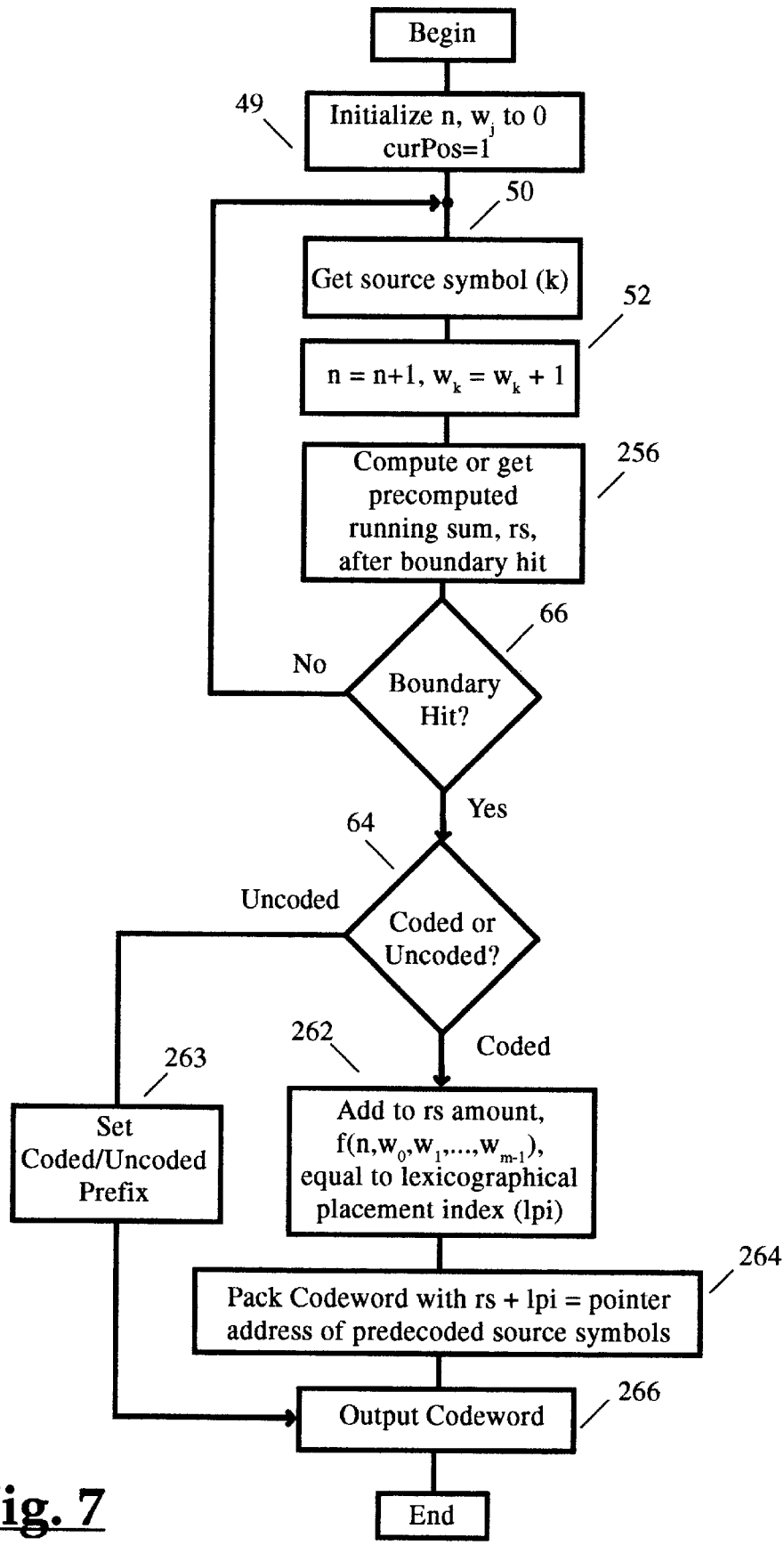
FIG. 7 shows a block diagram of an embodiment of the LMAC in which the codewords are either computed as the encoding process proceeds or precomputed and read out of memory and to which are added a lexicographical placement index which identifies the location in the decoder's memory of a pointer to the source sequence associated with each boundary point.

FIG. 7 illustrates a block diagram of the coding process for this embodiment. In initialization block 49 run length, n, and weight counters, $w_j$, are initialized to 0. Current position is initialized to 1. Source symbol k is input in block 50. n and $w_j$ are incremented in block 52. In block 256, the running sum is either computed or retrieved as a precomputed quantity from storage after the boundary is hit. Block 66 queries if the boundary has been hit. If no, we go back to block 50. If yes, block 64 queries whether the run should be coded or sent uncoded. If uncoded, the Code/uncoded prefix is set in block 263 and the block is output in block 266. If coded, the lexicographical placement index is added to the running sum in block 262. Then the codeword is packed in block 264 and output in block 266.

Figure 8:
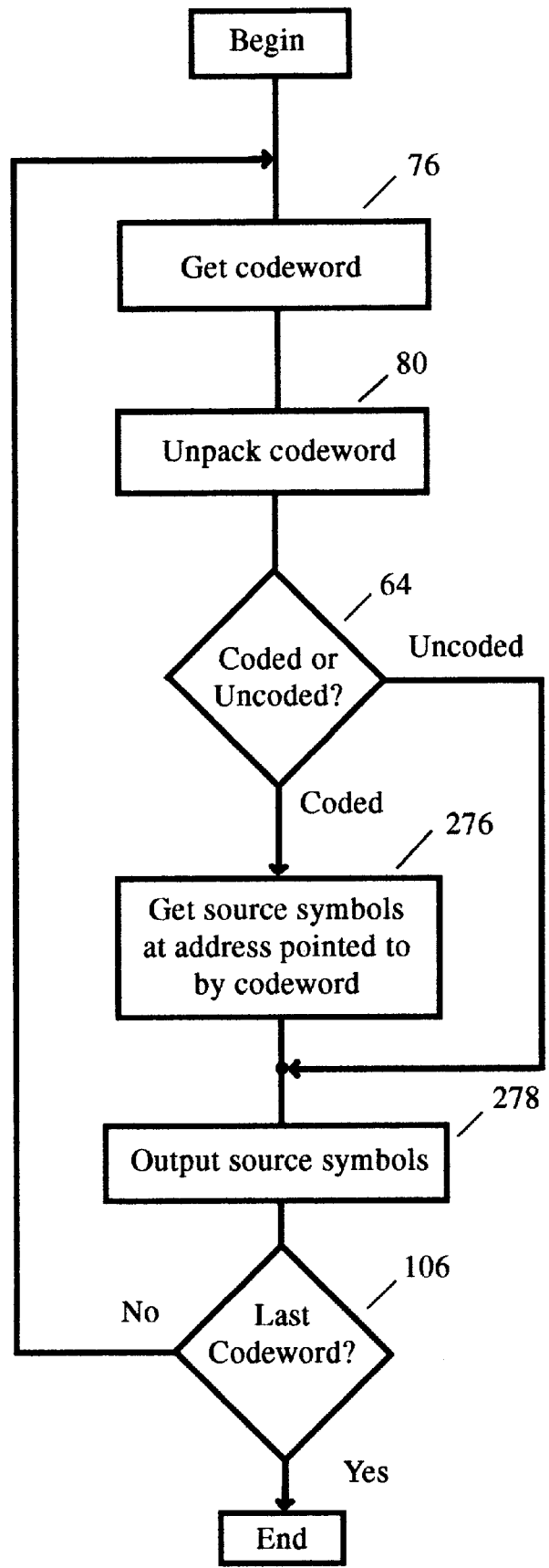
FIG. 8 shows a block diagram of an embodiment of the LMAD in which the codeword represents the address of a pointer to the location of the original source sequence.

FIG. 8 illustrates a block diagram of the decoding process of this embodiment. The codeword comes into the decoder in block 76 and is unpacked in block 80. In block 64 it is determined if the block is coded or uncoded. If it is uncoded, the source symbols are output in block 278. If it is coded, the codeword itself represents the address of the precomputed and stored source symbols. In block 276 the source symbol sequence is retrieved from a ROM and output in block 278. In block 106 we determine if the present codeword is the last codeword. If more codewords remain, we return to block 76.

Figure 9:
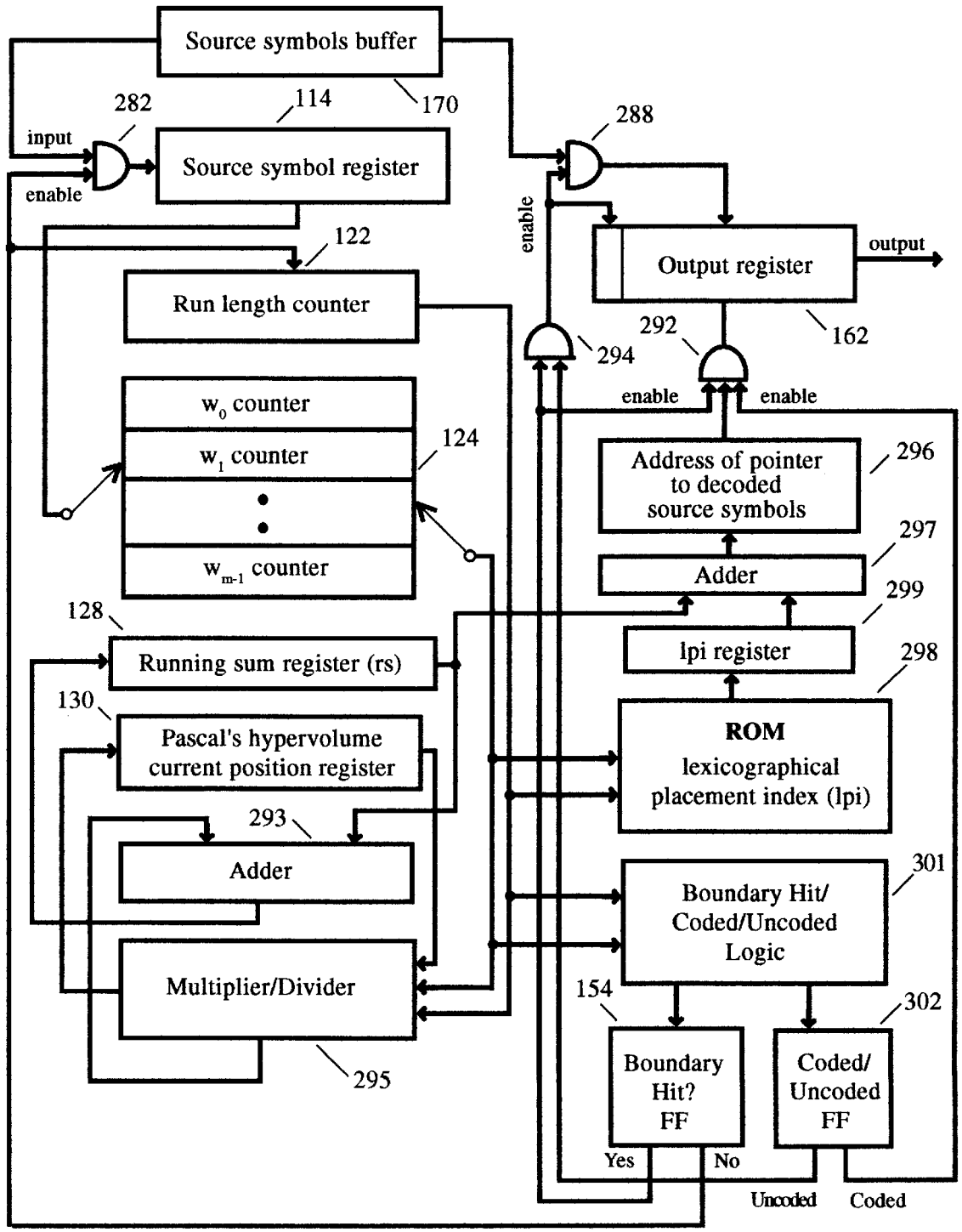
FIG. 9 shows a hardware diagram of an embodiment of the LMAC in which the running sum is computed as the processing proceeds and the lexicographical placement index is precomputed, stored in memory and added to the running sum.

FIG. 9 illustrates a hardware version of the LMAC for this embodiment in which the codewords are computed in real time. The source symbols enter a Source symbol register 114 via AND gate 282. A Run length counter 122 is incremented as is the appropriate weight counter, $w_j$, 124. A Running sum register 128 contains the running sum and is initially 0. A Pascal's hypervolume current position register 130 stores the value of the Current position in Pascal's hypervolume and is initially set to 1. A Multiplier/Divider 295 multiplies the contents of Current position register 130 by the sum of the contents of the first j–1 weight counters 124 where j is the value of the incoming source symbol. This result is then divided by $w_j+1$ in Multiplier/Divider 295, added to the contents of Running sum register 128 in Adder 293 and stored in Running sum register 128.

A Boundary Hit?/Coded/Uncoded logic circuit 301 uses the values of the run length, n, and weight counters, $w_j$, to determine if the boundary has been hit and, if so, whether or not the output block will be coded or uncoded and sets or resets Boundary Hit? FF 154 and Coded/uncoded? FF 302 accordingly. If the boundary has been hit, the values of n and $w_j$ are used to determine the address in a ROM 298 at which the lexicological placement index (lpi) is stored. This value is then placed in a lpi register 299 and added in an Adder 297 to the final value of the running sum. This value which represents the pointer to the address of the decoded source symbols is then deposited in a register 296.

If the boundary has been hit and the run is uncoded, an enabling signal is sent through AND gate 294 and the source symbols are loaded from a Source symbols buffer 170 into an Output register 162 via AND gate 288. Also the Uncoded bit is set in Output register 162. If the boundary has been hit and the run is coded, the contents of Pointer address register 296 are loaded into Output register 162 via AND gate 292. Finally, if the boundary has not been hit, another source symbol is loaded into Source symbol register 114 and the encoding process proceeds by repeating the above steps.

Figure 10:
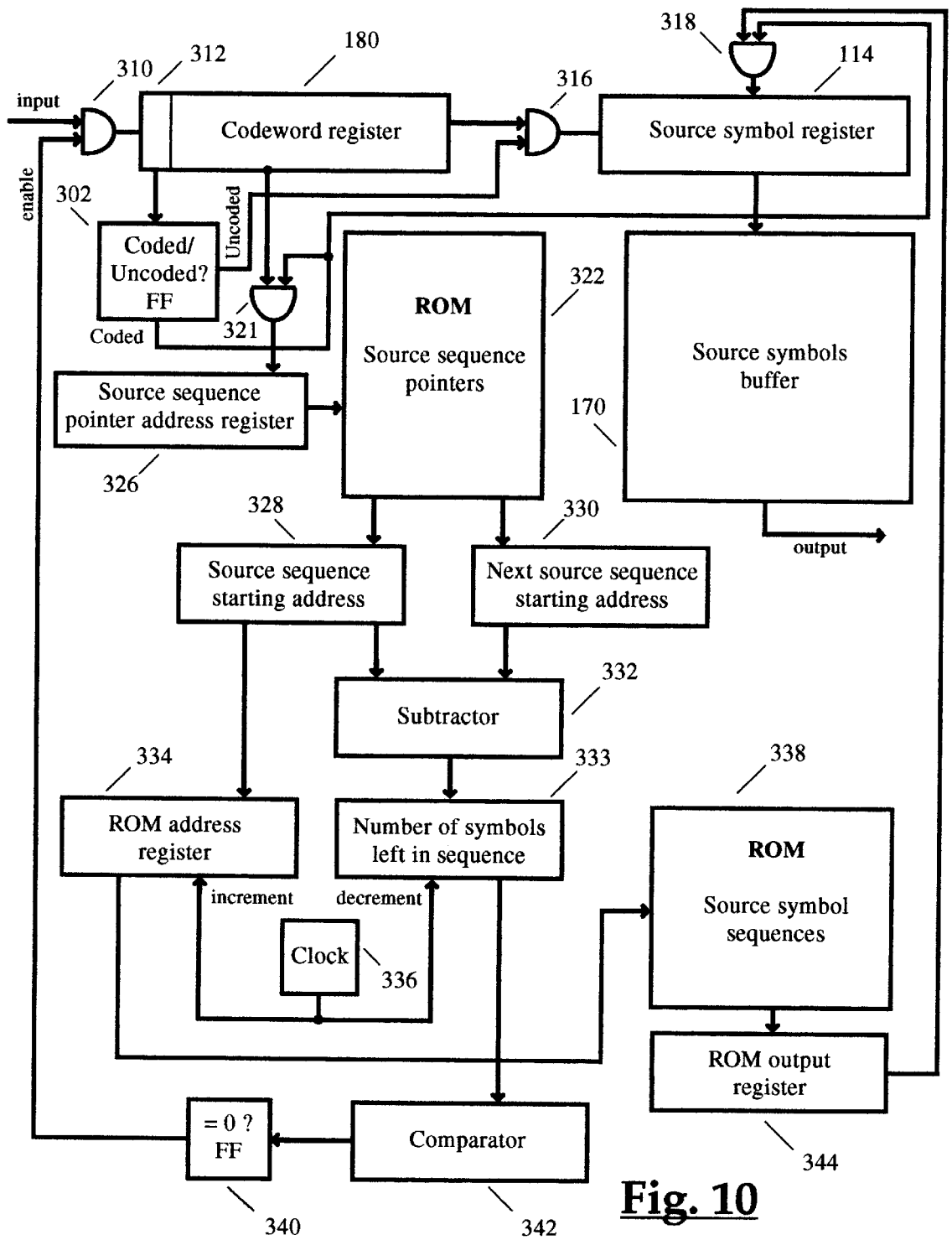
FIG. 10 shows a hardware diagram of an embodiment of the LMAD in which the codeword represents the address of a pointer which points to the location of the precomputed decoded source symbol sequence.

The hardware version of the LMAD for this embodiment is illustrated in FIG. 10. The input block enters a Codeword register 180 via AND gate 310. The first bit 312 goes into a Coded/uncoded flip-flop 302. If bit 312 is a "one," flip-flop 302 is set to Uncoded. Otherwise, it is set to Coded. If the block is uncoded, the contents of Codeword register 180 flow one symbol at a time into a Source symbol register 114 via AND gate 316, and from there into a Source symbols buffer 170. If the input block is coded, the contents of Codeword register 180 flow into a Source sequence pointer address register 326 via AND gate 321. This register accesses a pointer in a ROM 322 which outputs a source sequence starting address to a register 328. The pointer address plus one gives the starting address of the next source sequence which flows into register 330. A pointer is simply an address and the codeword represents basically the address of an address. By accessing two consecutive pointers, we can determine the length of the symbol sequence assuming they are stored sequentially in the ROM. A Subtractor 332 subtracts the contents of register 328 from the contents of register 330 and deposits the result in a Number of symbols left in sequence register 333. The source sequence starting address also flows from register 328 into a ROM address register 334. ROM address register 334 accesses the source symbols one at a time in a source symbol sequences ROM 338. The symbols flow into a ROM output register 344 and from there to the Source symbol register 114 via AND gate 318 and from there into the Source symbols buffer 170. A clock 336 decrements the Number of symbols left in source sequence register 333 and increments the ROM address register 334. When the number of symbols left in the source sequence equals zero, this is detected by a Comparator 342 which sets a "=0?" flip-flop 340. Flip-flop 340 then enables the input of another block into the Codeword register 180 via AND gate 310.

In the preferred embodiment for the LMAC, the running sums are all precomputed as are the dummy sums which are added to the appropriate running sums to obtain the codeword suffix. The starting point prefix represents an index to the associated mep. At the decoder, a lexicographical placement index associated with each mep is added to the suffix to get an overall index which represents an address of a pointer to the precomputed source symbol sequences.

Figure 28:
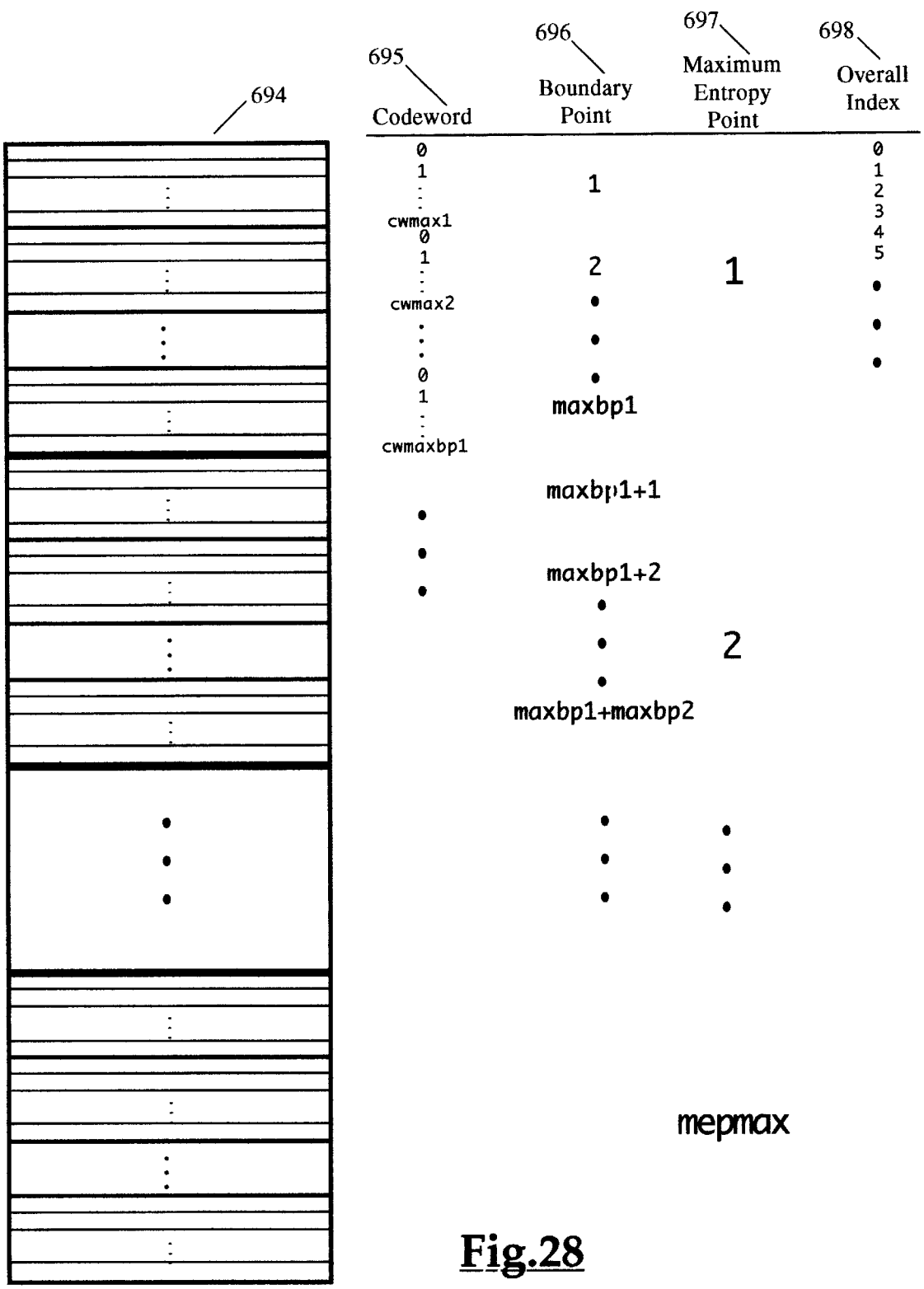
FIG. 28 shows a diagram of the lexicographical ordering of codewords in memory used with the LMAC and LMAD.

FIG. 28 illustrates the fact that there are a number of source symbol sequences (each having the same symbol weights and run length) 694 corresponding to codewords 695 associated with each boundary point 696 and how there are a number of boundary points associated with each maximum entropy point 697. The overall index 698 orders the codewords from first to last. Essentially, what migrating a source run that terminates on a particular boundary point to its associated maximum entropy point does is to lexicographically order all the source runs corresponding to all the boundary points associated with that mep making it possible to indicate in the prefix only a particular mep instead of every boundary point. Since there are a lot fewer meps than there are boundary points, the prefix required will be much smaller and hence the compression will be greater.

In FIG. 28, all the boundary points up to maxbp1 are associated with the first maximum entropy point, all boundary points from maxbp1 to maxbp1+maxbp2 are associated with the second maximum entropy point etc. Codeword cwmax1 is the highest ranking codeword associated with boundary point 1 etc. Codeword cwmaxbp1 is the highest ranking codeword associated with the first maximum entropy point etc. For each maximum entropy point the codewords are ranked from zero to the highest value associated with that maximum entropy point.

Figure 31:
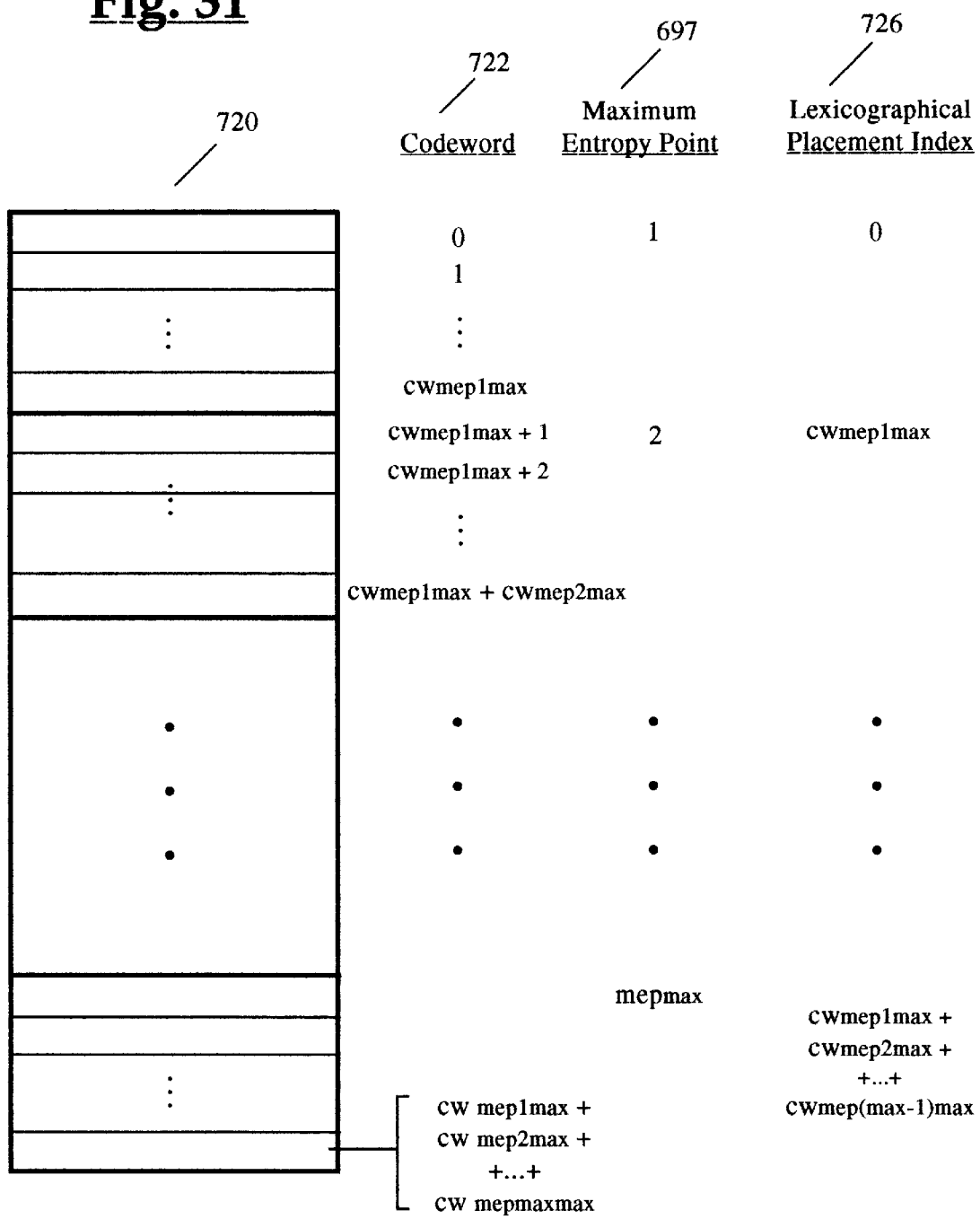
FIG. 31 shows an illustration of the lexicographical placement index as used when only maximum entropy points can be starting points in conjunction with the LMAC and LMAD.

In addition, since all possible source sequences are lexicographically ordered with respect to a mep with the index of that ordering becoming the codeword, the codeword can be used as a pointer to the address of the corresponding original source symbol sequence which has been precomputed and stored at the decoder. This lexicographical ordering is shown in FIG. 31. A lexicographical placement index 726 must be added to the codeword to get the correct pointer address. Codeword cwinep1max 722 is the highest ranking codeword associated with the first maximum entropy point 697. cwmep1max becomes the lexicographical placement index for all codewords associated with the second maximum entropy point etc. The orderly stacking of all the codewords is represented in 720.

Figure 11:
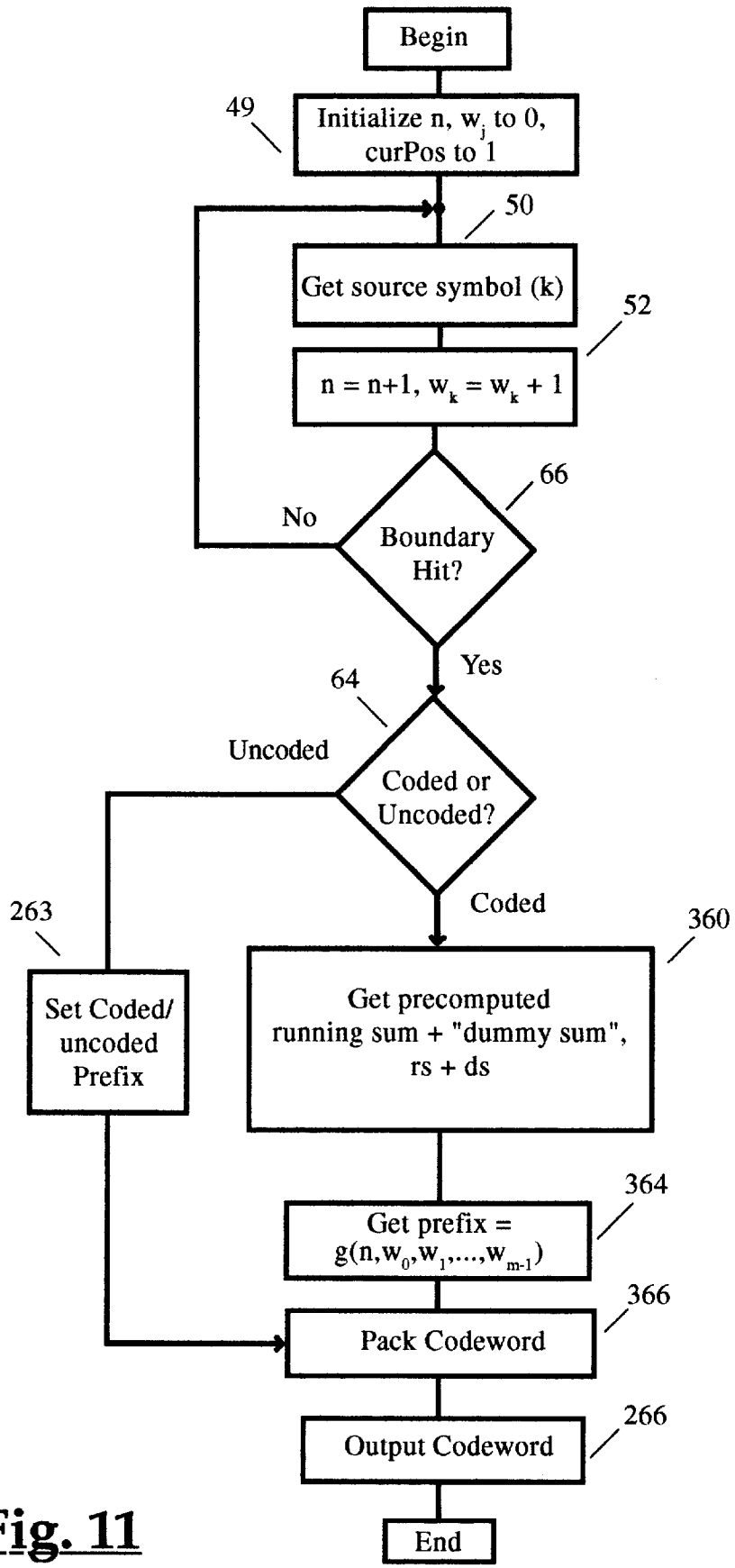
FIG. 11 shows a block diagram of an embodiment of the LMAC in which the running sum and "dummy sum" are precomputed, added together and stored as the suffix of the codeword while the starting point prefix, which refers to a particular maximum entropy point, is also precomputed and stored at the encoder.

In the block diagram of FIG. 11 which represents the preferred embodiment, run length, n, and level weights, $w_j$, ($0 \leq j \leq m-1$) are initialized to zero and curPos to one in block 49. Source symbol, k, is obtained in block 50. n and $w_k$ are incremented in block 52. In block 66 we ask if the boundary has been hit yet. If the answer is no, we go back to block 50. If the answer is yes, we proceed to block 64 where we ask if the output block is to be coded or uncoded. If uncoded, we set the Coded/uncoded prefix to one in block 263 and proceed to pack the codeword in block 366 and output the codeword in block 266. If coded, we proceed to block 360 where we get the precomputed running sum to which has been added the precomputed "dummy sum" value, and proceed to block 364 where we get the prefix which is a function of the run length and level weight values. Then the codeword is packed and output in blocks 366 and 266 respectively.

Figure 12:
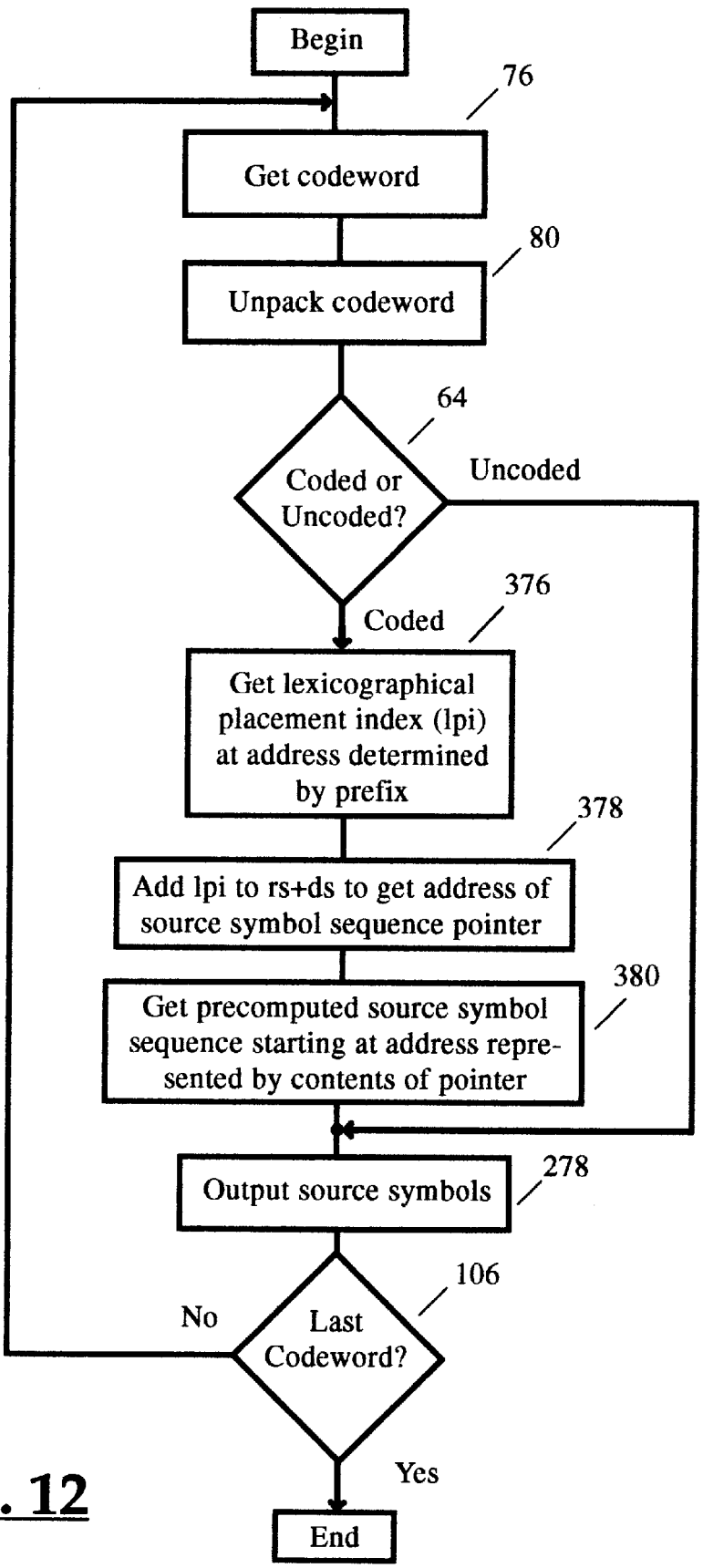
FIG. 12 shows a block diagram of an embodiment of the LMAD in which the prefix represents the address of a lexicographical placement index (lpi) corresponding to a particular maximum entropy point and the suffix plus the lpi represents the address of a pointer to the precomputed and stored original source symbol sequence.

The preferred embodiment for the LMAD is illustrated in the block diagram of FIG. 12. In block 76 we get the codeword. In block 80 we unpack the codeword. In block 64 we make a decision as to whether the input block or codeword is coded or uncoded. If uncoded, we output the source symbols directly in block 278. If coded, we get the lexicographical placement index at the address determined by the prefix in block 376. (There is one lpi for each mep, and the prefix determines the mep.) Then we add the lpi to the codeword which represents the running sum plus the "dummy sum" value in block 378. This determines the value of the pointer address to the precomputed source symbol sequence which is obtained in block 380. The source symbol sequence is then output in block 278. We determine in block 106 whether the present codeword is the last codeword. If not, we return to block 76.

Figure 13:
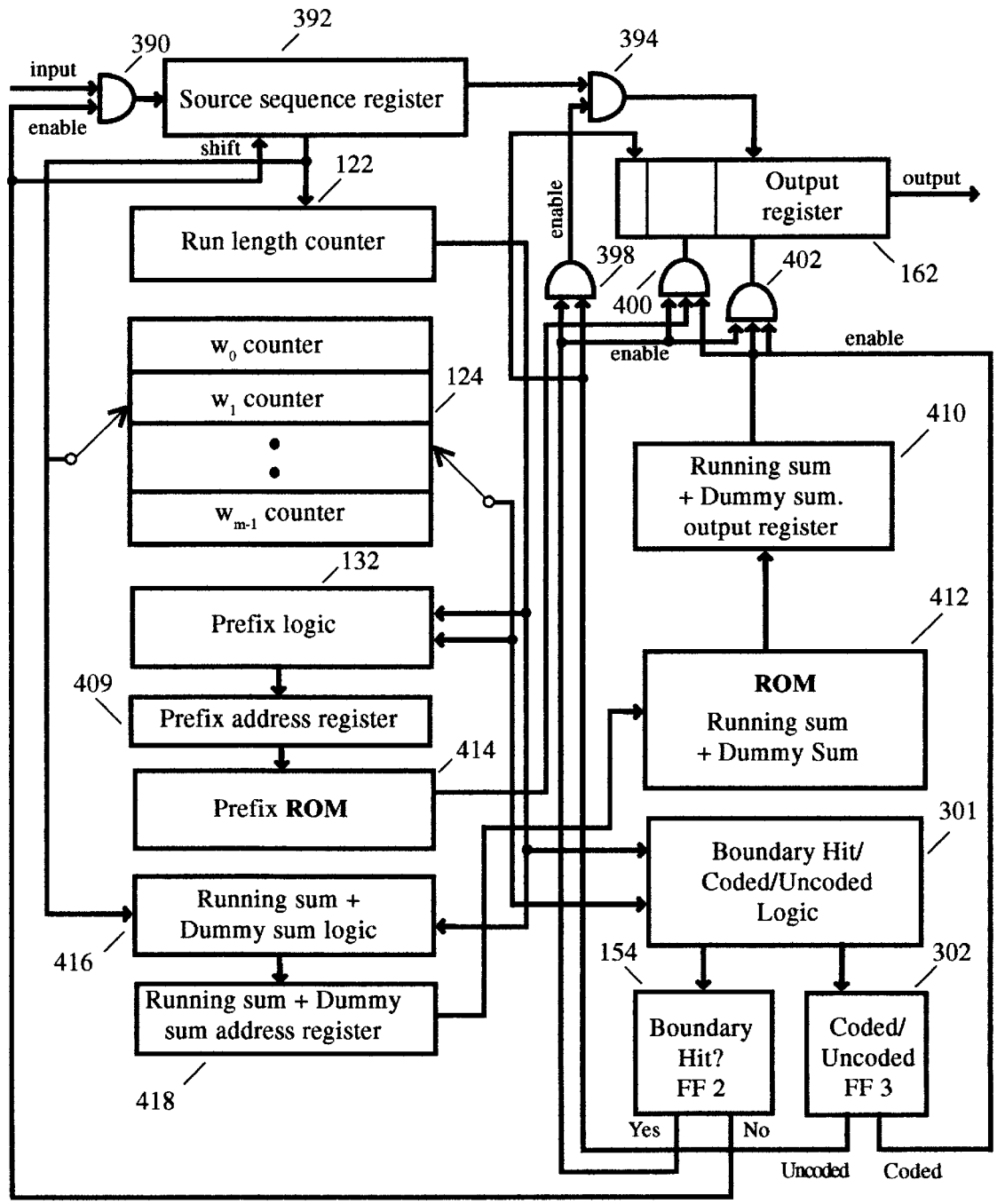
FIG. 13 shows a hardware diagram of an embodiment of the LMAC in which the running sum plus dummy sum which are stored in a ROM become the suffix of the codeword and the starting point prefix of the codeword represents the lexicographical ordering of a maximum entropy point.

FIG. 13 shows a hardware diagram for the preferred embodiment of the LMAC. Source symbols come into a Source sequence register 392 via an AND gate 390. As each symbol comes in, a Run length counter 122 and the appropriate weight counter, $w_k$, 124 are incremented. Logic circuitry 301 determines if the boundary has been hit and, if so, if the run is to be coded or uncoded using n and $w_j$ ($0 \leq j \leq m-1$) as inputs. Logic circuitry 301 sets the appropriate values in the Boundary hit? flip-flop 154 and the Coded/uncoded flip-flop 302. As long as the boundary has not been hit, the "No" output of Boundary hit? flip-flop 154 enables another source symbol to enter the Source sequence register 392. When the boundary is hit, and, if the output block is to be uncoded, AND gates 394 and 398 enable the Source sequence to flow into the Output register 162. Flip-flop 302 sets the Coded/uncoded prefix in Output register 162. The Running sum+Dummy sum logic circuit 416 uses inputs from the Source sequence register 392 and Run length counter 122 to determine the address of the precomputed codeword stored in ROM 412. The address is deposited in register 418. The precomputed Running sum plus Dummy sum is deposited in register 410. This value then flows into the suffix section of Output register 162 enabled by AND gate 402.

The Prefix ROM 414 using an address determined by the Prefix logic circuit 132 using the level weight counters 124 and the run length counter 122 as inputs. The appropriate address is deposited in register 409. Prefix ROM 414 outputs the prefix which refers to the appropriate maximum entropy point. The prefix flows into Output register 162 enabled by AND gate 400.

Figure 34:
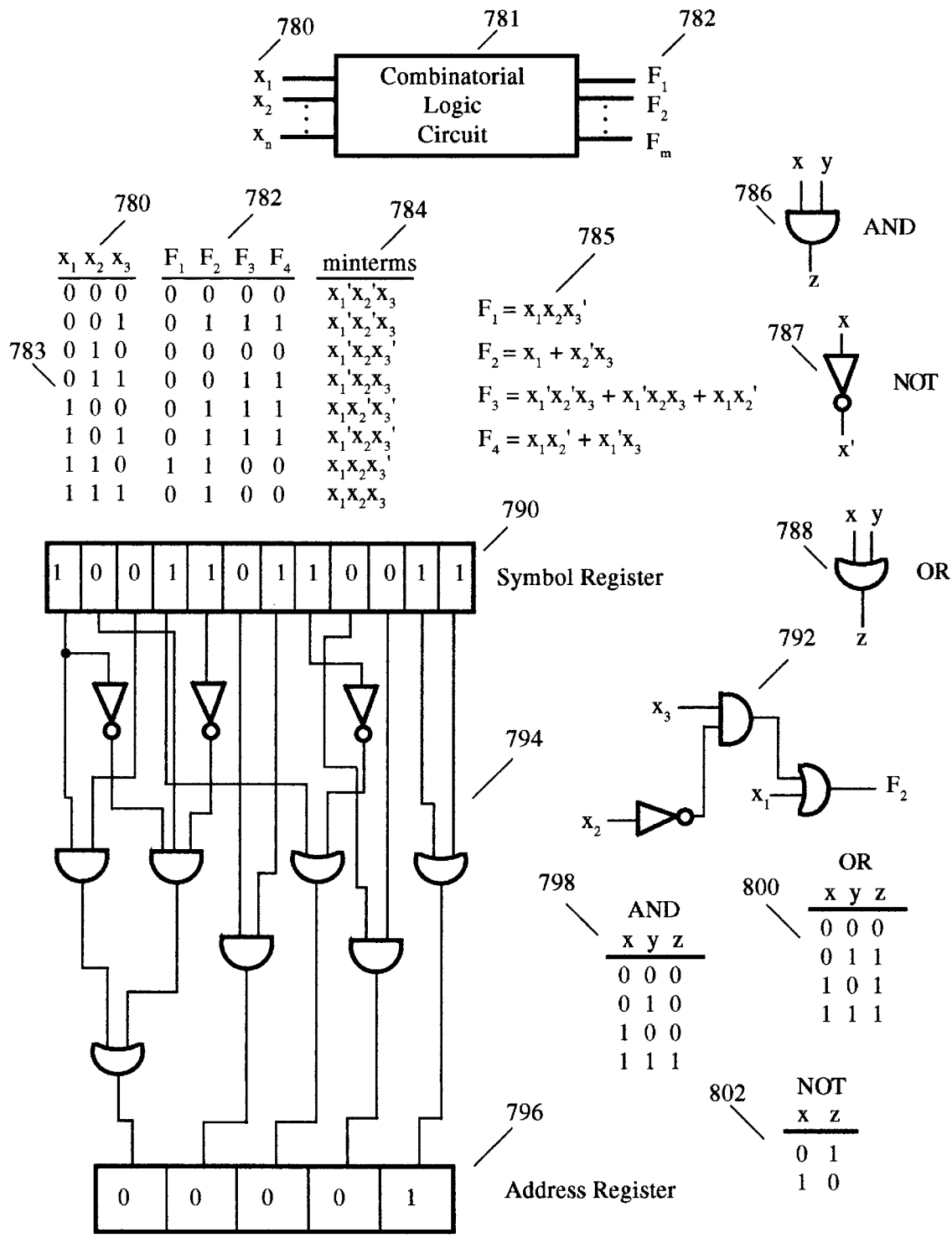
FIG. 34 illustrates the design of logic circuits and gives an example of how the contents of a register containing source symbols can determine the address register of a ROM.

FIG. 34 explains how the logic circuits are constructed. In general a combinatorial logic circuit 781 has binary input variables $x_1, x_2 \ldots x_n$ 780 and binary output variables $F_1, F_2, \ldots, F_m$ 782. Each output variable is a Boolean function of the input variables. $F_1 = f_1(x_1, x_2, \ldots, x_n)$, $F_2 = f_2(x_1, x_2, \ldots, x_n)$ etc. Any Boolean function can be expressed by a truth table 783. The output variables, $F_1, F_2, \ldots, F_m$ 782 can be expressed in terms of the input variables 780 as the sum of minterms or the product of maxterms. In FIG. 34 minterms 784 are shown. Each minterm is the product of all three inputs. If an input in a minterm is 0, that input is negated or primed in the minterm e.g. $x'$. For instance, in the first row of the truth table all three inputs are 0. Therefore, the first minterm, $x_1'x_2'x_3'$, shows all three inputs primed. Each output variable is the sum of each minterm times the value of the output corresponding to that minterm. Hence, $F_1 = x_1 x_2 x_3'$ 785 since that is the only minterm that has a corresponding "1" value. Once the output variables are expressed in terms of minterms, the expressions can be simplified if possible. The equations 785 represent the truth table 783. Any logical function can be expressed in terms of AND 786, OR 788 and NOT 787 gates. Symbols for these gates are shown as well as the logical relationships among inputs and outputs 798, 800, 802. A realization of the logical function $F_2$ in terms of AND, OR and NOT gates is shown 792.

A register is a group of binary cells. Since a cell stores one bit of information, it follows that a register with n cells can store any discrete quantity of information containing n bits. The state of a register is an n-tuple of ones and zeros with each bit designating the state of one cell in a register. The Symbol register 790 represents a binary n-tuple input which is transformed by the logic circuit 794 into an address contained in Address register 796.

From the above discussion, those skilled in the art will understand that the contents of any hardware register can determine by means of an appropriate array of logic gates the contents of any other register. In particular, an example is shown in FIG. 34 in which a Symbol register 790 whose contents are 100110110011 determines the contents of an Address register 796 by means of a set of logic gates 794 so that the address 00001 shows up in the Address register 796. This example is for binary symbols, but those skilled in the art will appreciate that the Symbol register could contain multilevel symbols expressed in binary form as well and the same design considerations would apply.

In light of the above discussion, those skilled in the art will understand that the Source sequence register 392 in FIG. 13 and the Run length counter 122 can determine the contents of the Running sum+Dummy sum address register 418 by means of the Running sum+Dummy sum logic circuit 416. Similarly, the Run length counter 122 and Level weight counters 124, can determine the contents of the Prefix address register 409 by means of the Prefix logic circuit 132. Similarly, these same registers (122 and 124) determine the contents of the Boundary hit? flip-flop 154 and the Coded/uncoded? flip-flop 302 by means of the Boundary Hit/Coded/Uncoded logic circuit 301. The same statement can be made for the logic circuits 301 in FIG. 9 and 132 in FIG. 5.

Figure 14:
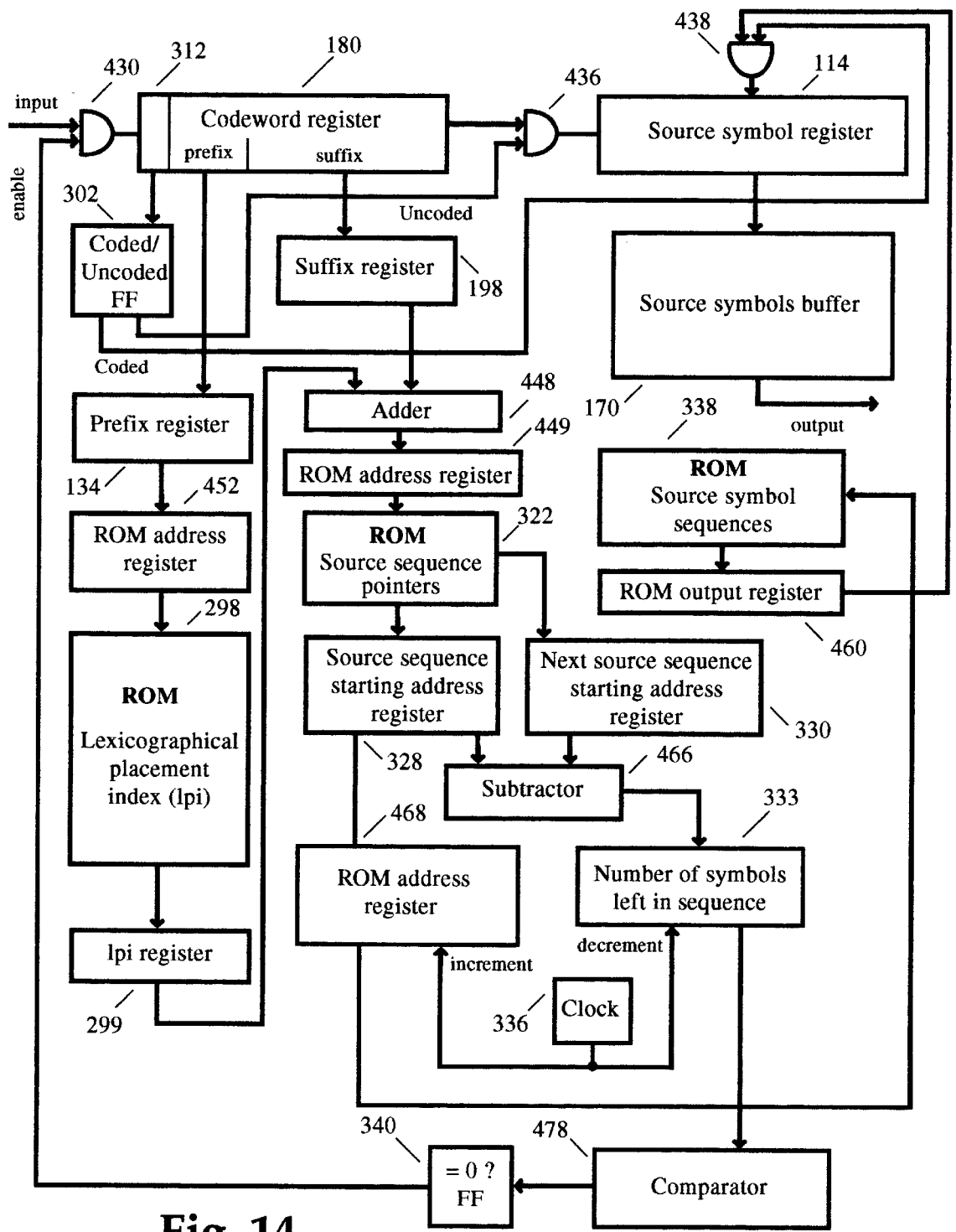
FIG. 14 shows a hardware diagram of an embodiment of the LMAD in which a lexicographical placement index determined by the codeword prefix is added to the codeword suffix to determine a pointer address which contains a pointer to the precomputed original source sequence symbols.

FIG. 14 shows a hardware diagram for the preferred embodiment of the LMAD. The input block or codeword enters a Codeword register 180 via AND gate 430. The section containing the Coded/uncoded prefix 312 is routed to a Coded/uncoded flip-flop 302. The maximum entropy starting point prefix is routed to a Prefix register 134, and the suffix containing the running sum plus the "dummy sum" is routed to a Suffix register 198. If Coded/uncoded prefix 312 is set (indicating an uncoded run), the contents of Codeword register 180 flow into a Source symbol register 114 enabled by AND gate 436 and from there into a Source symbols buffer 170.

The starting point prefix, which represents the lexicographical ordering of a maximum entropy point, can be used to address the lexicographical placement index and flows into an Address register 452. The appropriate lpi is read out of a ROM 298 into an lpi register 299. It is then added to the contents of Suffix register 198 in an Adder 448 and deposited in a ROM address register 449. The contents of this register now represent the address of the pointer to the appropriate precomputed source symbol sequence corresponding to the codeword.

The appropriate source sequence pointer is read out of a ROM 322 into a Source sequence starting address register 328. The next pointer address representing the start of the next consecutive source symbol sequence is read out of ROM 322 into a Next source sequence starting address register 330. The difference of these two values represents the length of the appropriate source symbol sequence. These two values are subtracted in a Subtractor 466 and deposited in a Number of symbols left in source sequence counter 333. The contents of register 328 are also read into a Source symbol ROM address register 468. A clock 336 decrements the contents of register 333 and increments the contents of register 468. The source symbols are then read out of a ROM 338 into a ROM output register 460, transferred to a Source symbol register 114 via AND gate 438 and from there to a Source symbols buffer 170.

A comparator 478 compares the contents of Number of symbols left in sequence counter 333 to zero and sets a "=0?" flip-flop 340 accordingly. This flip-flop enables the input of the next codeword to Codeword register 180 via AND gate 430 after all the source symbols have been read out of ROM 338 and into Source symbols buffer 170.

In order to use the LMAC and LMAD for Data Compression, it is only necessary to specify the Preprocessing 22 and Postprocessing 34 modules in FIG. 1. The source 20 emits a stream of symbols that are in this case alphanumeric. The source might be a text file consisting of the letters of the alphabet, numerals, punctuation marks and various other symbols or it might be a word processing file or a database file among others.

An example of preprocessing for data compression is given in FIG. 15. For the purposes of this example, we assume the source emits simple English text. Each letter is coded with a 5 bit code 486 resembling a simplified ASCII code. Five bits is enough to cover the letters of the alphabet but not much else. Now if we expand the code to a six bit code 488, for example, we can code not only individual letters but letter combinations and common English words. Some of the most common English words such as "the", "an", "and", "for", "is", "to" etc. are shown in the code. Also common prefixes and suffixes such as "ed", "ing", "pre" and "re" can be included. Inclusion of words and letter combinations means that more letters can be coded per source symbol. However, the more groups of letters that are included in the code, the higher the value of m, the number of source levels. For instance, m is 32 and 64 in the examples 486 and 488, respectively. For the purposes of this example and in most cases, data compression is assumed to be a lossless process although scenarios can be envisioned in which this need not be the case. For instance, English text still may be intelligible even though some letters are missing or there are some misspellings as in the following example: "Th briwn dog yumped ver the wellow kat."

Those skilled in the art will appreciate the facts that the Preprocessing module can recode the incoming data in one pass and hence no off-line processing is required and that the Lawrence M-ary Algorithm Decoder (LMAD) and a Postprocessing module (not shown in FIG. 15) can do the inverse operations to those discussed above.

Figure 16:
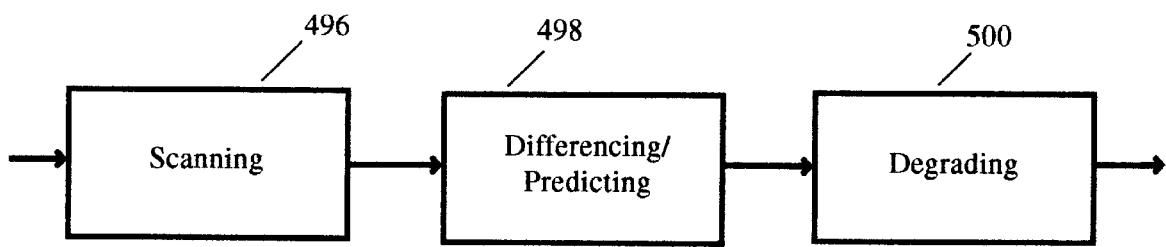
FIG. 16 shows the components of the preprocessing process for use in conjunction with the LMAC for image compression.

FIG. 16 illustrates the submodules of the Preprocessing module 22 used in a configuration capable of doing image compression. These three submodules include a Scanning module 496, a Differencing/Predicting module 498 and a Degrading module 500.

Figure 17:
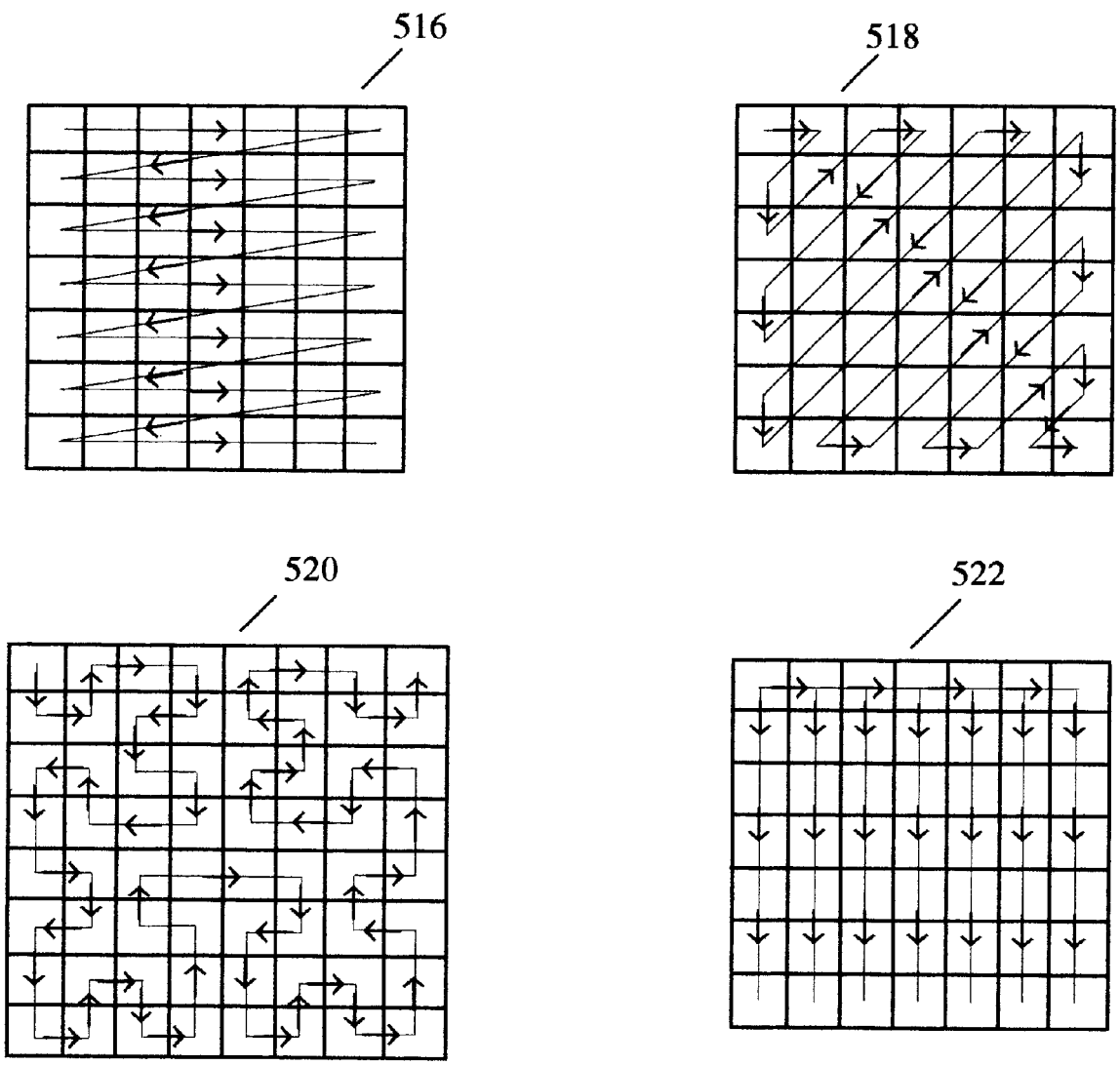
FIG. 17 shows some of the different kinds of scanning which can be used as part of preprocessing for an image compression application used in conjunction with the LMAC.

FIG. 17 illustrates the function of the Scanning module. Scan Row Order scanning is illustrated in diagram 516. In this kind of scanning, the picture elements (pixels) are inserted into the symbol stream ($S_1, S_2, \ldots$) by taking them horizontally across the first line. $S_1$ would be the first element on the first line. The next element after the last element on the first line would be the first element on the second line, then the second element on the second line etc. The problem with setting up the source symbol sequence in this way is that there may be a discontinuity in pixel values from the last element of one line to the first element of the next.

Zigzag Order scanning is illustrated in diagram 518. In this kind of scanning every element in the symbol stream except the first is preceded by an element that is its nearest element in some direction in the image. Hence, it is to be expected that the values of most symbols in the symbol stream will be close to those of adjacent symbols. Hilbert Curve Order scanning is illustrated in diagram 520. This kind of scanning takes into account closeness in more than one direction.

The scanning order in diagram 522 is horizontally left to right for the first row. Then scanning proceeds vertically down the first column, then down the second etc. In this kind of scanning every element of the first row is close to its neighbor horizontally and every other element is close to its neighbor vertically.

Figure 18A:
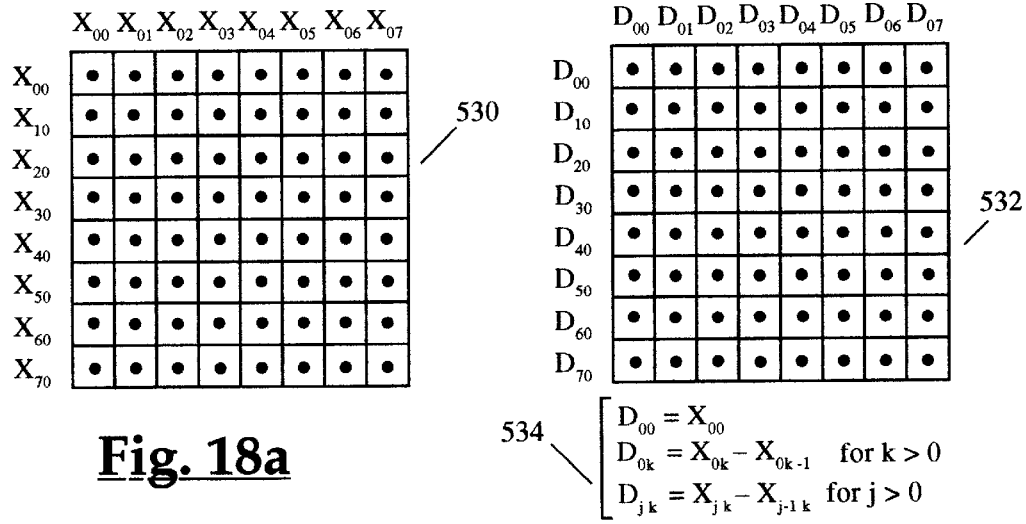
FIG. 18a shows an example of the differencing process as used for image and intraframe video compression in conjunction with the LMAC.

FIG. 18a illustrates the Differencing/Predicting submodule 498. Differencing is the simplest form of Predicting and involves taking the difference of two adjacent pixels. If these pixels are close in value as would be expected in many cases, the difference would be a very small value and in many cases would be zero. These difference values are then encoded by the LMAC instead of the original source symbol values. After decoding, the inverse process generates the original source symbol stream.

The original data is shown in diagram 530. $X_{jk}$ represents a pixel in the $j^{th}$ row and $k^{th}$ column. For the purposes of this example we assume the scanning order of diagram 522 although other scanning orders might be used as well. Diagram 532 represents the pixel differences. $D_{00}$ is the reference pixel: $D_{00}=X_{00}$. Since it is the very first pixel in the symbol stream, it is the only symbol that is not differenced. For the first row the differences are taken horizontally: $D_{01}=X_{01}-X_{00}$, $D_{02}=X_{02}-X_{01}$ etc. For every row after the first, $D_{jk}=X_{jk}-X_{j-1k}$. Therefore, $D_{10}=X_{10}-X_{00}$, etc. At the Postprocessing module 34, the reverse procedure is performed: $X_{00}=D_{00}$·$X_{01}=D_{01}+D_{00}$, etc. $X_{10}=D_{10}+D_{00}$ etc. Of course, many other scanning and differencing models are possible in order to set up the source symbol stream for processing by the LMAC.

Figure 32:
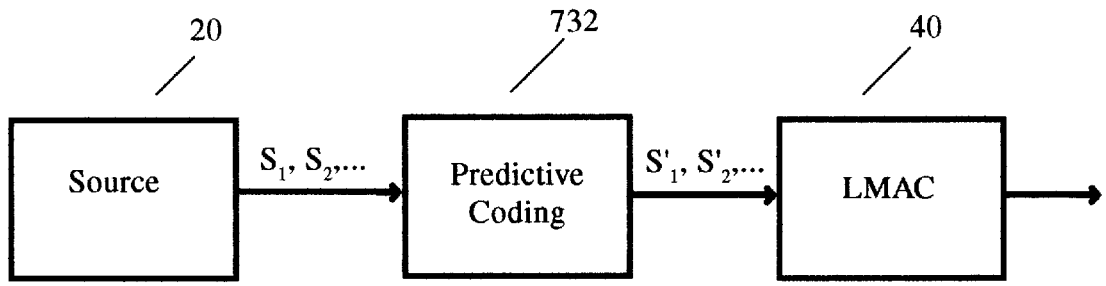
FIG. 32 shows an example of predictive coding.

Predictive coding uses a number of previous symbols in the symbol stream, instead of just the preceding symbol as in differencing, in order to generate a prediction of the next symbol which is then subtracted from the actual symbol to generate an error symbol. An example is given in FIG. 32. A Source 20 followed by a Predictive coding module 732 followed by the LMAC 40 are shown. The example compares predictive coding and differencing for a sample source symbol stream. The relationships that define this particular version of Predictive coding are shown 736. The Source symbol stream is shown 738. The symbol stream after differencing is shown 740. Finally, the symbol stream after this version of predictive coding is shown 742. Those skilled in the art will understand that the inverse processes using the LMAD and a Postprocessing module can be performed at the decoder.

Figure 19:
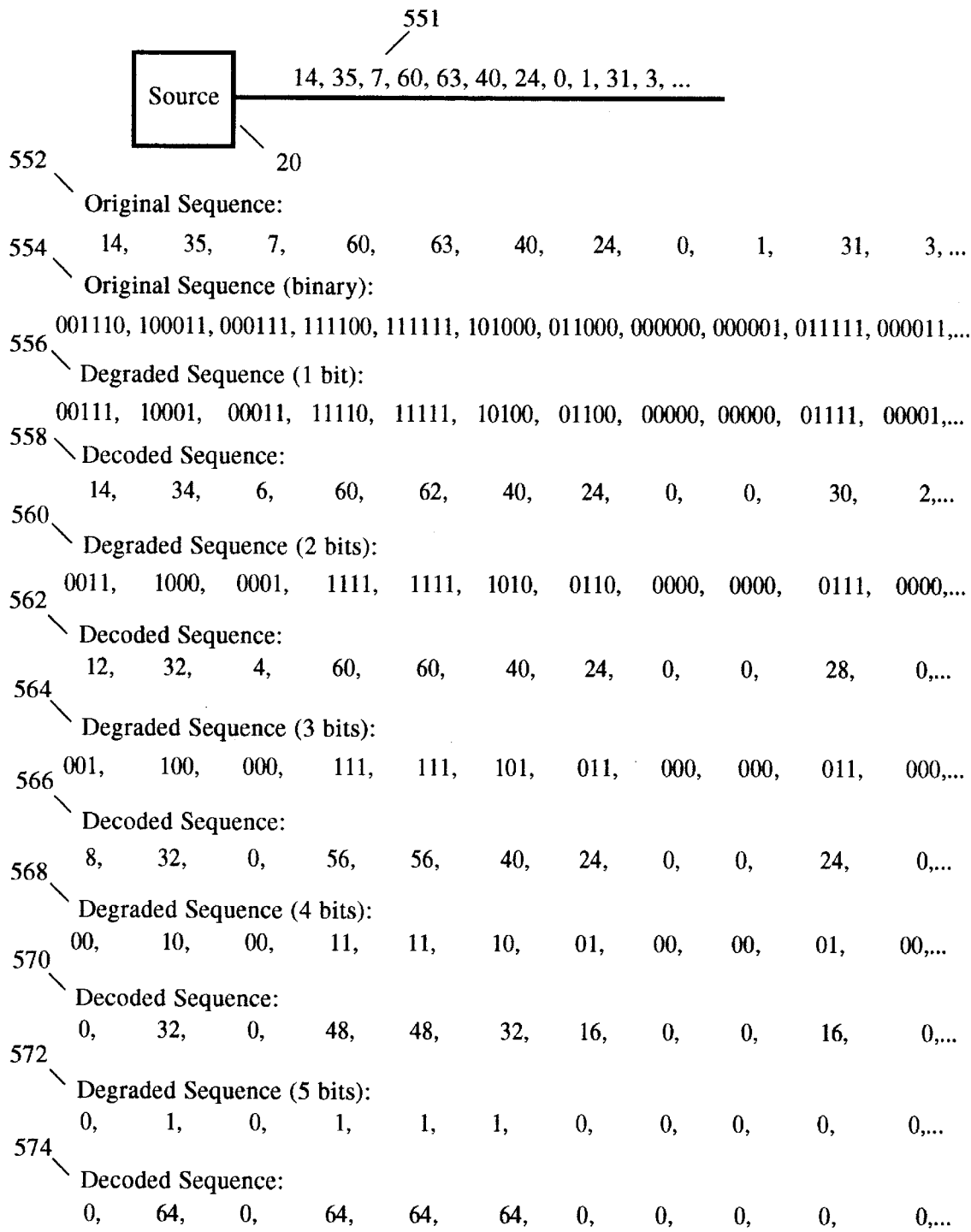
FIG. 19 shows an example of the degrading process as used for image and video compression in conjunction with the LMAC.

Since the Lawrence M-ary Algorithm Coding and Decoding method is a lossless method, we can eliminate the Degrading module 500 in FIG. 16 and do lossless image compression with just a Scanning module and a Differencing module before the LMAC and an Adding module and Inverse scanning module after the LMAD. However, lossy image compression can also be performed with the addition of the Degrading module 500. One kind of degrading is reduction in the number of source levels. For image compression this would result in a diminution in the number of colors or gray levels available. FIG. 19 gives an example of this kind of degradation in which a source initially has six bits of color value information for each pixel. This is reduced to 5 bits, then to 4 bits and, finally, all the way down to 2 bits at which point it becomes a black and white picture in FIG. 19. A Source 20 emits a multilevel symbol stream 551. The original sequence 552 as well as the original sequence in binary format 554 are shown. The sequence degraded by one bit $^{i.e.}$ reduced from six bits to five bits 556 is shown. This sequence is also shown after decoding 558. The original sequence degraded by two bits (reduced from six to four bits) is shown 560 as well as this same sequence after decoding 562. The degraded sequences for 3 bits 564, 4 bits 568 and 5 bits 572 are shown as well as the respective decoded sequences for 3 bits 566, 4 bits 570 and 5 bits 574.

Figure 27:
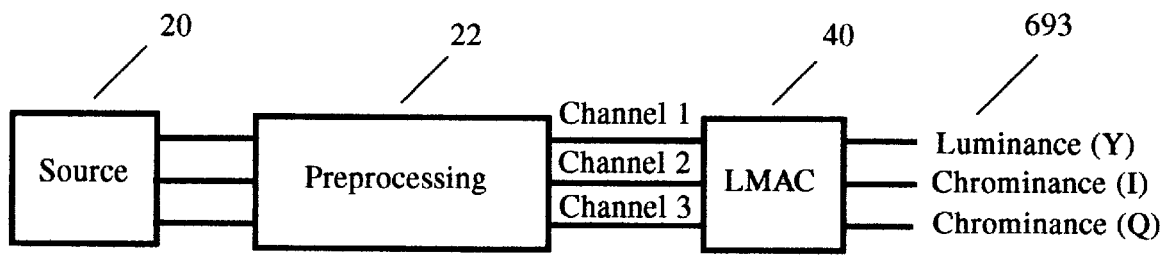
FIG. 27 shows a diagram of a communication system using the LMAC involving three channels of source data as is typically used with images and video.

For image or video compression it is possible to have more than one channel of information and to compress each channel separately as shown in FIG. 27. A Source 20 emits three channels of data into a Preprocessing module 22 which then connects with the LMAC 40. There are a number of different color models that can be used. For instance, with the R(ed), G(reen), B(lue) model, each pixel may be represented by 8 bits of red, 8 bits of green and 8 bits of blue. The three separate sources can be compressed separately with the LMAC resulting in a value of m equal to 256 for each channel. Three LMACs can be used in parallel or one LMAC can be time shared to process all three channels.

If each pixel contains all 24 bits of information, this results in a value of m of approximately 16 million. However, after differencing we would expect most values to be near zero, and an embodiment of the LMAC which involved a lower value of m than represented by the source is possible. In this embodiment, coding would simply be terminated if a value of m came into the LMAC from the source that exceeded that value of m which the LMAC could handle. Alternatively, the source levels can be divided into a number of different regions with a prefix in the codeword serving to indicate which region is being encoded. Alternatively, a number of LMACs working in parallel could handle the different regions.

Figure 33:
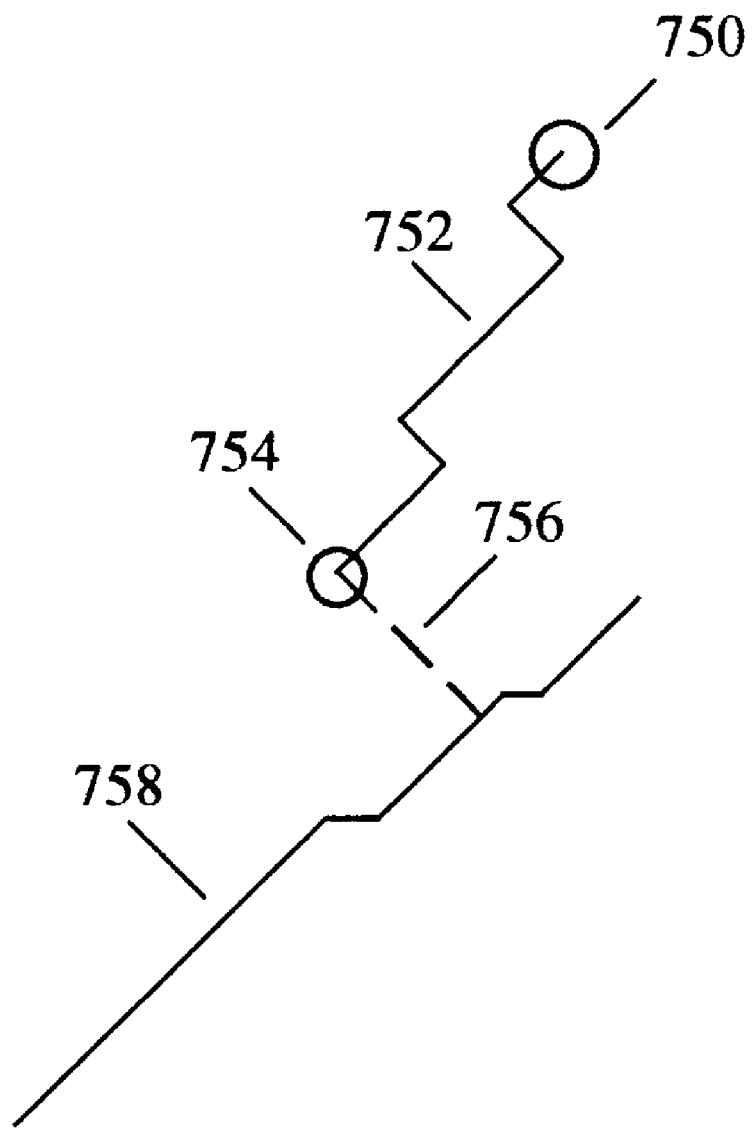
FIG. 33 shows an illustration of off-boundary coding with the LMAC and LMAD.

When the LMAC terminates a source run because a symbol comes in which is out of its range as discussed in the preceding paragraph or simply because a source run has not reached a boundary where there are no more symbols in the source file, some additional processing must be done. One solution is to send this type of run as an uncoded block. Another solution is illustrated in FIG. 33. When the path of the source sequence in Pascal's hypervolume 752 starting from the apex 750 terminates at a point 754 which is not on the boundary 758, we choose some other symbol value than the value of the last symbol that has come in and use that to steer a path 756 to the boundary. This symbol then acts like an off-boundary dummy symbol. We use an on-off boundary prefix 45 (FIG. 2a) to indicate that, after the dummy symbols have been discarded in the decoding process, there is still one more run of symbols (all of the same type) that must be discarded before the actual source symbols are decoded. We know the last off-boundary dummy has been discarded when the value of a decoded symbol changes from the previously decoded symbol.

Figure 20:
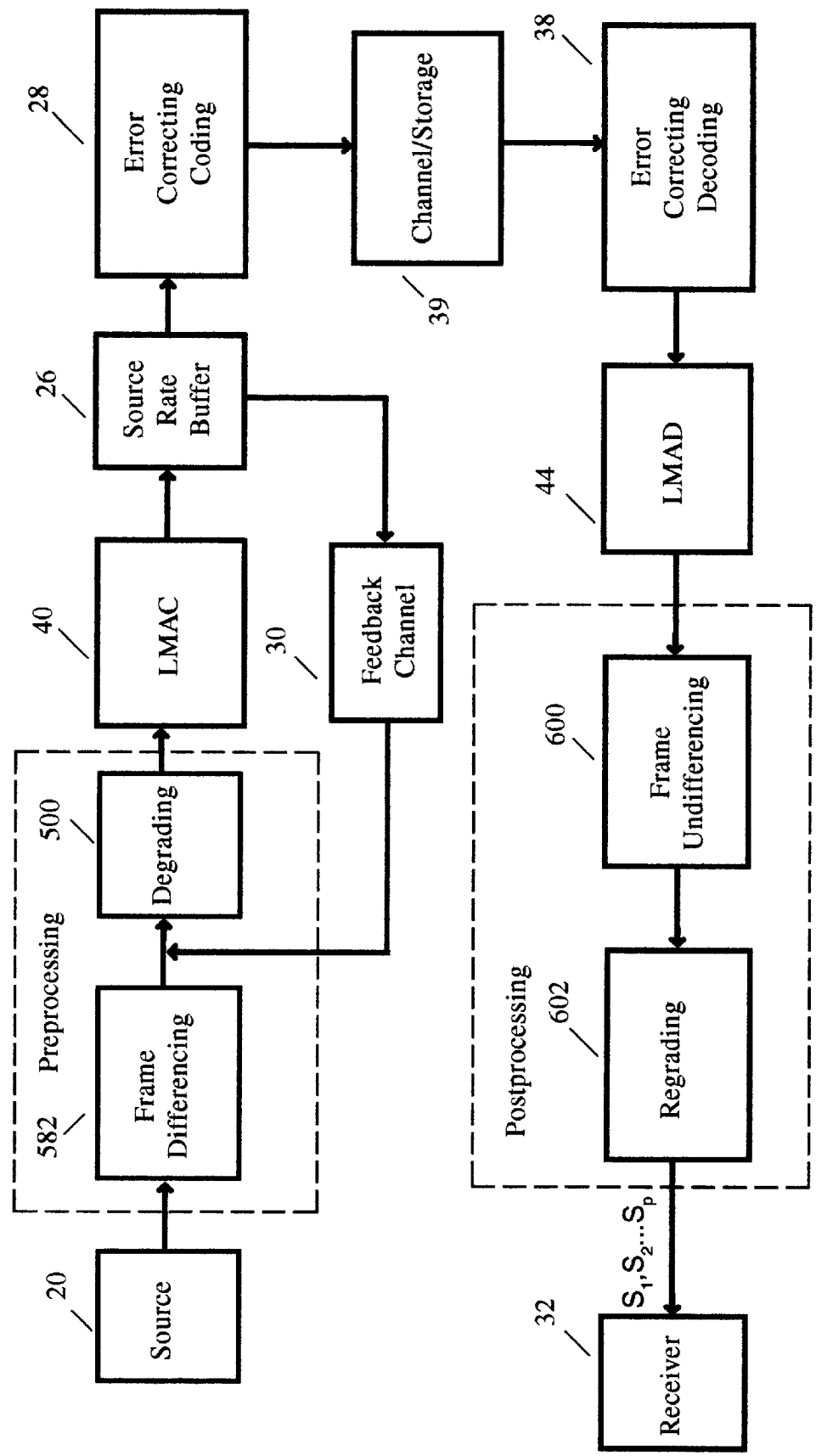
FIG. 20 shows a block diagram of video compression using the LMAC and LMAD.

The Lawrence M-ary Algorithm Coder and Decoder can be used for video compression. FIG. 20 shows a general video communication system. Image data is emitted from a source 20 in frames at a typical rate of 30 frames per second (fps). Preprocessing includes Frame differencing 582 and Degrading 500. Source coding is performed by the LMAC 40. Source decoding is performed by the LMAD 44. Post-processing consists of Frame undifferencing 600 and Regrading 602. Regrading might consist of smoothing the data or in other ways compensating for the degradation produced by the degrading module. A Source rate buffer 26 operating through a feedback channel 30 controls the amount of degrading that is necessary to keep up a steady flow of digital information over a channel 39 so that neither underflow or overflow occurs. Error Correcting Coding 28 is applied before the digital information is sent over channel 39, and Error Correcting Decoding 38 is applied at the other end of channel 39.

Figure 18B:
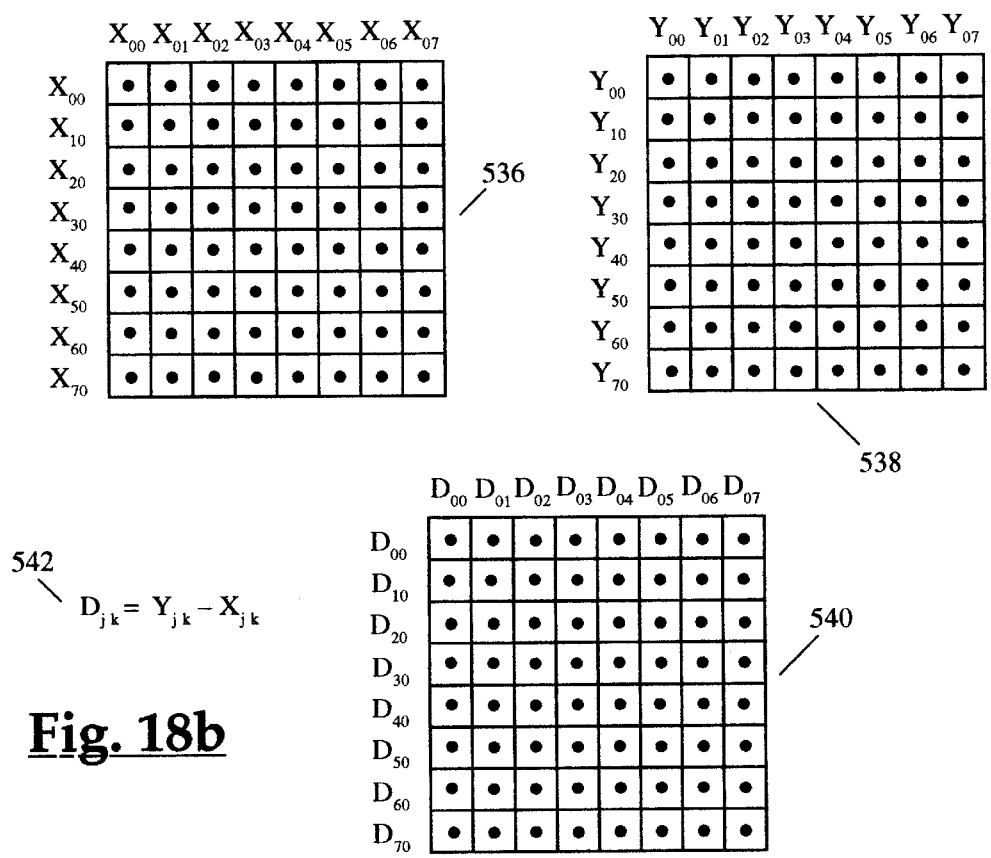
FIG. 18b shows an example of the differencing process as used for interframe video compression in conjunction with the LMAC.
Figure 21:
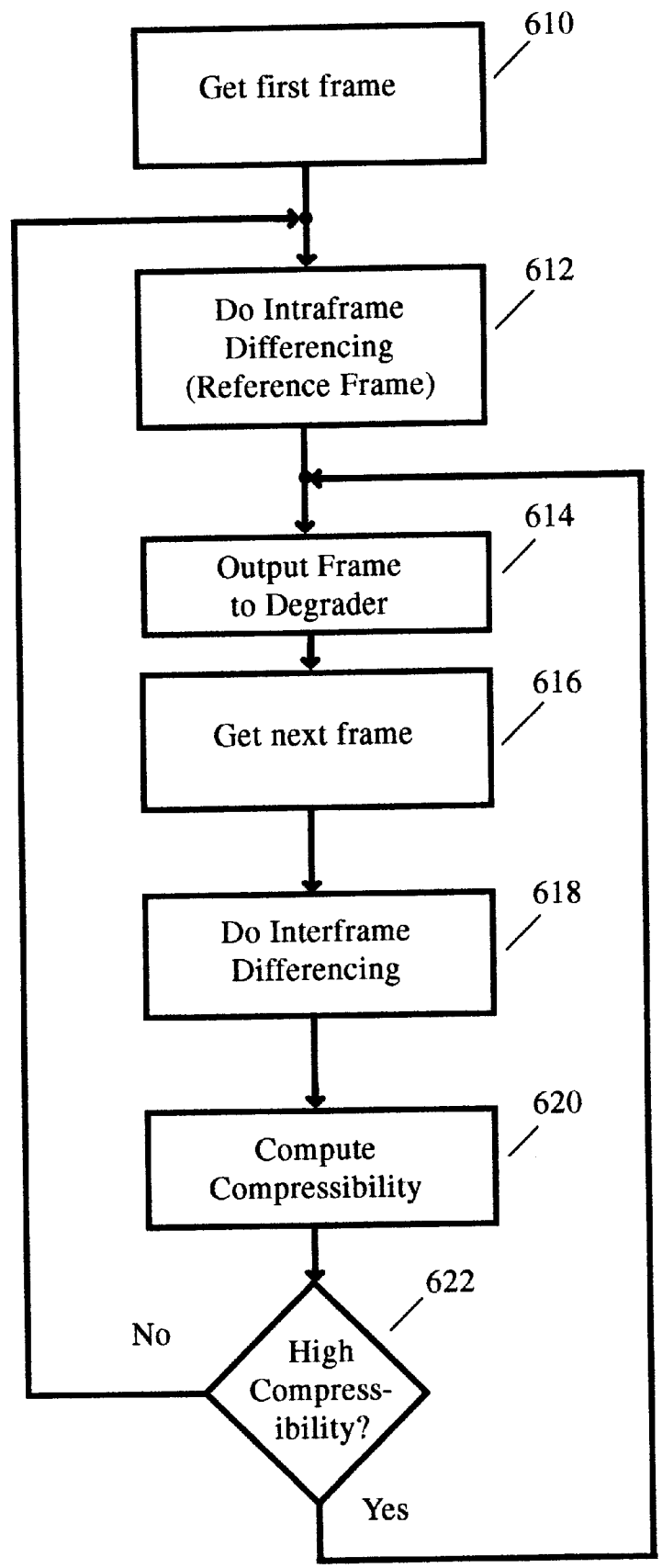
FIG. 21 shows a block diagram of serial intraframe and interframe coding for use in a video compression application in conjunction with the LMAC.

FIG. 21 shows a block diagram of a Differencing module for video compression. There are two types of compression: intraframe and interframe. In block 610 we get the first frame. In block 612 we do intraframe differencing as shown in FIG. 18a and discussed above for image compression. This frame becomes the reference frame for interframe coding which is applied to subsequent frames. In interframe coding as shown in FIG. 18b, pixel values, $X_{jk}$, from a frame 536 are subtracted from the pixel values, $Y_{jk}$, of the succeeding frame 538 to produce a difference frame $D_{jk}$ 540 as in equation 542.

After the reference frame has been differenced in FIG. 21, it goes to a Degrader block 614. In block 616 we get the next frame. In block 618 interframe differencing takes place. In block 620 the compressibility of the frame is computed. One simple way to do this is just to count the number of zeroes. If this number is greater than a reference value, the compressibility is high enough. Otherwise, it's not. In block 622 a decision is made as to whether the compressibility is high enough. If it is, we return to block 614. If it is not, we go back to block 612 and make another reference frame using intraframe coding. A one bit prefix in the codeword indicates intraframe or interframe coding.

Figure 22:
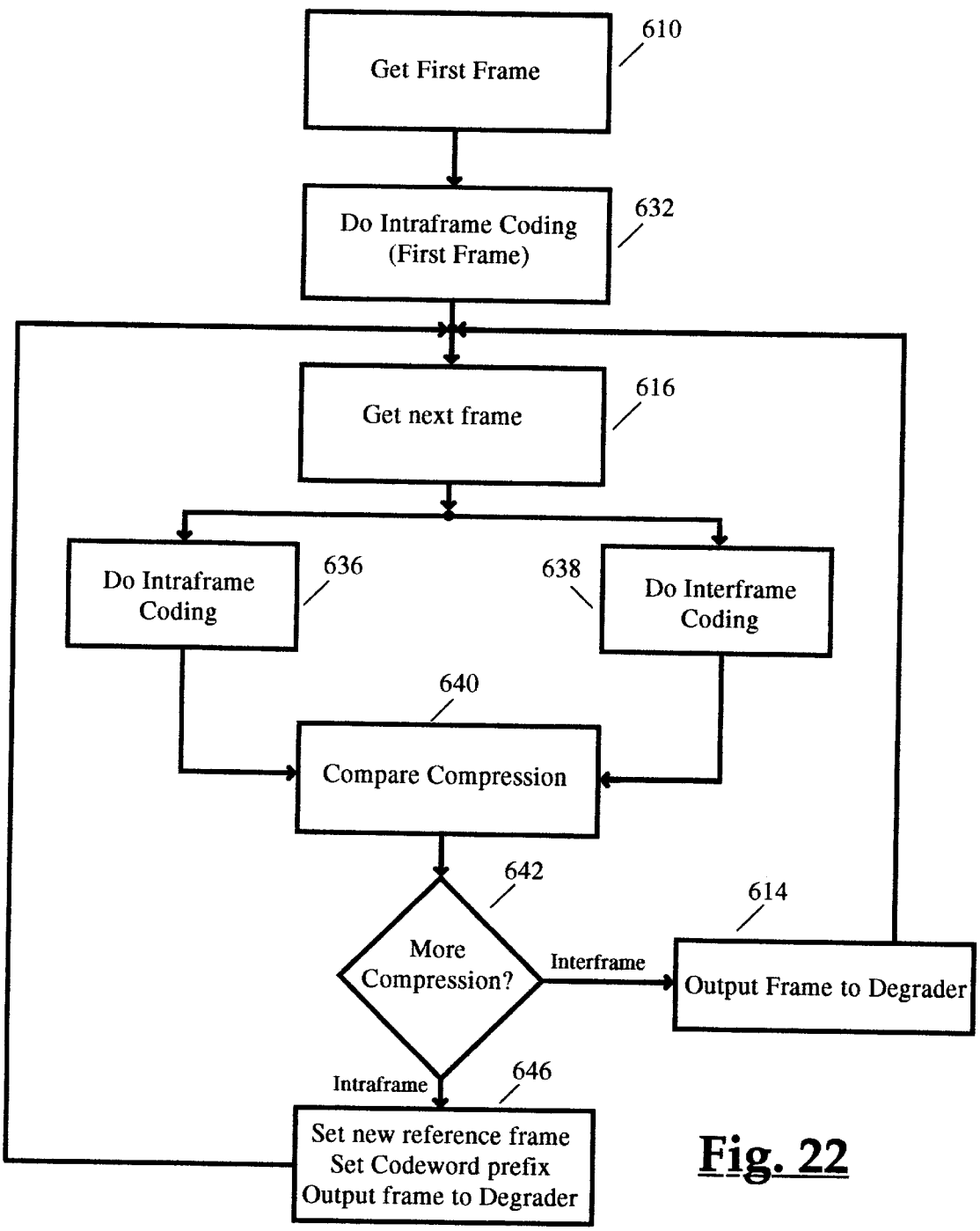
FIG. 22 shows a block diagram of parallel intraframe and interframe coding for use in a video compression application in conjunction with the LMAC.

FIG. 22 illustrates another way to do video compression in which the interframe and intraframe coding are done in parallel, their compression ratios compared, and then the one with the highest compression ratio is actually used. If it is the intraframe coded frame, then this becomes the new reference frame. In block 610 we get the first frame. In block 632 we intraframe code the first frame. In block 616 we get the next frame. In block 636 we do intraframe coding on this frame. In block 638 we do interframe coding on this frame. In block 640 we compare the compression gained in the intraframe and interframe coding blocks. In block 642 we make a decision as to whether more compression was gained from intraframe or from interframe coding. If interframe, we output the frame to the Degrader in block 614 and go back to block 616. If intraframe, we set this frame as the new reference frame in block 646, set the codeword prefix which indicates intraframe as opposed to interframe coding, output this frame to the degrader and return to block 616.

Degrading for video compression can be done, for example, similarly to that described for image compression. The level reduction degrading illustrated in FIG. 19 can be applied to video compression as well. In addition the Source rate buffer 26 as shown in FIG. 20 can send a signal through the feedback channel 30 to the degrader 500 to indicate whether more or less degradation is necessary to keep Source rate buffer 26 approximately half full so that neither overflow or underflow takes place. If source statistics are favorable, the system of FIG. 20 can revert seamlessly from lossy to lossless coding.

There can be multiple channels of video data as illustrated in FIG. 27. A Luminance and two Chrominance channels are shown 693. Each channel would be encoded and decoded separately by the LMAC and LMAD. Performance can be seamlessly degraded to just the Luminance channel in two bit mode which would represent a black and white picture. The degrading process need not be the same for all three channels.

Progressive and hierarchical scanning in which the frames are first processed with a reduction in spatial or color value resolution, respectively, and then later built up to full resolution can be easily accommodated with the LMAC and LMAD. The value of m, the number of source levels, can easily be varied and resolutions increased or decreased as the situation warrants.

Those skilled in the art will appreciate that all the steps described above for the encoding process can be done in reverse for the decoding process. Also, other forms of differencing, predicting and degrading than the ones described here may be used as well.

Figure 23:
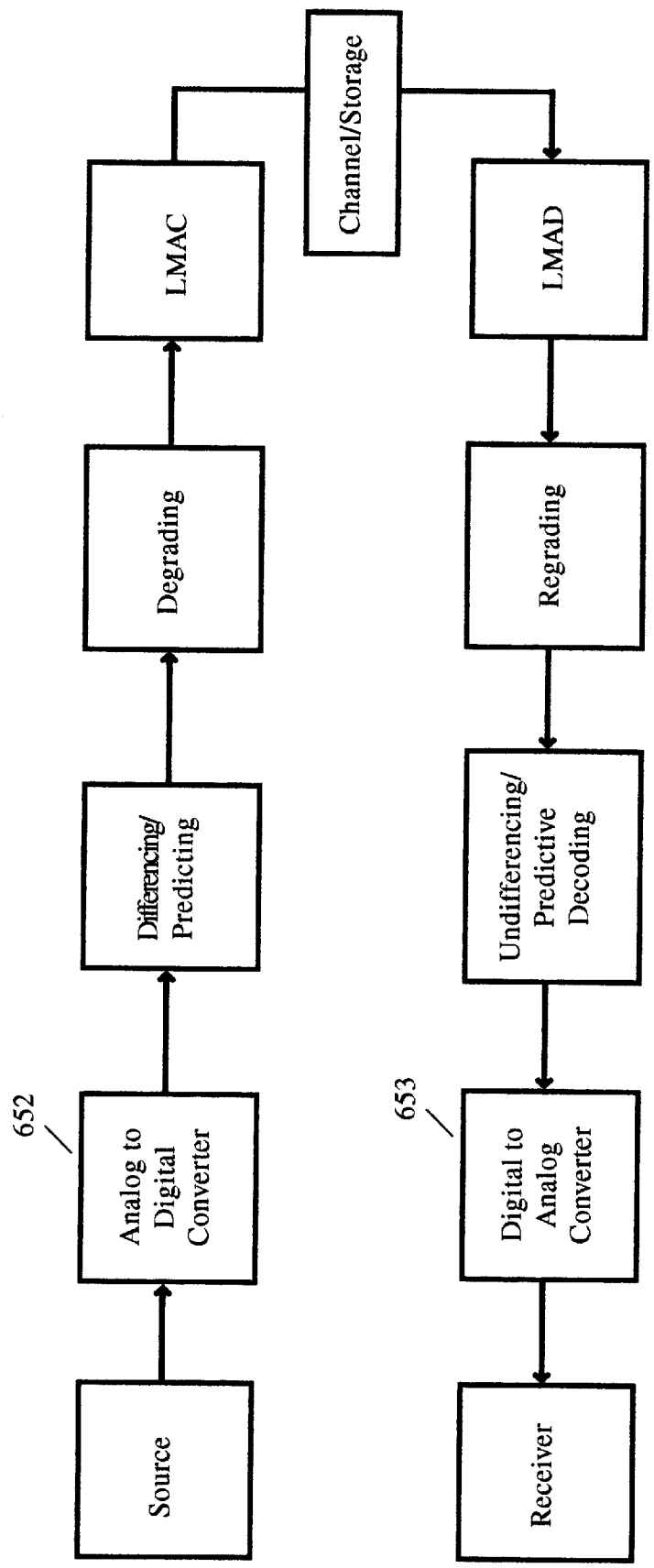
FIG. 23 shows a diagram of a communication system using the LMAC and LMAD with application to audio, speech, surveillance, monitoring and other analog signals which can be converted to digital.

FIG. 23 illustrates how the LMAC can be used for audio, speech and other digital signals such as seismographic, telemetric, medical monitoring, meteorological, astronomical, scientific, surveillance, military and other instrumental data. As long as the data is converted to digital form in an Analog to Digital Converter 652, the data can be compressed either losslessly or lossily by the LMAC and decompressed by the LMAD as those skilled in the art will understand. The data is reconverted from digital to analog by a Digital to Analog Converter 653.

Figure 35:
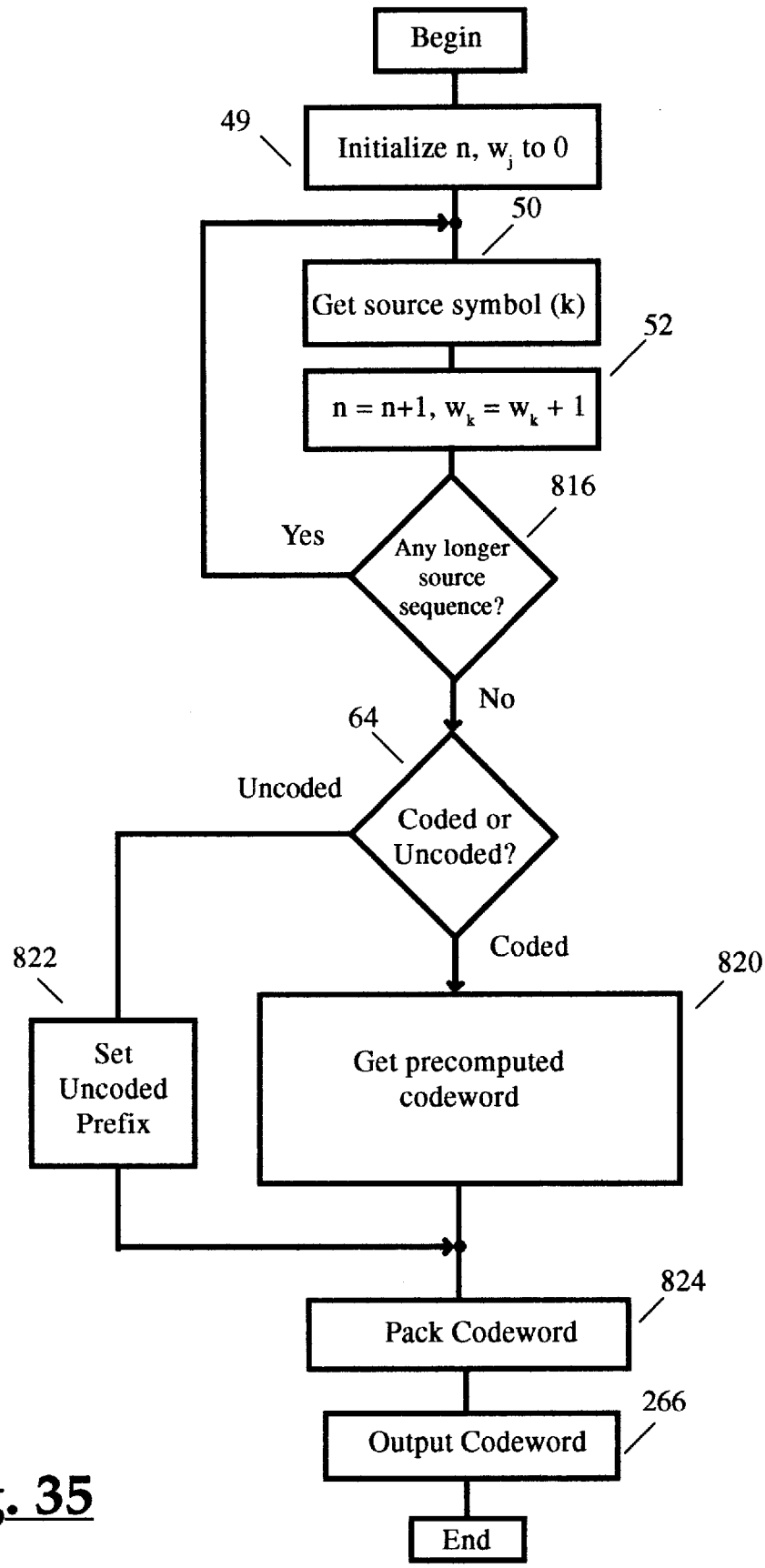
FIG. 35 shows a block diagram of a general variable to block source coding method involving precomputed codewords.

FIG. 35 represents a block diagram of a further embodiment of a coder in which an arbitrary group of variable length source symbol sequences are assigned fixed length codewords which represent the addresses of pointers to the same source symbol sequences precomputed and stored at the decoder. As long as a longer source symbol sequence has a codeword assigned to it, the coder continues to accept source symbols. When there is no longer source symbol sequence possible, the coder encodes the codeword represented by the longest source symbol sequence that has come in. In block 49 the run length and level weight counters are initialized to zero. In block 50 the next source symbol is accepted by the encoder. In block 52 the run length and appropriate level weight counters are incremented. In block 816 the question is asked if any longer source symbol sequence with the present sequence as a prefix is possible. If yes, another source symbol is accepted by the encoder. If no, the decision is made in block 64 whether or not the block is to be coded or uncoded. If uncoded, the uncoded prefix is set in block 822. If coded, the codeword is obtained in block 820. The codeword is packed in block 824 and output in block 266.

Figure 36:
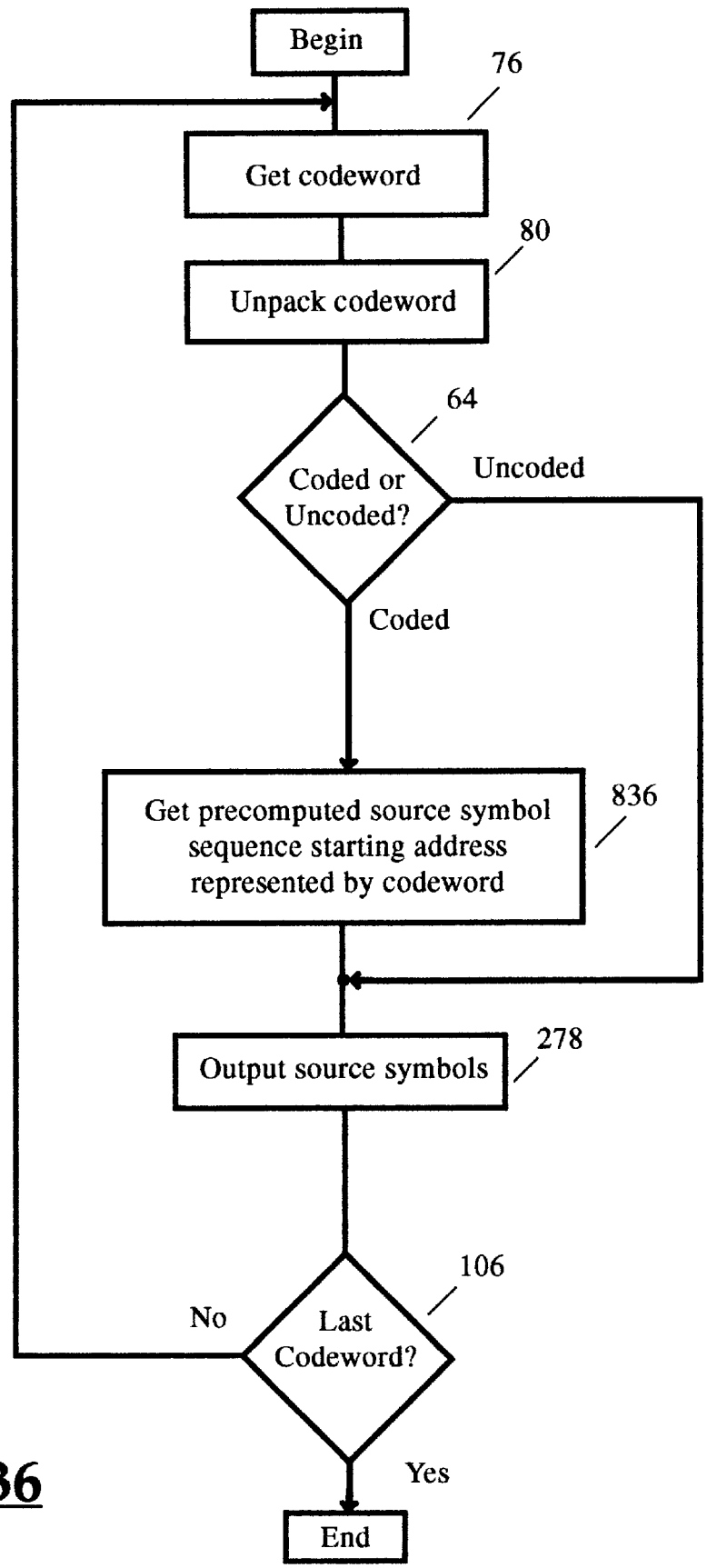
FIG. 36 shows a block diagram of a general variable to block decoding method involving precomputed source symbol sequences.

FIG. 36 represents a block diagram of the corresponding decoder. The codeword is accepted by the decoder in block 76 and is unpacked in block 80. It is determined whether the codeword represents coded or uncoded data in block 64. In block 836 the codeword, which represents a pointer to the precomputed and stored source symbol sequence, is used to get the source symbol sequence starting address. In block 278 the source symbols are output. In block 106 it is determined whether or not this represents the last codeword. If not, the process repeats itself.

Figure 37:
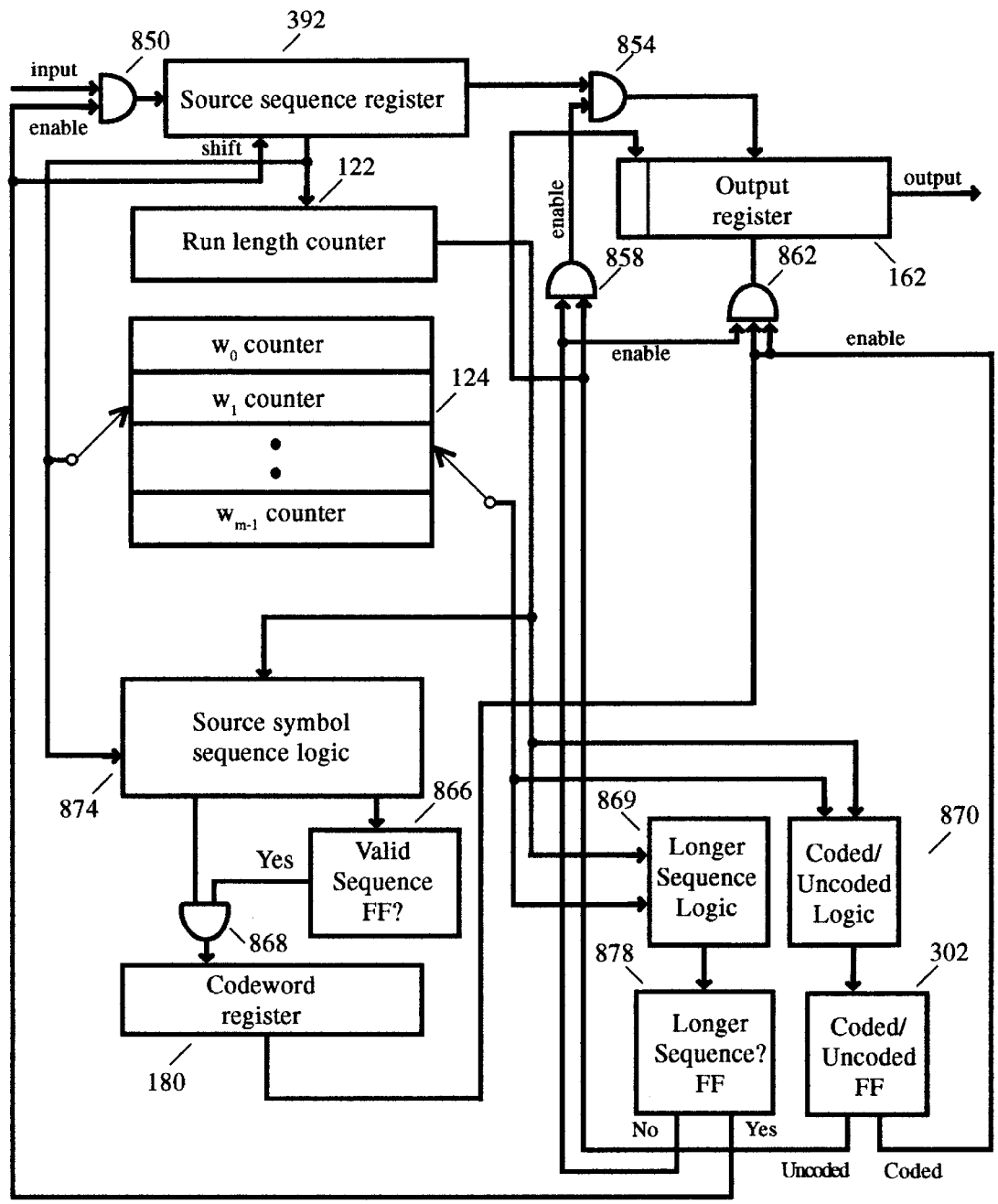
FIG. 37 shows a hardware diagram of a general variable to block source encoder involving precomputed codewords.

FIG. 37 represents a hardware diagram for this embodiment of the encoder. The source symbols enter a Source sequence register 392 via AND gate 850. A Run length counter 122 is incremented as each source symbol comes in. Weight level counters 124 are incremented corresponding to the weight of the incoming source symbol. Using the contents of Source sequence register 392 and Run length counter 122 as inputs, a Source symbol sequence logic circuit 874 outputs a codeword. Logic circuit 874 is determined by the principles explained in FIG. 34. A Valid sequence? flip-flop 866 determines if there is a valid codeword corresponding to the current source symbol sequence. If so, the codeword is placed in a Codeword register 180 via AND gate 868. If not, the contents of Codeword register 180 remain the same and contain the codeword for the last source symbol sequence for which there is a corresponding valid codeword.

Using the principles of FIG. 34, a Longer sequence logic circuit 869 determines the contents of a Longer sequence? flip-flop 878, and a Coded/Uncoded logic circuit 870 determines the contents of a Coded/Uncoded flip-flop 302. If there is no longer source symbol sequence possible and the output is to be uncoded, the contents of the Source sequence register 392 are transferred to an Output Register 162 via AND gate 854 enabled by AND gate 858. If there is no longer source symbol sequence possible and the run is to be coded, the contents of the Codeword register 180 are transferred to Output register 162 via AND gate 862.

Figure 38:
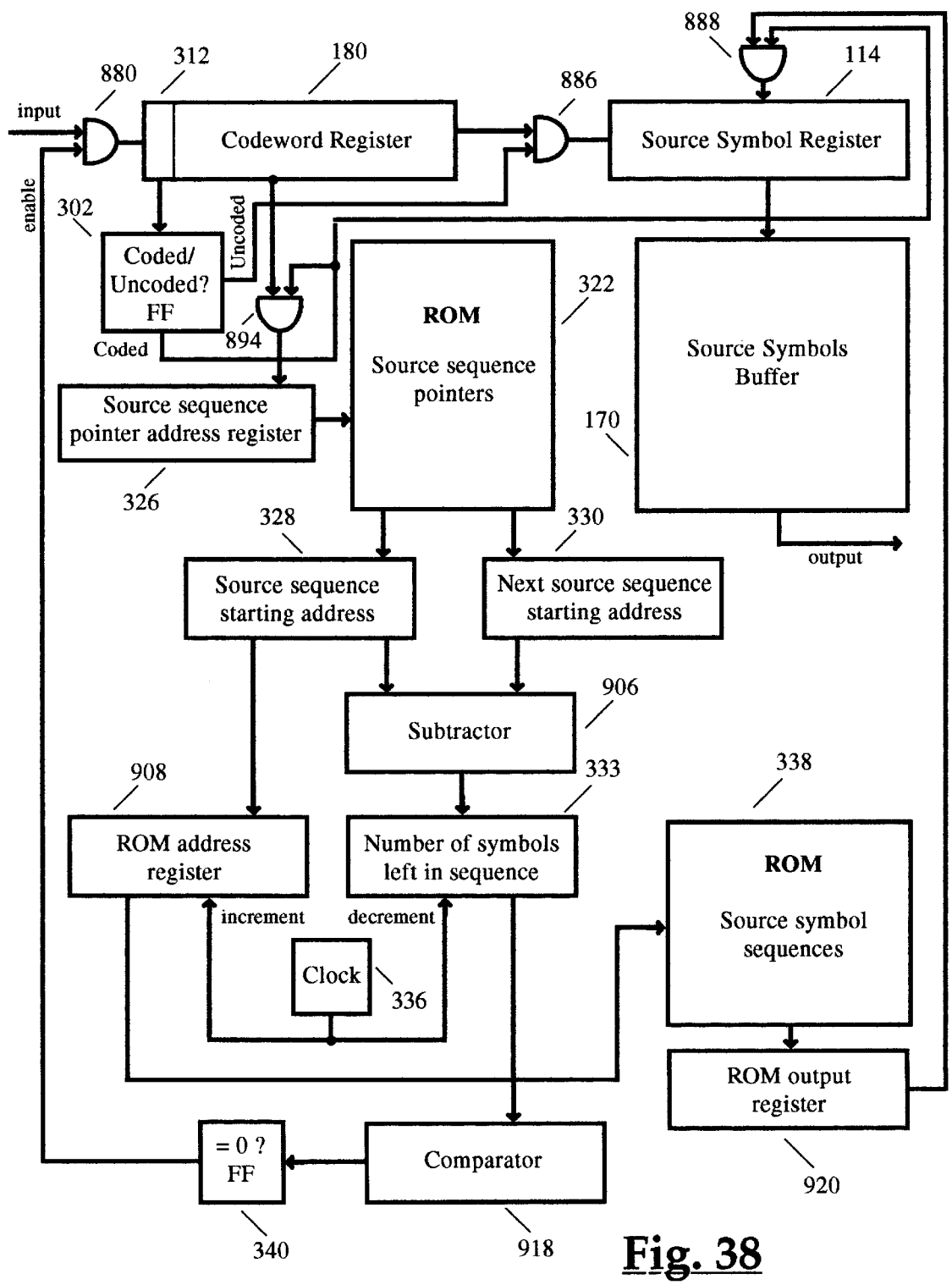
FIG. 38 shows a hardware diagram of a general variable to block source decoder involving precomputed source symbol sequences.

FIG. 38 represents a hardware diagram for this embodiment of the decoder. The codeword comes into a Codeword register 180 via AND gate 880. The first bit 312 of Codeword register 180 determines the contents of a Coded/uncoded flip-flop 302. The remaining contents of Codeword register 180 are transferred to a Source sequence pointer address register 326 via AND gate 894. Register 326 is used as an address register for a ROM 322 which contains source sequence pointers which are output to a Source sequence starting address register 328 and a Next source sequence starting address register 330. The contents of register 328 are subtracted from the contents of register 330 in a Subtractor 906 and the result is placed in a Number of symbols left in sequence counter 333. The source sequence starting address is placed in a ROM address register 908. A ROM 338 contains the source symbol sequences which are read into a ROM output register 920. A clock 336 increments ROM address register 908 and decrements Number of symbols left in sequence register 333. A Comparator 918 determines when there are no more symbols left in the source sequence and sets an "=0?" flip-flop 340 accordingly. Flip-flop 340 enables a new codeword input via AND gate 880. The contents of ROM Output register 920 are transferred to a Source symbol register 114 via AND gate 888 enabled by Coded/uncoded flip-flop 302 when it is in the Coded mode. When flip-flop 302 is in the Uncoded mode, it enables the transfer of the contents of Codeword register 180 to Source symbol register 114 via AND gate 886. The contents of Source symbol register 114 are transferred to a Source symbols buffer 170.

Appendix A to the present specification comprises a computer listing of a software-implemented embodiment of the invention. The program consists of four main functions: GenerateData generates randomly the multilevel data for any value of m and stores it packed in an array. Compress performs the actual compression. Decompress performs the actual decompression and Check performs a check to insure that the decompressed data is identical to the original data. In the program the word "elemental" has the identical meaning as the word "uncoded" as used herein. An elemental block is one in which the data are sent uncoded.

Figure 39:
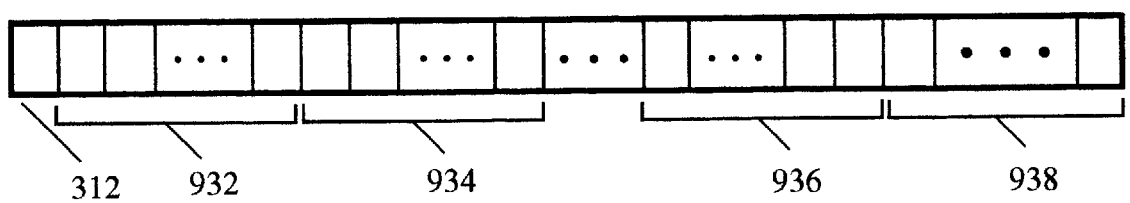
FIG. 39 shows a diagram of a codeword in which the starting point prefix consists of the level weights, $w_0$, $w_1, \ldots, w_{m-1}$.

The running sum is computed in the program. The prefix consists of a Coded/uncoded bit plus a listing of all the level weights, $w_j$, $0 \leq j \leq m-1$. Each level weight requires $\log_2 m$ bits. FIG. 39 shows how the codeword is configured. A Coded/uncoded prefix 312 is followed by m level weight prefixes expressed in binary form, $w_0$ 932, $w_1$ 934, . . . , $w_{m-1}$ 936. These are followed by a suffix 938. Once the level weight prefixes have been determined in binary form, they are all in turn encoded as a group using the Lawrence binary algorithm with the result that the prefix containing the level weights is reduced from the original size of $m \log_2 m$ bits.

If most of the weights are zero, the reduction is significant. Therefore, the prefix itself is coded and consists of a prefix which contains the number of zeros and the number of ones, a running sum suffix and a 1 bit prefix for Coded/uncoded run. Since the level weight prefix can itself consist of a variable number of blocks, this embodiment has a variable length output block. There is no confusion at the decoder however since the codeword is sent in the following order: Coded/uncoded bit followed by one or more prefix blocks followed by the running sum. The decoder first encounters the Coded/uncoded bit and makes the determination as to whether the codeword contains coded or uncoded symbols. If coded, it then decodes the prefix block(s). The prefix can also contain coded and/or uncoded blocks. The decoder keeps decoding prefix blocks until the two level weights have been accounted for. That's how the decoder knows that the next section contains the running sum.

If the incoming source symbol run consists of all one weight level, the suffix contains the run length instead of the running sum and the starting point prefix contains just the weight level. The program deals with the situation in which the symbols in the file run out before a coding run has been terminated by adding dummy symbols. Dummy symbols are also added in the case in which the output block contains uncoded symbols which have run out before the codeword has been filled up. Dummy symbols are also used to reach a starting point after the boundary has been hit although starting points are not in general the same as maximum entropy points.

This software embodiment is only one of many possible versions as those skilled in the art will understand.

CONCLUSION, RAMIFICATIONS, AND SCOPE

Thus the reader will see that the information compression and decompression technique described herein provides a method and apparatus that will compress and decompress general information sources either losslessly or lossily, without regard to the source statistics and in an asymptotically optimal fashion according to Shannon's noiseless coding theorem. It accords a maximum of flexibility with regard to a change in the number of levels among different sources and seamless transition between lossless and lossy modes. It allows for configurations which maximize compression as well as for those that minimize encoding and decoding time.

It should be understood that the embodiments of the present invention as disclosed herein are but exemplary embodiments and that variations in the embodiments may be realized which are the functional equivalents. The present invention may be implemented in software or in hardware. It may also be implemented in an application specific integrated circuit (ASIC) using well known very large scale integration techniques (VLSI).

The previous description of the embodiments is provided to enable any person skilled in the art to make or use the present invention. The various modifications to and variations of these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A method for encoding a variable-length, multilevel sequence of source symbols into a fixed-length codeword block comprising the steps of:
    a) making a random walk in Pascal's hypervolume, starting at the apex, every step of which is determined by the levels of the incoming source symbols, and
    b) computing a running sum in the process of said random walk, and
    c) constructing a boundary in said Pascal's hypervolume, and
    d) terminating said random walk at a point on said boundary, and
    e) encoding said running sum in a codeword, and
    f) encoding information in said codeword determining the point in said Pascal's hypervolume at which said random walk terminated whereby the source symbol sequence will be compressed by a compression ratio equal to the length of the source symbol sequence divided by the length of the codeword block when both are expressed in the same units.

2. The method of claim 1 further comprising the step of:
    a) terminating said random walk at the point at which said random walk hits said boundary whereby every boundary point is a potential termination point for the encoding process and starting point for the decoding process.

3. The method of claim 1 further comprising the steps of:
    a) terminating said random walk at one of a set of boundary points which set contains less than the full set of boundary points, and
    b) providing a means for stopping the encoding of source symbols after the boundary is hit, and
    c) providing a means for encoding dummy symbols after the source symbols have been stopped and until the random walk is terminated whereby the encoding process is made to terminate at one of a specified set of boundary points which is smaller than the complete set of boundary points so that a smaller set of possible starting points can be specified in the codeword resulting in a smaller codeword and, therefore, greater compression.

4. The method of claim 3 further comprising the steps of:
    a) terminating said random walk at a maximum entropy point, and
    b) providing a codeword prefix which specifies the particular one of the set of possible maximum entropy points on which the run has terminated whereby the set of starting points in the decoding process is minimized and compression is maximized.

5. The method of claim 1 further comprising the step of:
    a) precomputing and storing the running sums whereby the encoding process can be speeded up.

6. The method of claim 1 further comprising the step of:
    a) precomputing and storing the dummy sums whereby the encoding process can be further speeded up.

7. The method of claim 1 further comprising the step of:
    a) adding a precomputed lexicographical placement index to said running sum whereby the codeword may be used as the address of a pointer to a precomputed source symbol string stored in the decoding process.

8. The method of claim 1 in which some codewords are computed at the encoder and some codewords are precomputed and stored at the encoder whereby a tradeoff can be made between encoding speed and storage requirements.

9. The method of claim 1 in which a codeword prefix consists of a binary representation of all the level weights, $w_0, w_1, \ldots, w_{m-1}$, which are in turn encoded as a group using a binary version of the algorithm whereby the starting point of the decoding process can be specified by the level weights, the codeword becomes variable length, the codeword is shortened by encoding the level weight prefix and hence compression is increased.

10. The method of claim 1 further comprising:
    a) a preprocessing means that is a reversible transformation of the source data
whereby the compression achieved is lossless and enhanced, and the decoding process can reproduce the original source symbol sequence exactly.

11. The method of claim 1 further comprising
    a) a preprocessing means that is an irreversible transformation of the source data
whereby the compression achieved is lossy and enhanced, and the source data is degraded and cannot be reproduced exactly in the decoding process.

12. The method of claim 1 further comprising the step of:
    a) limiting the space of Pascal's hypervolume in which coding can occur comprising limitations on minimum and maximum values of run length, limitations on minimum and maximum values of level weights and limitations on ordering of level weights
whereby a simplification and a performance enhancement of the encoding process can occur.

13. The method of claim 1 further comprising the steps of:
    a) providing a one bit prefix which determines if the codeword represents coded or uncoded source symbols, and
    b) providing a means for transmitting uncoded source symbols
whereby codewords which represent an expansion, rather than a compression, of the source symbol sequence can be prevented.

14. The method of claim 1 further comprising the step of:
    a) providing a means for indicating that, for any particular codeword, the encoding process stopped before the boundary was reached, and
    b) providing a means for encoding dummy symbols until the boundary is reached
whereby the last symbols in a file may be encoded even if there are not enough of them to reach said boundary and sources with m levels can be encoded by an encoding process which is only capable of encoding sources of less than m levels.

15. A method for encoding a variable-length, multilevel sequence of source symbols into a fixed-length codeword block comprising the steps of:
    a) making a one-to-one correspondence between a set of variable-length, multilevel source symbol sequences and a set of fixed-length binary sequences, and
    b) using said fixed-length, binary sequences as the codewords for said variable-length, multilevel symbol sequences
whereby each source symbol sequence will be compressed by a compression ratio equal to the length of said source symbol sequence divided by the length of said codeword when both are expressed in the same units.

16. An encoder apparatus for encoding a variable-length multilevel sequence of source symbols into a fixed-length codeword block comprising:
    a) a means for making a random walk in Pascal's hypervolume, starting at the apex, every step of which is determined by the levels of the incoming source symbols, and
    b) a means for computing a running sum in the process of said random walk, and
    c) a means for constructing a boundary in said Pascal's hypervolume, and
    d) a means for terminating said random walk at said boundary, and
    e) a means for encoding said running sum in a codeword, and
    f) a means for encoding information in said codeword determining at which point in Pascal's hypervolume said random walk terminated
whereby the source symbol sequence will be compressed by a compression ratio equal to the length of the source symbol sequence divided by the length of the codeword block when both are expressed in the same units.

17. The apparatus of claim 16 further comprising:
    a) a means for terminating said random walk at the point at which said random walk hits said boundary
whereby every boundary point is a potential termination point for the encoder and starting point for the decoder.

18. The apparatus of claim 16 further comprising:
    a) a means for terminating said random walk at one of a set of boundary points which set contains less than the full set of boundary points, and
    b) a means for stopping the encoding of source symbols after said boundary is hit, and
    c) a means for encoding dummy symbols after the source symbols have been stopped and until said random walk is terminated
whereby the encoder terminates the encoding process at one of a specified set of boundary points which is smaller than the complete set of boundary points so that a smaller set of possible starting points can be specified in the codeword resulting in a smaller codeword and, therefore, greater compression.

19. The apparatus of claim 18 further comprising:
    a) a means for terminating said random walk at a maximum entropy point, and
    b) a means for providing a codeword prefix which specifies the particular one of the set of possible maximum entropy points on which the run has terminated
whereby the set of decoder starting points is minimized and compression is maximized.

20. The apparatus of claim 16 further comprising:
    a) a means for precomputing and storing the running sums
whereby the encoder can be speeded up.

21. The apparatus of claim 16 further comprising:
    a) a means for precomputing and storing the dummy sums
whereby the encoder can be further speeded up.

22. The apparatus of claim 16 further comprising:
    a) a means for adding a precomputed lexicographical placement index to said running sum
whereby the codeword may be used as the address of a pointer to the precomputed source symbol string stored at the decoder.

23. The apparatus of claim 16 in which some codewords are computed at the encoder and some codewords are precomputed and stored at the encoder whereby a tradeoff can be made between encoding speed and storage requirements.

24. The apparatus of claim 16 further comprising:
    a) a means for preprocessing that is a reversible transformation of the source data
whereby the compression achieved is lossless and enhanced, and the decoder can reproduce the original source symbol sequence exactly.

25. The apparatus of claim 16 further comprising:
   a) a means for preprocessing that is an irreversible transformation of the source data
whereby the compression achieved is lossy and enhanced, and the source data is degraded and cannot be reproduced exactly at the decoder.

26. The apparatus of claim 16 further comprising:
   a) a means for limiting the space of said Pascal's hypervolume in which coding can occur comprising limitations on minimum and maximum values of run length, limitations on minimum and maximum values of level weights and limitations on the ordering of level weights
whereby a simplification and a performance enhancement of the encoder may occur.

27. The apparatus of claim 16 further comprising:
   a) a means for providing a one bit prefix which determines if the codeword represents coded or uncoded source symbols, and
   b) a means for transmitting uncoded source symbols
whereby codewords which represent an expansion, rather than a compression, of the source symbol sequence can be prevented.

28. The apparatus of claim 16 further comprising:
   a) a means for indicating that, for any particular codeword, the encoding process stopped before the boundary was reached, and
   b) a means for encoding dummy symbols until the boundary is reached
whereby the last symbols in a file may be encoded even if there are not enough of them to reach said boundary and sources with m levels can be encoded by an encoding process which is only capable of encoding sources of less than m levels.

29. An encoder apparatus for encoding a variable-length, multilevel sequence of source symbols into a fixed-length codeword block comprising:
   a) a means for making a one-to-one correspondence between a set of variable-length, multilevel source symbol sequences and a set of fixed-length binary sequences, and
   b) a means for using said fixed-length, binary sequences as the codewords for said variable-length, multilevel symbol sequences
whereby each source symbol sequence will be compressed by a compression ratio equal to the length of said source symbol sequence divided by the length of said codeword when both are expressed in the same units.

30. A method for decoding a fixed-length codeword block into a variable-length, multilevel sequence of source symbols comprising the steps of:
   a) deriving information from the codeword that specifies the starting point of the decoding process in said Pascal's hypervolume, and
   b) making a random walk in Pascal's hypervolume, starting at said starting point, every step of which is determined by a running sum which is initially derived from the codeword, and
   c) decoding a multilevel symbol at every step, and
   d) terminating said random walk at the apex of said Pascal's hypervolume
whereby the original source symbol sequence is decoded in a lossless fashion.

31. The method of claim 30 further comprising the step of:
   a) discarding part of the sequence of decoded symbols called dummy symbols
whereby it is not necessary to use all possible boundary points as starting points which makes more compression possible.

32. The method of claim 30 further comprising the step of:
   a) precomputing the possible source symbol sequences and storing them for use by the decoding process
whereby the decoding process can be speeded up.

33. The method of claim 30 further comprising the step of:
   a) using the codeword or a part thereof as an address of a pointer to the source symbol sequence
whereby the decoding process can be speeded up.

34. The method of claim 30 further comprising the step of
   a) deriving a quantity from the codeword which represents the address of a lexicographical placement index, and
   b) adding the lexicographical placement index to another quantity which is also derived from the codeword to obtain the address of the pointer to the original source symbol sequence which has been stored for use by the decoding process
whereby increased compression can be obtained and the decoding process can be speeded up.

35. The method of claim 30 in which the source sequences corresponding to some codewords are computed in the decoding process and the source sequences corresponding to other codewords are precomputed and stored whereby a tradeoff can be made between decoding speed and storage requirements.

36. The method of claim 30 in which a codeword prefix, consisting of a binary representation of all the level weights, $w_0, w_1, \ldots, w_{m-1}$, which have been encoded as a group by a binary version of the algorithm, are in turn decoded using a binary version of the algorithm whereby the starting point of the decoding process is specified by the level weights and decoding proceeds from the specified starting point.

37. The method of claim 30 further comprising the step of:
   a) postprocessing that reverses a reversible transformation of the source data
whereby the compression achieved is lossless and enhanced, and the decoding process reproduces the original source symbol sequence exactly.

38. The method of claim 30 further comprising the step of:
   a) postprocessing that transforms an irreversible transformation of the source data
whereby the decoded source sequence is decoded lossily and is an approximation of the original source symbol sequence.

39. The method of claim 30 further comprising the steps of:
   a) detecting if the codeword represents coded or uncoded data, and
   b) providing a means of recovering uncoded data
whereby codewords which represent an expansion, rather than a compression, of the source symbol sequence can be prevented.

40. The method of claim 30 further comprising the steps of:
   a) detecting that a source symbol run has stopped in the encoding process before said boundary has been reached, and
   b) providing a means for decoding said source symbol runs that have stopped in the encoding process before the boundary has been reached
whereby the last symbols in a file may be decoded even if the decoding can not start on said boundary and a source with m levels can be decoded by a decoder with less than m levels.

41. A method for decoding a fixed-length codeword block into a variable-length, multilevel sequence of source symbols comprising the steps of:
   a) making a one-to-one correspondence between a set of fixed-length codewords or parts thereof and a set of variable-length, multilevel source symbol sequences, and
   b) using said codewords or parts thereof as pointers to said variable-length, multilevel symbol sequences whereby each source symbol sequence is compressed by a compression ratio equal to the length of said source symbol sequence divided by the length of said codeword when both are expressed in the same units.

42. A decoder apparatus for decoding a fixed-length codeword block into a variable-length, multilevel sequence of source symbols comprising:
   a) a means for deriving information from the codeword that specifies the starting point of the decoding process in Pascal's hypervolume, and
   b) a means for making a random walk in Pascal's hypervolume, starting at said starting point, every step of which is determined by a running sum which is initially derived from the codeword, and
   c) a means for decoding a multilevel symbol at every step, and
   d) a means for terminating said random walk at the apex of said Pascal's hypervolume whereby the original source symbol sequence is decoded in a lossless fashion.

43. The apparatus of claim 42 further comprising:
   a) a means for discarding part of the sequence of decoded symbols called dummy symbols whereby it is not necessary to use all possible boundary points as starting points which makes more compression possible.

44. The apparatus of claim 42 further comprising:
   a) a means for precomputing the possible source symbol sequences and storing them at the decoder whereby the decoder can be speeded up.

45. The apparatus of claim 42 further comprising:
   a) a means for using the codeword or parts thereof as the address of a pointer to the source symbol sequence whereby the decoder can be speeded up.

46. The apparatus of claim 42 further comprising:
   a) a means for deriving a quantity from the codeword which represents the address of a lexicographical placement index, and
   b) a means for adding the lexicographical placement index to another quantity which is also derived from the codeword to obtain the address of the pointer to the original source symbol sequence which has been stored at the decoder whereby increased compression can be obtained and the decoder can be speeded up.

47. The apparatus of claim 42 in which the source sequences corresponding to some codewords are computed at the decoder and the source sequences corresponding to other codewords are precomputed and stored whereby a tradeoff can be made between decoding speed and storage requirements.

48. The apparatus of claim 42 further comprising:
   a) a means for postprocessing that transforms a reversible transformation of the source data whereby the compression achieved is lossless and enhanced, and the decoder produces the original source symbol sequence exactly.

49. The apparatus of claim 42 further comprising:
   a) a means for postprocessing that transforms an irreversible transformation of the source data whereby the decoded source sequence is decoded lossily and is an approximation of the original source symbol sequence.

50. The apparatus of claim 42 further comprising:
   a) a means for detecting if the codeword represents coded or uncoded data, and
   b) a means of recovering uncoded data whereby codewords which represent an expansion, rather than a compression, of the source symbol sequence can be prevented.

51. The apparatus of claim 42 further comprising:
   a) a means for detecting that a source symbol run has stopped in the encoding process before said boundary has been reached, and
   b) a means for decoding said source symbol runs that have stopped in the encoding process before the boundary has been reached whereby the last symbols in a file may be decoded even if the decoding can not start on said boundary and a source with m levels can be decoded by a decoder which is only capable of decoding less than m levels.

52. An apparatus for decoding a fixed-length codeword block into a variable-length, multilevel sequence of source symbols comprising:
   a) a means for making a one-to-one correspondence between a set of fixed-length codewords or parts thereof and a set of variable-length, multilevel source symbol sequences, and
   b) a means for using said codewords or parts thereof as pointers to said variable-length, multilevel symbol sequences whereby each source symbol sequence is compressed by a compression ratio equal to the length of said source symbol sequence divided by the length of said codeword when both are expressed in the same units.

* * * * *